(12) United States Patent
Zajc

(10) Patent No.: US 8,829,949 B2
(45) Date of Patent: Sep. 9, 2014

(54) METHOD AND APPARATUS FOR DRIVING A VOLTAGE CONTROLLED POWER SWITCH DEVICE

(76) Inventor: Franc Zajc, Medvode (SI)

( * ) Notice: Subject to any disclaimer, the term of this patent is extended or adjusted under 35 U.S.C. 154(b) by 0 days.

(21) Appl. No.: 13/351,618

(22) Filed: Jan. 17, 2012

(65) Prior Publication Data

US 2013/0181748 A1  Jul. 18, 2013

(51) Int. Cl.
*H03K 3/00* (2006.01)

(52) U.S. Cl.
USPC ............................................. 327/109; 326/83

(58) Field of Classification Search
USPC ......... 327/108–112, 374–377, 170, 427, 434, 327/437; 326/82, 83, 22–24, 26, 31
See application file for complete search history.

(56) References Cited

U.S. PATENT DOCUMENTS

| | | | | |
|---|---|---|---|---|
| 5,140,201 | A * | 8/1992 | Uenishi | 327/108 |
| 8,421,505 | B2 * | 4/2013 | Nakanishi | 327/108 |
| 2006/0170043 | A1 | 8/2006 | Liu et al. | |
| 2007/0025123 | A1 | 2/2007 | Kim et al. | |
| 2007/0146020 | A1 * | 6/2007 | Williams | 327/110 |
| 2011/0025397 | A1 | 2/2011 | Wang et al. | |

FOREIGN PATENT DOCUMENTS

| | | |
|---|---|---|
| DE | 4110633 | 10/1991 |
| DE | 10351033 A1 | 6/2004 |
| DE | 10061563 B4 | 12/2005 |
| DE | 102009046255 A1 | 5/2010 |
| EP | 0760552 | 3/1997 |
| JP | 2008042633 A | 2/2008 |

OTHER PUBLICATIONS

Laszlo Balogh "Design and Application Guide for High Speed MOSFET Gate Driver Circuits" *Texas Instruments, Inc., SEM-1400, Unitrode Power Supply Design Seminar, Topic II*, pp. 1-37 (2001) http://focus.ti.com/lit/ml/slup169/slup169.pdf.
Yuhui Chen "Resonant Gate Drive Techniques for Power MOSFETs" *Virginia Polytechnic Institute and State University*, p. 32 (May 2000).
Jacob Mebus Meyer "Resonant MHz Gate Drive" *DTU Electrical Engineering: Department of Electrical Engineering*, p. 1 (Jul. 2008).
"FSFA2100—Fairchild Power Switch (FPS) for Half-Bridge PWM Converters" *Fairchild Semiconductor Corporation*, pp. 1-16 (Sep. 2008).
Grzesik et al. "1MHz Sinusoidal Gate Driver for Class DE Inverter Operating with Variable Load and Frequency" *IEEE 31st Annual Power Electronics Specialists Conference*, pp. 817-822 (2000).
Robert Callanan "Application of Silicon Carbide MOSFETs" *Power Electronics Europe*, 3: 39-40 (2011).
Yuhui Chen "Resonant Gate Drive Techniques for Power MOSFETs" *Virginia Polytechnic Institute and State University*, pp. 32, 68 and 71 (May 2000).

* cited by examiner

*Primary Examiner* — Lincoln Donovan
*Assistant Examiner* — Thomas Skibinski
(74) *Attorney, Agent, or Firm* — Occhiuti & Rohlicek LLP

(57) ABSTRACT

A driving circuit for at least one voltage controlled power switch device comprises a driver signal generating circuit and a trigger signal generating circuit adapted to generate trigger signals for said voltage controlled power switch device (PT). The trigger signal generating circuit includes a first driving transistor, and at least one energy buffer component coupled between the trigger signal generating circuit and the control electrode of said power switch device (PT).

20 Claims, 29 Drawing Sheets

METHOD AND APPARATUS FOR DRIVING A VOLTAGE CONTROLLED POWER SWITCH DEVICE

TECHNICAL BACKGROUND

The invention relates to a method and a circuit for driving at least one voltage controlled power switch device such as a power MOSFET, JFET or an insulated gate bipolar transistor (IGBT). Further, possible power switch devices are thyristors or power Darlington transistors. Power devices such as FET field effect transistors (FETs) or IGBTs are mainly used as switches to convert power from one form to another. Power switch devices can be used in motor controlled systems, uninterrupted power supplies, high-voltage DC transmission and in many other conversion applications.

Pulse width modulation (PWM) is a commonly used technique for controlling power applied to electrical devices by using electronic power switches. An average value of voltage and current fed to the load is controlled by turning the switch on and off at a fast pace. The longer the switch is on compared to the off-periods the higher is the power supplied to the respective load. The duty cycle of the PWM signal indicates a proportion of the on time to the regular interval or period. A low duty cycle corresponds to low power because the applied voltage is off for most of the time. The pulse width modulation switching frequency is faster than the frequency affecting the load, i.e. the device that uses the supplied power. The advantage of such a power supply is that by using pulse width modulation a power loss in the switching device is lower than using conventional power supplies. When a power switch is turned off there is practically no electrical current flowing and when the power switch is turned on there is almost no voltage drop across the power switch. Consequently, the power loss being the product of voltage and current is in both cases close to zero. The pulse width modulation PWM uses a rectangular pulse wave whose pulse width is modulated resulting in the variation of the average value of the waveform.

PDM (Pulse Density Modulation) and PWM (Pulse Width Modulation) are methods for modulating signals where PDM uses a variable carrier frequency and a fixed on-time signal duration and where PWM uses a fixed carrier frequency and a variable on-time signal duration. With a sufficiently high switching frequency and, when necessary, using additional passive electronic filters the pulse train can be smoothed and an average analogue waveform can be recovered. High frequency pulse width modulated power control systems can be realized with semi-conductor switches such as MOSFETS or insufated gate bipolar transistors IGBTs. Because of the availability of fast switching devices and high speed control integrated circuits switching power supplies have become popular. Pulse width modulated converters can employ square wave pulse width modulation to achieve a voltage regulation. The average output voltage is varying the duty cycle of the power switch.

In many converting electronic power switches are often connected as a half bridge. The converting electronic circuit allows a voltage conversion in both directions, i.e. DC voltage between different levels as well as a conversion between DC voltage and AC voltage.

Power switches connected as a half bridge circuit are switched on alternatively. The power loss P for a turned on power switch depends on its inner resistance R and the load current $I_{Load}$. Hence, the characteristics of power switches normally show a very low on resistance so that electrical losses are not high ($P=I_{Load}^2 \cdot R$). When the load current $I_{Load}$ switches from a first power switch to a second power switch an off-state of the first power switch is obligatory to prevent a cross conduction current between the power supply terminals over these power switches. Accordingly, the on switching of the second power switch can only be executed or performed after the first power switch of the half bridge connected power switches has been turned off completely. Accordingly, only one of the two power switches is switched on or turned on at any time to ensure that not both power switches are turned on at the same time. A cross conduction current $I_{cross}$ flowing over both power switches being turned on at the same time would cause a permanent damage to the power switches and a high electro-magnetic interference EMI. Therefore, in order to prevent any possibility that such a situation can occur turning-on of the second power switch must be performed with an additional minor delay, so-called dead time DT, after the first power switch has been turned off. The minimum value of the dead time DT is given by a worst case combination of the driver signal propagation delay and transition time as well as propagation delay and rise time of the power switches under all possible working conditions.

Increasing the dead time DT also increases the reliability of the circuit against cross conduction currents, however it diminishes a switching ratio especially for high switching frequencies and causes distortion especially for class D amplifiers. Furthermore, by increasing the dead time DT the conduction and switching losses are also increased since in the off time of a power switch the electrical current could flow via an integrated diode of the power switch. The integrated diode of the power switch has worse conducting and switching characteristics than the power switch which is switched on.

During a hard switch power losses reach their maximum value when a power switch takes over the current that had flown via a parasitic diode of the other power switch of the half bridge circuit. For the transient time duration a short cut current occurs. Switching time of a parasitic diode is typically in a range from 40 ns to 800 ns so that the switching losses can reach more than 10 mJ per switch. A conventional way of reducing such hard switch losses is mainly the reduction of the working pulse width modulation PWM frequency and reducing the effects of the parasitic diode. The reduction of a working PWM frequency can be useful only for application circuits having a sufficient inductance loads but for an application including also an LC filter the reduced working PWM frequency makes a much bigger LC filter necessary and the response time to power supply and load changes is increased significantly. An ideal hard switch with minimum power losses would theoretically be reached in a case where the dead time DT is zero as an electrical charge on the parasitic diode cannot appear.

A conventional circuit having two half bridge connected power switches PT1, PT2 is shown in FIG. 39. The conventional driving circuit does comprise half bridge connected power switches with a pre-set dead time DT wherein driving signals P and R are applied to the control electrodes of the power switches $PT_1$, $PT_2$ as shown in FIG. 39. The power switches PT1, PT2 of the circuit as shown in FIG. 39 are formed by driving power MOSFETs. By driving the power MOSFETs PT1, PT2 with appropriately delayed signals a simultaneous activation of the power MOSFETs PT1, PT2 is prevented so that no cross conduction $I_{cross}$ current can occur. The pre-set dead time DT has to take into account the worst case situation and the specific characteristics of the power MOSFETs PT1, PT2.

FIG. 40 shows the signal diagrams of the signals for the conventional driving circuit according to the state of the art as shown in FIG. 39. The conventional circuit comprises a logic circuit Log C comprising logical gates and a delay circuit. The logic circuit Log C generates two signals B1, C1 in response to an applied signal A formed by a pulse width modulated PWM signal. As can be seen in FIG. 40 signal B1 is delayed with respect to the other signal C1 generated by the logic circuit Log C. Signals B1, C1 are applied to two different driving circuits DR1, DR2 being connected to a DC/DC converter wherein the driving circuits DR1, DR2 output corresponding driving signals P, R for the two half bridge connected power switches PT1, PT2 as shown in FIG. 39. The power switches PT1, PT2 are formed by MOSFETs being connected to each other at an output terminal OUT to which also a load is connected. As can be seen in FIG. 40 there is a predetermined dead time DT between the time when the driving signal R reaches the threshold voltage of the second power switch PT2 and the time when the driving signal P reaches the threshold voltage of the first power switch PT1. The pre-set dead time DT is in a conventional circuit typically set to at least 100 nsec.

FIG. 41 shows an alternative implementation of a driving circuit according to the state of the art and FIG. 42 shows the corresponding signal diagrams. In the implementation of FIG. 41 no logic circuit having an integrated delay circuit is provided but the dead time DT is generated by means of additional circuitry including a capacitor $C_{bs}$ as shown in FIG. 41. The conventional driving circuits as shown for example in FIGS. 39, 40 do not allow short dead times DT and cannot switch fast enough especially for high working voltages. The switching voltages of the conventional driving circuits as shown in FIGS. 39, 40 are high and rise fast with rising working PWM frequencies. Consequently, the high switching losses of these conventional driving circuits reduce the efficiency of the whole device.

Generally when driving a power switch device PT such as a MOSFET the switching speed is limited by the fact that the driving current applied to the control electrode or gate of the power switch device is decreased when the voltage of the driving signal reaches the threshold voltage of the power switch device PT.

SUMMARY OF THE INVENTION

Accordingly, it is an object of the present invention to provide a method and a circuit for driving at least one voltage controlled power switch device with a low switching loss at a high switching frequency.

This object is achieved by a driving circuit for at least one voltage controlled power switch device comprising the features of claim 1.

Accordingly the invention provides a driving circuit for at least one voltage controlled power switch device comprising:
a driver signal generating circuit configured to receive a pulsed signal and to generate
 a first driver signal in response to a rising edge of the pulsed signal and
 a second driver signal in response to a falling edge of the pulsed signal;
a trigger signal generating circuit configured to generate trigger signals for said voltage controlled power switch device and comprising a first driving transistor configured to be switched on by the first driver signal such that an on-voltage trigger signal is supplied to a control electrode of said power switch device and
comprising a second driving transistor configured to be switched on by the second driver signal such that an off-voltage trigger signal is supplied to the control electrode of said power switch device and at least one energy buffer component coupled between the trigger signal generating circuit and the control electrode of said power switch device,
said energy buffer component being adapted to store signal energy of the on-voltage trigger signal until a threshold voltage of said power switch device is reached and adapted to release the stored signal energy to said control electrode of said power switch device when said threshold voltage of said power switch device has been reached, wherein the energy stored in said energy buffer component provides a voltage oversway which accelerates the switching of said power switch device (PT).

In a possible embodiment the applied pulsed signal is a pulse width modulated (PWM) signal.

In the driving circuit according to the present invention an energy buffer component is coupled between the trigger signal generating circuit and the control electrode of said power switch device and supplies a maximum current during the voltage oversway at the time when the applied voltage reaches the threshold voltage of the power switch device thus accelerating the switching transition of the power switch device.

In a possible embodiment of the driving circuit according to the present invention the energy buffer component comprises an inductivity which is adapted to supply a maximum current at the time when the threshold voltage of the power switch device is reached.

In a possible embodiment of the driving circuit according to the present invention the inductivity comprises a signal line inductivity of a signal line connecting the trigger signal generating circuit with the control electrode of said power switch device,
an internal connection inductivity of the power switch device,
an inductivity of an external coil connected between the trigger signal generating circuit and the control electrode of the power switch device and
an internal connection inductivity of the driving transistors.

In a possible embodiment of the driving circuit according to the present invention a resistor is connected in parallel to the inductivity and is adapted to damp a signal sway of the trigger signal.

In a possible embodiment of the driving circuit according to the present invention the trigger signal generating circuit is connected to a corresponding DC power supply circuit providing a stable on-voltage and a stable off-voltage supplied as the trigger signal via the energy buffer component to the control electrode of the power switch device in response to the driver signals generated by said driver signal generating circuit.

In a possible embodiment of the driving circuit according to the present invention the DC power supply circuit comprises two half wave rectifiers with smoothing capacitors connected to a secondary coil of a power supply transformer having a primary coil connected to a power supply switching circuit controlled by a temperature dependent driving signal being generated by a temperature control unit depending on a temperature of said power switch device.

In a possible embodiment of the driving circuit according to the present invention the trigger signal generating circuit is connected to a bistable circuit which is adapted to switch between stable voltages provided by a DC power supply circuit of the driver signal generating circuit to hold the amplitude of the trigger signal pulses.

In a possible embodiment of the driving circuit according to the present invention the trigger signal generating circuit comprises a shut down circuit.

In a possible embodiment of the driving circuit according to the present invention the driver signal generating circuit is connected to half bridge connected voltage controlled power switch devices each being triggered by a trigger signal generated by said trigger signal generating circuits.

In a possible embodiment of the driving circuit according to the present invention the driver signal generating circuit comprises a trigger transformer having at least one primary coil which receives a signal pulse at each signal edge of the applied pulsed signal and having secondary coils with contrary winding orientation connected to the trigger signal generating circuit to provide complementary rectangular trigger signals for the half bridge connected power switch devices.

In a possible embodiment of the driving circuit according to the present invention the complementary rectangular trigger signals provided by the trigger signal generating circuit are supplied via corresponding energy buffer components to the control electrodes of the half bridge connected power switch devices, wherein the rectangular trigger signals are shaped into two corresponding ramping drive signals applied to the control electrodes of the half bridge connected power switch devices which are switched consecutively when a threshold voltage of the respective power switch device is reached by the respective ramping drive signal.

In a possible embodiment of the driving circuit according to the present invention a dead time between switching a first power switch device and switching a second power switch device of the half bridge connected power switch devices in response to the ramping drive signals is less than 10 ns.

In a possible embodiment of the driving circuit according to the present invention a coupling transformer with a negative coupling ratio of one is provided, wherein a first winding of said coupling transformer is connected in parallel to a first energy buffer component being connected to the control electrode of a first power switch device of said half bridge connected power switch devices, wherein a second winding of said coupling transformer is connected in parallel to a second energy buffer component being connected to the control electrode of a second power switch device of said half bridge connected power switch devices.

In a possible embodiment of the driving circuit according to the present invention the power switch device is formed by a power MOSFET, a JFET or an IGBT or a power switch device having a dead time.

The invention further provides a signal amplifier for amplification of a pulsed signal comprising a driving circuit according to claim 1.

The invention further provides a method for driving at least one voltage controlled power switch device comprising the steps of:

generating a first driver signal in response to a rising edge of a pulsed signal and a second driver signal in response to a falling edge of the pulsed signal, generating trigger signals for a control electrode of said power switch device, wherein an on-voltage trigger signal is generated in response to an active first driver signal, wherein an off-voltage trigger signal is generated in response to an active second driver signal; and storing signal energy of said trigger signal until a threshold voltage of said power switch device is reached and releasing the stored signal energy to the control electrode of the power switch device after the threshold voltage of said power switch device has been reached, wherein the energy stored in said energy buffer component provides a voltage oversway which accelerates the switching of said power switch device (PT).

According to a further aspect of the present invention a driving circuit for at least one pair of half bridge connected power switches is provided comprising a trigger signal generating circuit configured to generate complementary rectangular trigger signals, wherein the signal shape of one of the generated trigger signals corresponds to the signal shape of a pulsed signal applied to an input of the driving circuit and a shaping circuit configured to shape the rectangular trigger signals applied to the control electrodes of the half bridge connected power switch devices such that the power switch devices are switched consecutively with a minimum dead time when a switching threshold voltage of the respective power switch device is reached by the shaped trigger signal forming the driving signal of the power switch device.

In a possible embodiment of the driving circuit according to the present invention the voltage controlled power switch devices are formed by power field effect transistors having a predetermined switching threshold voltage.

In a further possible embodiment of the driving circuit according to the present invention the power switch devices are formed by insulated gate bipolar transistors (IGBT).

In a possible implementation of the driving circuit according to the present invention the energy buffer component comprises an inductivity within a predetermined inductance range being adapted to supply a driving signal with a maximum current to the control electrode or gate of the power switch device exactly at the time when the voltage of the driving signal reaches the threshold voltage of the power switch device.

In a possible embodiment of the driving circuit according to the present invention the inductivity of the energy buffer component is within a range between 10 nH and 100 nH.

The power field effect transistors of the half bridge connected power switch devices can be formed in a possible implementation by two complementary power field effect transistors.

In an alternative implementation the power field effect transistors are formed by not complementary power field effect transistors.

BRIEF DESCRIPTION OF FIGURES

In the following possible embodiments of the method and circuit for driving at least one voltage controlled power switch device are described with reference to the enclosed figures.

DETAILED DESCRIPTION OF EMBODIMENTS

Figure 1A:
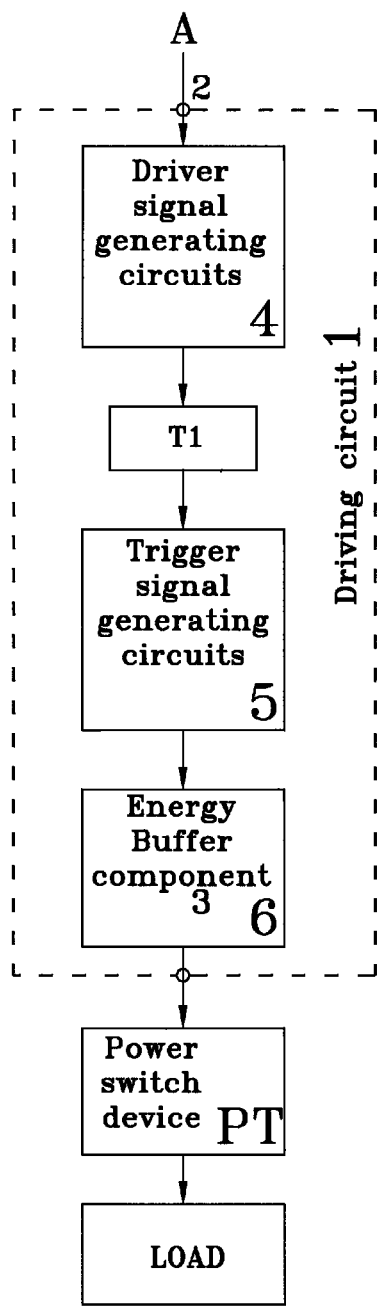
FIG. 1A shows a block diagram of a possible embodiment of a driving circuit for a voltage controlled power switch device according to the present invention.

As can be seen in FIG. 1A a driving circuit 1 according to the present invention is provided for driving at least one voltage controlled power switch device PT. A load can be connected to the output of the power switch device PT. The driving circuit 1 receives at its input 2 a pulsed signal A. The pulsed signal A can be a pulse width modulated signal (PWM). The driving circuit 1 applies a trigger signal at its output 3 to a control electrode or gate of the power switch device PT. The driving circuit 1 according to the present invention comprises in a possible implementation a driver signal generating circuit 4, a trigger signal generating circuit 5 and at least one energy buffer component 6. The driver signal generating circuit 4 is connected at its input side to the input 2 of the driving circuit 1 and receives the pulsed signal A as shown in FIG. 1A. The driver signal generating circuit 4 is configured to receive the pulsed signal A and to generate a first and second driver signal. In the shown embodiment the first driver signal is generated in response to a rising edge of the pulse width modulated PWM signal A and a second driver signal is generated in response to a falling edge of the applied pulsed signal A.

The trigger signal generating circuit 5 is configured to generate trigger signals for said voltage controlled power switch device PT. In a possible embodiment the trigger signal generating circuit 5 comprises a first driving transistor configured to be switched on by the first driver signal such that an on-voltage trigger signal is supplied to the control electrode of the power switch device PT. The trigger signal generating circuit 5 further comprises a second driving transistor configured to be switched on by the second driver signal generated by the driver signal generating circuit 4 such that an off-voltage trigger signal is applied to the control electrode of the power switch device PT. The driving circuit 1 according to the embodiment shown in FIG. 1A further comprises at least one energy buffer component 6 being coupled between the trigger signal generating circuit 5 and the control electrode of the power switch device PT. The energy buffer component 6 is adapted to store signal energy of the on-voltage trigger signal until a threshold voltage of the power switch device PT is reached and is further adapted to release the stored signal energy to the control electrode of the power switch device PT when the threshold voltage of the power switch device has been reached to accelerate the switching of the power switch device PT.

The power switch device PT connected to the output terminal 3 of the driving circuit 1 as shown in FIG. 1A can be any power switch device being voltage controlled and having a control electrode for receiving a trigger or switch control signal. In a possible embodiment the power switch device PT as shown in FIG. 1A is formed by a power MOSFET. In an alternative embodiment the power switch device PT can be formed by an insulated gate bipolar transistor IGBT. Further, the power switch device PT can be formed by a JFET.

In a possible embodiment of the driving circuit 1 according to the present invention the energy buffer component 6 comprises an inductivity L which is adapted to supply a maximum current at the time when the threshold voltage of the power switch device PT is reached. In the embodiments shown in FIGS. 2, 4 to 9, 13, 15, 24 to 26, 31, 32, 35, 36 the inductivity L is presented as inductivities $L_1$ and $L_2$. In a possible implementation of the inductivity L of the energy buffer component 6 can comprise a signal line inductivity a signal line connecting the trigger signal generating circuit 5 with the control electrode of the power switch device PT. The inductivity L can in a further possible embodiment comprise also an internal connection inductivity of the respective power switch device PT. In a possible embodiment of the driving circuit 1 according to the present invention the inductivity L of the energy buffer component 6 can comprise the inductivity of an external coil being connected between the trigger signal generating circuit 5 and the control electrode of the power switch device PT. In a further possible embodiment the inductivity L can also comprise an internal connection inductivity of the driving transistors provided within the trigger signal generating circuit 5.

Figure 2:
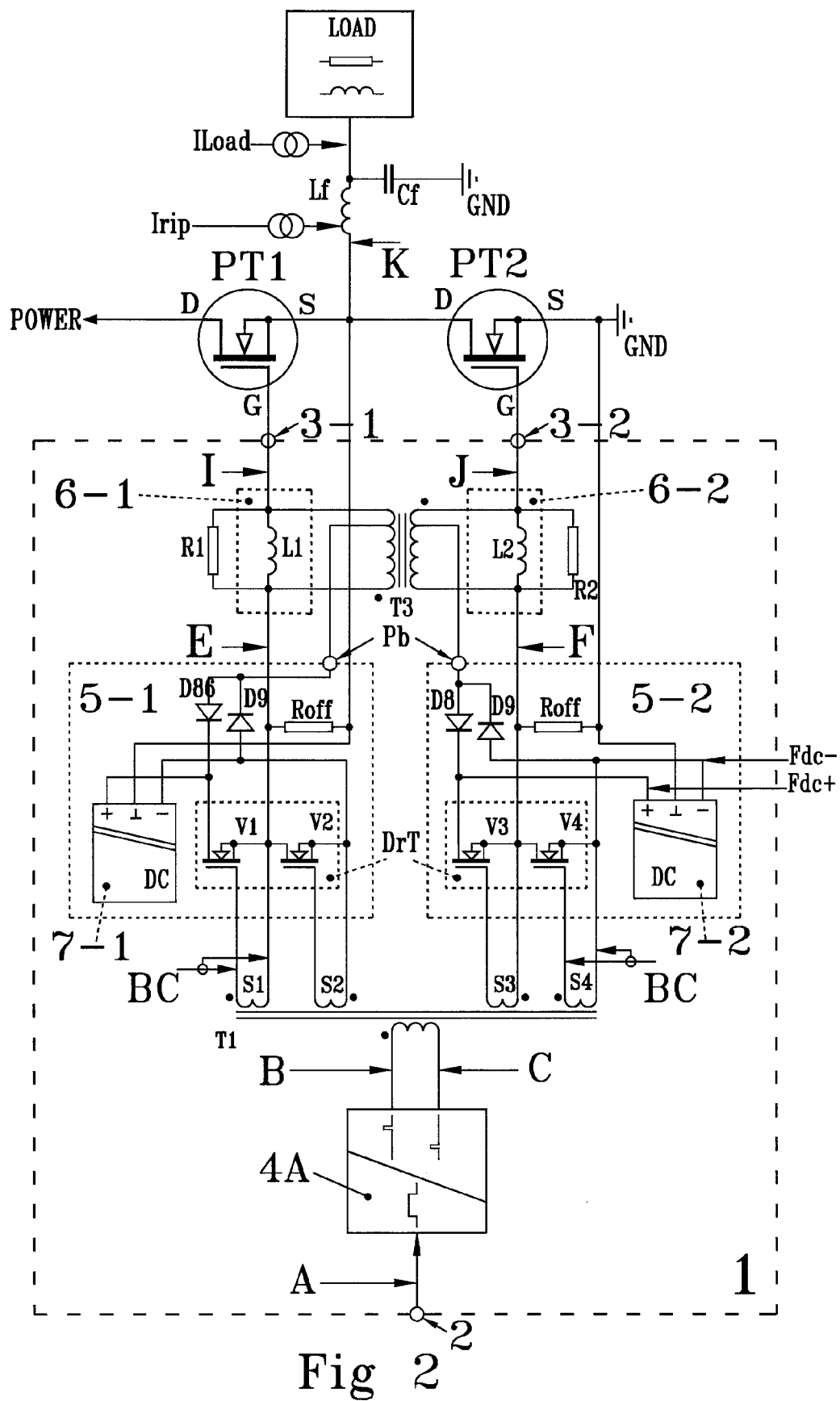
FIG. 2 shows a circuit diagram of a possible embodiment of a driving circuit according to the present invention.

In a possible embodiment of the driving circuit 1 according to the present invention as shown in FIG. 2 the energy buffer component 6 comprises an inductivity L to which a damping resistor R is connected in parallel. The damping resistor R is provided to damp a signal sway or oscillation of the trigger signal applied to the control electrode of the power switch device PT.

Figure 35:
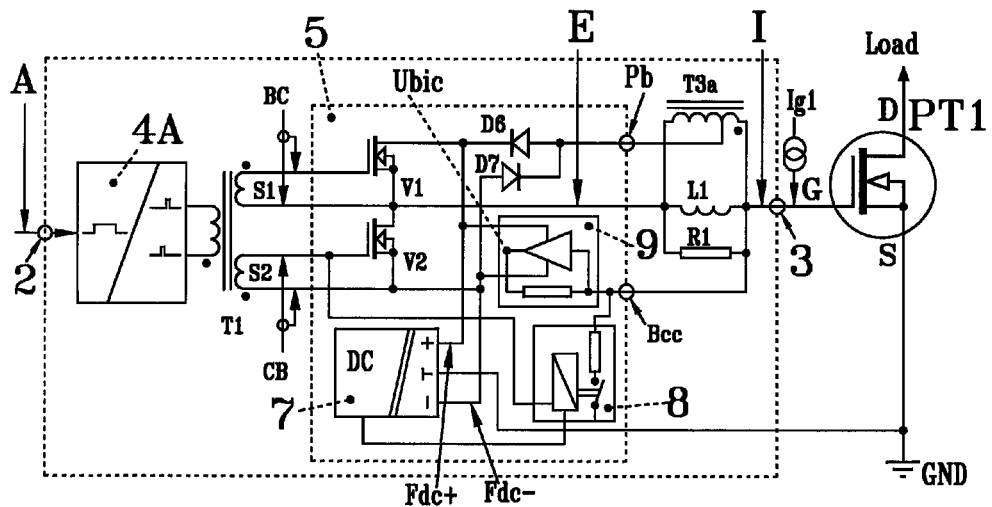
FIG. 35 shows a block diagram of a driving circuit for one power FET including a return of the excess energy.

Instead of damping by means of a damping resistor the signal sway of the trigger signal can be limited or capped by diodes D6, D7 connected to a coupling auto transformer T3*a* as shown in FIG. 35. The trigger signal generating circuit 5 can be connected to a corresponding DC power supply circuit 7 providing a stable on-voltage and a stable off-voltage supplied with the trigger signal via the energy buffer component 6 to the control electrode of the power switch device PT in response to the driver signals generated by the driver signal generating circuit 4. This DC power supply circuit 7 can comprise in a possible implementation two half wave rectifiers with smoothing capacitors connected to a secondary winding of a power supply transformer having a primary winding connected to a power supply switching circuit controlled by a temperature dependent driving signal being generated by a temperature control unit depending on a temperature T of the power switch device PT. The temperature T can be detected by a temperature sensor attached to the power switch device PT.

The driver signal generating circuit 4 can comprise in a possible embodiment a bistable circuit 9 which is adapted to switch between stable voltages provided by a DC power supply circuit of the driver signal generating circuit 4.

The bistable circuit 9 can be connected in two different embodiments before or behind the energy buffer component 6, e.g. to both sides of an inductivity L.

The trigger signal generating circuit 5 of the driving circuit 1 as shown in FIG. 1A can also comprise a shut down circuit.

In a possible embodiment of the driving circuit 1 according to the present invention the driving circuit 1 is connected to at least one pair of half bridge connected voltage controlled power switches PT1, PT2 each being triggered by a trigger signal generated by said trigger signal generating circuit 5 of the driving circuit 1.

The driver signal generating circuit 4 as shown in FIG. 1A can comprise in a possible embodiment a trigger transformer having at least one primary winding which receives a signal pulse at each signal edge of the applied pulse width modulated PWM signal A applied to the input terminal 2 of the driving circuit 1. The trigger transformer as shown e.g. in FIGS. 2, 3A-3C can have secondary windings S with contrary winding orientation connected to the following trigger signal generating circuit 5 to provide complementary rectangular trigger signals E, F for each pair of the half bridge connected power switch devices PT1, PT2 connected to the output of the driving circuit 1.

These complementary rectangular trigger signals E, F provided by said trigger signal generating circuit 5 can be supplied in a possible embodiment via corresponding energy buffer components 6-1, 6-2 to the control electrodes of the half bridge connected power switch devices PT1, PT2 as shown in FIG. 2. In a possible embodiment the rectangular trigger signals are shaped into two corresponding ramping drive signals I, J applied to the control electrodes of the half bridge connected power switch devices PT1, PT2. The half bridge connected power switch devices PT1, PT2 are switched consecutively when a threshold voltage of the respective power switch device PT is reached by the respective ramping drive signal I, J.

In a possible embodiment of the driving circuit 1 according to the present invention a dead time DT between switching a first power switch device PT1 and switching a second power switch device PT2 of the half bridge connected power switch devices connected to the output terminal 3 of the driving circuit 1 in response to the ramping drive signals I, J is less than 10 ns. In a possible specific implementation a dead time DT of even less than 5 ns can be reached.

In a possible embodiment of the driving circuit 1 according to the present invention a coupling transformer T3 with a negative coupling ratio of one is provided as shown e.g. in the embodiment of FIG. 2, A first winding of this coupling transformer T3 is connected in parallel to a first energy buffer component 6-1 being connected to the control electrode of a first power switch device PT1 of said pair of half bridge connected power switch devices.

A second winding of the coupling transformer T3 is connected in parallel to a second energy buffer component 6-2 being connected to the control electrode of a second power switch device PT2 of said pair of half bridge connected power switch devices.

In a possible embodiment the coupling transformer T3 has an additional winding tap with a winding ratio smaller than one.

In a possible embodiment the additional winding tap of the coupling transformer T3 is connected to a power supply circuit 7 through capping diodes D6 and D7 for energy recovery.

The power switch devices PT1, PT2 can be formed by (a) complementary or not complementary power MOSFETs.

The driving circuit 1 as shown in FIG. 1A can form part of a signal amplifier for amplification of a pulse width modulated PWM signal.

The invention further provides a method for driving at least one voltage controlled power switch device PT such as a power MOSFET, JFET or an IGBT.

Figure 1B:
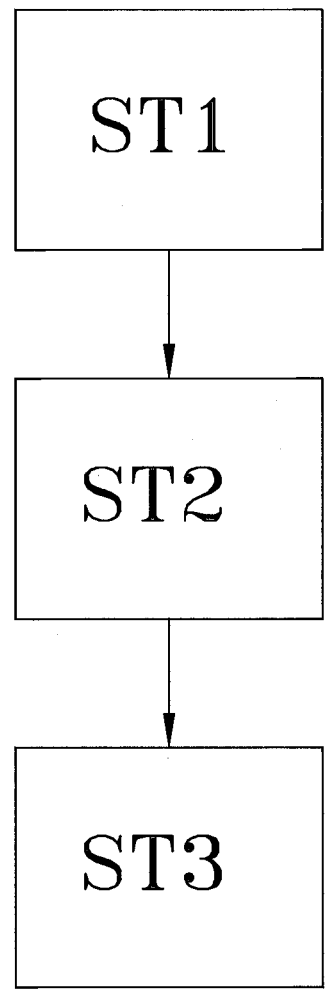
FIG. 1B shows a flow chart of a possible embodiment of a method for driving a voltage controlled power switch device according to the present invention.

FIG. 1B shows a flow chart of a possible embodiment of the method for driving at least one voltage controlled power switch device PT according to the present invention.

In a first step ST1 a first driver signal is generated in response to a rising edge of a pulse width modulated PWM signal A and a second driver signal is generated in response to a falling edge of the pulse width modulated PWM signal A.

In a second step ST2 trigger signals are generated for a control electrode of the power switch device PT, wherein an on-voltage trigger signal is generated in response to an active first driver signal and wherein an off-voltage trigger signal is generated in response to an active second driver signal.

In a further step ST3 of the method a signal energy of the trigger signal is stored until a threshold voltage of the power switch device PT is reached and the stored signal energy is released to the control electrode or gate of the power switch device PT after the threshold voltage of the power switch device PT has been reached.

According to the method of the present invention as shown in FIG. 1B a signal energy of a trigger signal is stored temporarily by an energy buffer component 6 such as a coil having an inductivity L in step ST3 wherein the energy buffer component is coupled between a trigger signal generating circuit 5 and a control electrode of the power switch device PT. This energy buffer component 6 can comprise an inductivity L which is adapted to supply a maximum current Imax at the time when the threshold voltage Utr of the power switch device PT is reached by the shaped trigger signal.

FIG. 2 shows a possible embodiment of the driving circuit 1 according to the present invention. In the embodiment as shown in FIG. 2 the driving circuit 1 is connected to a pair of half bridge connected voltage controlled power switch devices PT1, PT2 formed in the shown embodiment by power MOSFETs connected between a positive power supply voltage (power) and a negative power supply voltage (GND). Switching of these voltage controlled power switch devices PT1, PT2 is triggered by driving signals I, J output by the driving circuit 1 at output terminals 3-1, 3-2 as shown in FIG. 2. In the shown embodiment of FIG. 2 the driver signal generating circuit 1 comprises a differentiator circuit 4A connected to the input 2 of the driving circuit 1 and receiving a pulse width modulated PWM signal A from a signal source. The output of the differentiator 4A is connected to a trigger transformer T1 as shown in FIG. 2. The differentiator circuit 4A is a circuit for shaping driving signals to control the floating part of the driving circuit 1 before the trigger transformer T1.

Figure 3A:
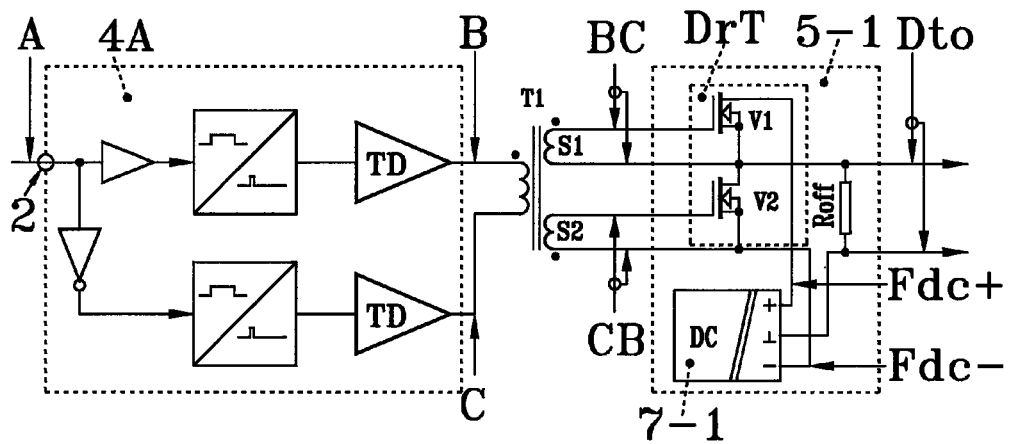
FIGS. 3A, 3B, 3C show further possible embodiments of a driving circuit according to the present invention.
Figure 3B:
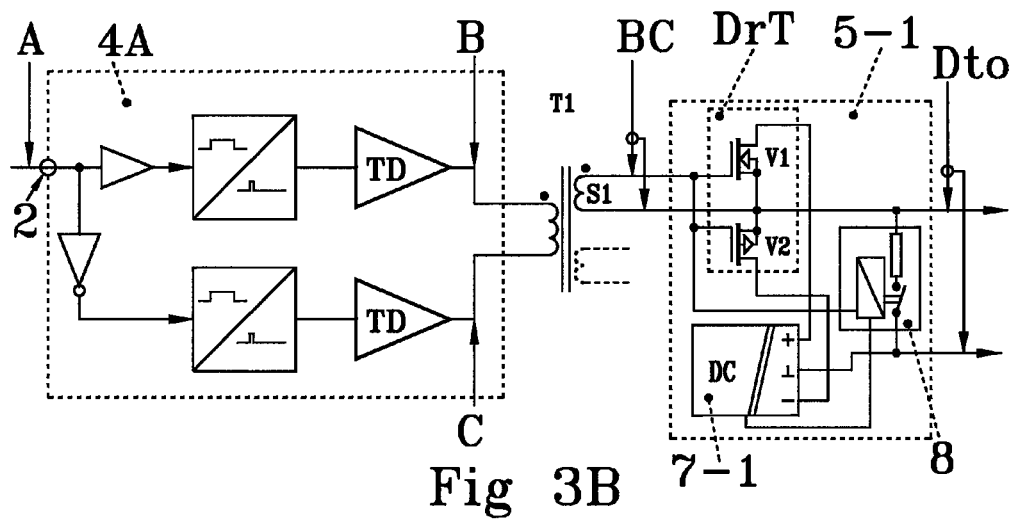
Figure 3C:
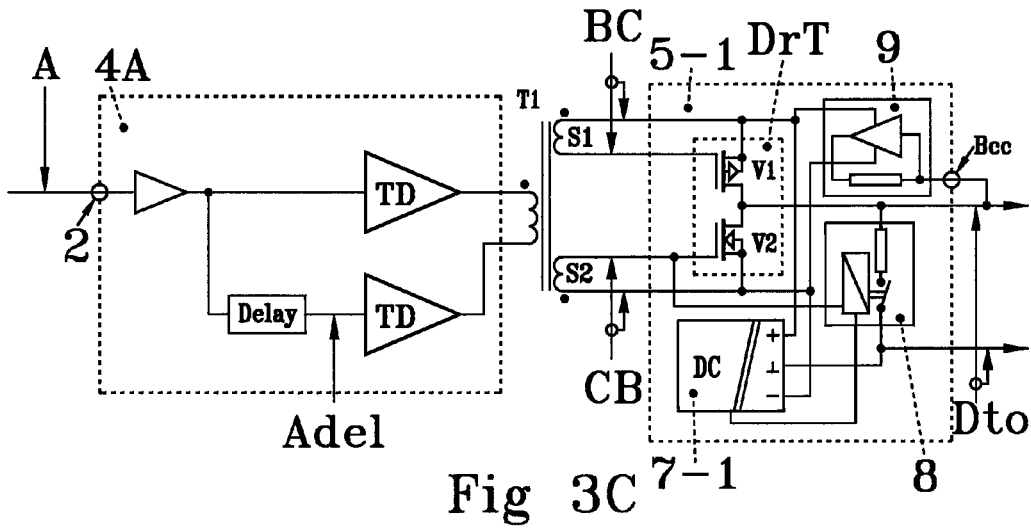

Different implementations of the differentiator circuit 4A are shown in the embodiments of FIGS. 3A, 3B, 3C. The differentiator circuit 4A can be based on an edge detector as shown in FIGS. 3A, 3B or can be formed in a simple implementation by a circuit as shown in FIG. 3C. The differentiator circuit 4A based on an edge detector as shown in FIGS. 3A, 3B converts the input pulse width modulated PWM signal A into separate driving signals B and C as shown for example in FIG. 2. The first driving signal B is generated as a logical pulse signal comprising logical pulses for the duration of a set-up time Tset at every rising edge of the input pulse width modufated PWM signal A applied to the input 2 of the driving circuit 1. The second driving signal C is generated as a logical pulse signal comprising logical pulses for a set-up time duration Tset at every falling edge of the input pulse width modulated PWM signal A applied to the input terminal 2 of the driving circuit 1 as also shown in the signal diagrams of FIG. 10. In case of a low input PWM signal frequency of the applied PWM signal A and in case that the input PWM signal A is stable before the output stability time Tsto expiration the edge detector of the differentiator circuit 4A generates logical pulses each having a set-up time duration Tset1 as maintenance pulses after each output stability time expiration. The two generated driving signals B and C output by the differentiator circuit 4A are not active at the same time.

Figure 10:
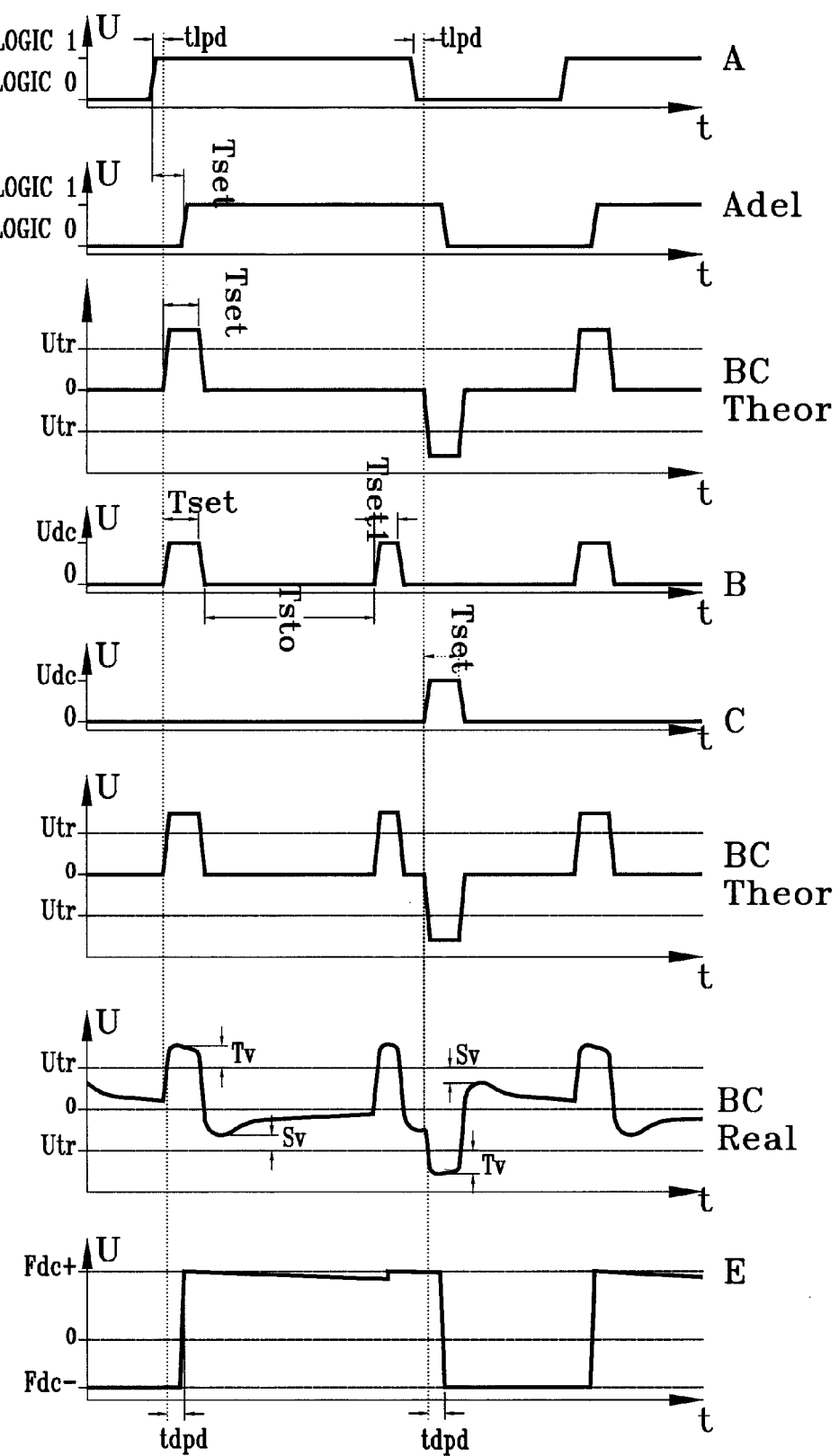
FIGS. 10-12 show signal diagrams for illustrating the operation of a driving circuit according to the present invention.

The generated driving signals B, C are output by the differentiator circuit 4A in response to the applied PWM input signal A as shown in FIG. 10. The output stability time Tset1 shown in FIG. 10 can be shorter than the set-up time Tset.

A simple implementation of the differentiator circuit 4A and the driver signal generating circuit 4 of the driving circuit 1 according to the present invention is shown in FIG. 3C. In this implementation the differentiator circuit 4A comprises a delay circuit for delaying the applied input PWM signal A as shown in FIG. 3C. The delayed input signal Adel generated in response to the applied input signal A is shown in the second signal diagram of FIG. 10. It can be seen in FIG. 10 that the differentiator circuit 4A of the driver signal generating circuit 4 provides on the secondary winding of the trigger transformer T1 a signal BC having equal bipolar driving pulses provided by a driver signal generating circuit 4 according to the implementations as shown in FIGS. 3A, 3B, whereas the driver signal generating circuit 4 according to the embodiment shown in FIG. 3C does not comprise maintenance pulses such as the maintenance pulses provided by the driver signal generating circuit 4 shown in the implementations of FIGS. 3A, 3B.

With respect to FIG. 10 the first signal diagram shows the input PWM signal A applied to the input terminal 2 of the driving circuit 1. This signal diagram shows also a logic circuit response time tlpd (logic propagation delay) of the differentiator circuit 4A within the driver signal generating circuit 4.

The second signal diagram of FIG. 10 shows the delayed input PWM signal Adel and a marked set-up time Tset of a differentiator circuit 4A according to the implementation as shown in FIG. 3C.

The third signal diagram of FIG. 10 shows a theoretical triggering transformer voltage (BCTheor) applied to the triggering transformer T1 by the differentiator circuit 4A according to the implementation as shown in FIG. 3C wherein no maintenance pulses are generated.

The forth signal diagram of FIG. 10 shows the driving signal B generated by a differentiator circuit 4A according to the implementation as shown in FIGS. 3A and 3B in case of a stable input signal A before a stable output time (Tsto) expiration with the presence of maintenance pulses.

The fifth signal diagram of FIG. 10 shows a driving signal C generated by a differentiator circuit 4A according to the implementation of FIGS. 3A and 3B wherein the input signal A does change its value before the stable output time Tsto expiration without the presence of maintenance pulses.

The sixth signal diagram of FIG. 10 shows a theoretical trigger transformer driving voltage BCTheor of the triggering transformer T1 using the differentiator circuit 4A in the implementation of FIG. 3A wherein only positive maintenance pulses are generated.

The seventh signal diagram of FIG. 10 shows a driving voltage BCreal of the triggering transformer T1 taking into account a logical amplifier output resistance, the magnetisation current of the triggering transformer T1, connection inductivities and the dissipated inductivity of the trigger trans-former T1.

The eighth signal diagram of FIG. 10 shows a trigger signal E output by a trigger signal generating circuit 5 with generated positive maintenance pulses and not generated negative maintenance pulses.

The driver signal generating circuit 4 of the driving circuit 1 comprises a differentiator circuit 4A as shown in the implementations of FIGS. 3A, 3B, 3C, wherein a trigger transformer T1 provides a galvanic separation from the following trigger signal generating circuit 5. As can be seen in the embodiments of FIGS. 3A, 3B, 3C the trigger transformer T1 comprises a primary winding connected to the differentiator circuit 4A of the driver signal generating circuit 4. Furthermore, the trigger transformer T1 comprises secondary windings S connected to components of the trigger signal generating circuit 5. It can be seen for example from the signal diagrams of FIG. 10 that the driver signal generating circuit 4 supplies driving signals B, C to the input side of the trigger transformer T1. The driving signals B, C output by the differentiator circuit 4A create an alternating magnetic field that causes a bipolarity of the driving signals BC and CB output by the trigger transformer T1. In the signal diagrams of FIG. 10 a real driving signal BC is shown for example in the seventh signal diagram of FIG. 10. In the embodiments as shown in FIGS. 3A, 3B, 3C the trigger transformer T1 comprises two secondary windings S with a contrary winding orientation so that the two output driving signals BC, CB on the secondary side of the trigger transformer T1 comprise a mirror symmetrical signal form.

In a possible embodiment as shown in FIG. 3C the trigger signal generating circuit 5 comprises a shutdown circuit 8 which has a switched low impedance resistor $R_{SD}$ connecting the output of the trigger signal generating circuit 5 with a reference potential (GND) to shut down the driving circuit 1.

The driver signal generating circuit 4 provided within the driving circuit 1 according to the present invention comprises the trigger transformer T1 having at least one primary winding to receive a signal pulse at each signal edge of the applied pulse width modulated PWM signal A and having secondary windings with contrary winding orientation connected to the following trigger signal generating circuit 5. The trigger signal generating circuit 5 provides for example in the embodiment as shown in FIG. 2 complementary rectangular trigger signals E, F for each pair of half bridge connected power switches PT1, PT2. The coupling factor of the trigger transformer T1 for the galvanic isolation has to ensure a magnetic coupling which is strong enough to transfer the driving signals B and C without reverse polarity overshooting (Sv) on its secondary side—the signal BC, caused by the transformer T1 demagnetization. The overshooting (Sv) could affect a driver transistor stage DrT of the trigger signal generating circuit 5 at each demagnetization of the driving pulse or after the maintenance pulse has been applied.

Figure 24:
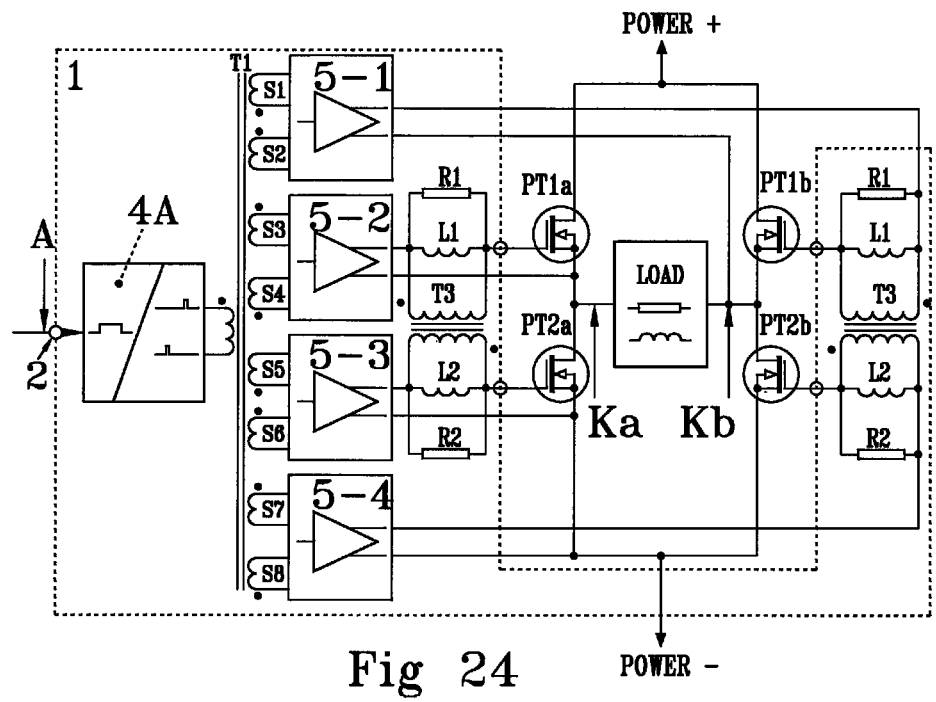
FIGS. 24, 25, 26 show further possible embodiments of a driving circuit according to the present invention.
Figure 25:
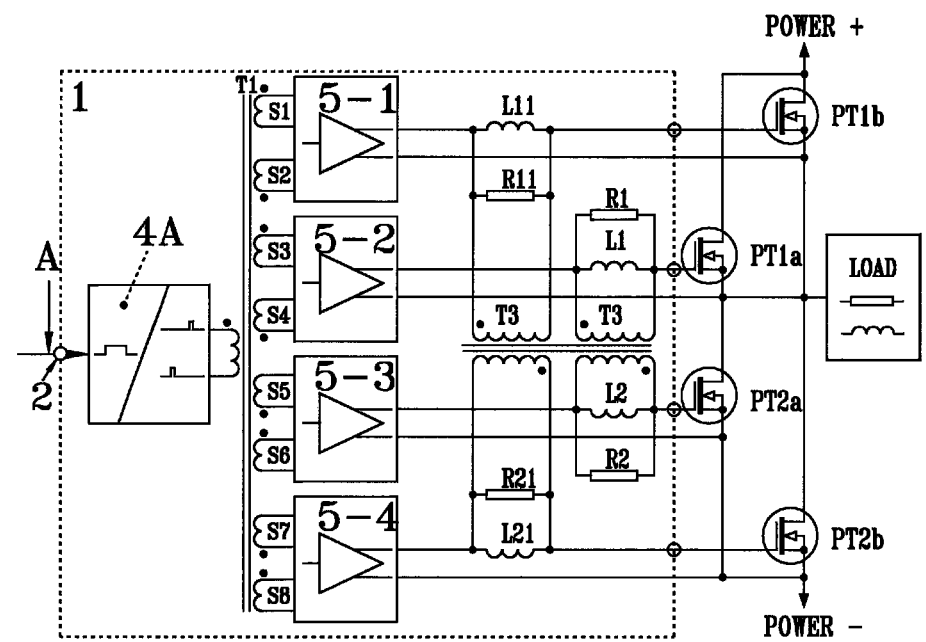
Figure 26:
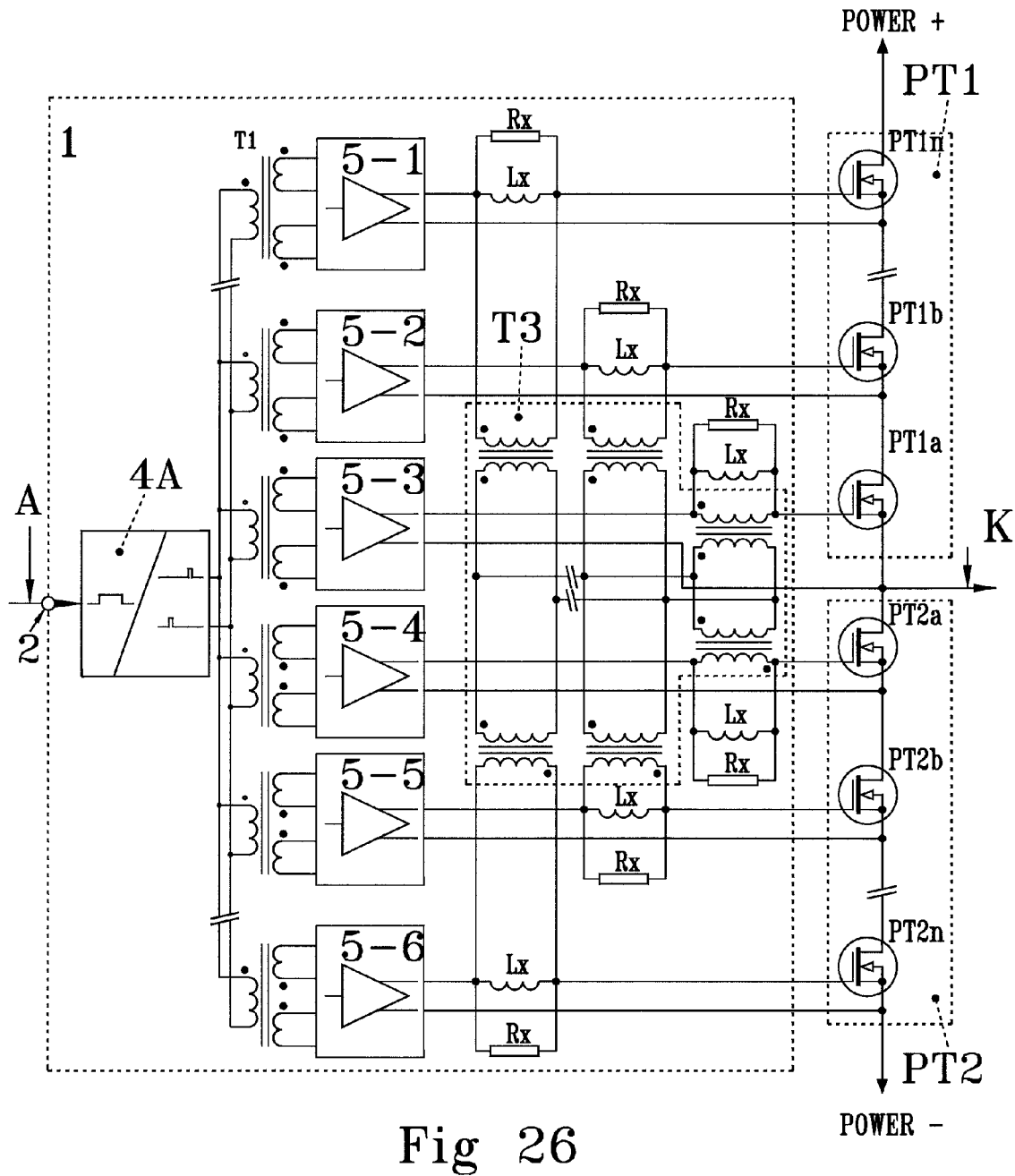

In the embodiments as shown in FIGS. 3A, 3B, 3C the trigger transformer T1 comprises two secondary windings S1, S2 with opposing winding orientations. In other embodiments or implementations the trigger transformer T1 can comprise more than two secondary windings. In the embodiment shown in FIG. 2 the trigger transformer T1 comprises four secondary windings S1, S2, S3, S4. In the embodiment as shown in FIG. 24, 25, 26 the trigger transformer T1 comprises an even higher number of secondary windings. In the embodiments of FIGS. 24, 25 the trigger transformer T1 comprises eight secondary windings S1 to S8. In the embodiment of FIG. 26 there are several trigger transformers T1 each comprising one primary winding and two secondary windings. Accordingly, in the embodiment of FIG. 26 the trigger transformer T1 is formed by six transformer arrangements with a a total of twelve secondary windings S1 to S12.

In the embodiments as shown in FIG. 24 or 25 the driving circuit 1 is adapted to drive pairs of half bridge connected power switch devices PT1A, PT2A and PT1B, PT2B. In the embodiment of the driving circuit 1 as shown in FIG. 26 the driving circuit 1 is adapted to drive a predetermined number of serial connected power switch devices forming n-pairs of power switch devices PT1 to PTn. The serial connected power switch devices PT1A to PT1n and PT2A to PT2n are connected between a positive power supply (power+) and a negative power supply (power−).

In the embodiment as shown in FIG. 2 the trigger signal generating circuit 5 comprises two driving transistor stages 5-1, 5-2. Both driving transistor stages 5-1, 5-2 comprise two driving transistors V1, V2 and V3, V4, respectively. In the embodiment of FIG. 2 the driving transistors V1, V2, V3, V4 are formed by N-MOSFETs each having a gate G connected to a secondary winding S1, S2, S3, S4 of the trigger transformer T1. As can be seen in FIG. 2 the driver transistor V1 of the driver transistor stage 5-1 is controlled by a driving signal BC and the driver transistor V2 is controlled by a driving signal CB output by the secondary winding S2 of the trigger transformer T1. In the shown implementation a positive value of the driving signal BC output by the first secondary winding S1 of the trigger transformer T1 sets the driver transistor V1 of the first driver transistor stage 5-1 on. The driving transistor V1 is switched on and conducts for as long as the driving signal BC has a voltage which is greater than the value of the threshold voltage Utr of the driving transistor V1. For that time the negative driving signal CB output by the secondary winding S2 of the trigger transformer T1 assures that the other driving transistor V2 of the first driving stage 5-1 is switched off.

If the driving signal CB output by the secondary winding S2 becomes positive the second driving transistor V2 is switched on. The switched on driving transistor V2 conducts for as long as the voltage of the driving signal CB stays higher than the threshold voltage Utr of the driving transistor V2. For that time the negative first driving signal BC assures that the first driving transistor V1 is switched off. After the application of a finishing driving pulse or maintenance pulse and in case that the voltage of the driving signal is lower than the threshold voltage Utr the driving transistor V2 is switched off again.

In the embodiment shown in FIG. 2 the driving transistors V1, V2 in the first driving transistor stage 5-1 and the driving transistors V3, V4 in the second driving transistor stage 5-2 are not complementary MOSFETs and are formed in the shown implementation all by N-MOSFETs. Also in the implementation of FIG. 3A the driving transistor stage 5-1 of the trigger signal generating circuit 5 comprises two not complementary MOSFETs V1,V2.

In contrast, in the implementations of FIGS. 3B, 3C the shown transistor stage 5-1 comprise complementary MOSFETs V1, V2. A N-MOSFET V1 and a P-MOSFETE V2 is provided within the driver transistor stage 5-1 in the embodiment of FIG. 3B. In the implementation of FIG. 3C a first driver transistor V1 is formed by a P-MOSFET whereas the other driver transistor V2 is formed by an N-MOSFET. In the embodiment of FIG. 3B the driving signal BC output by the secondary winding S1 of the trigger transformer T1 controls both complementary transistors V1, V2 having a common gate G and source S.

A positive voltage of the driving signal BC turns on the first driving transistor V1 and turns off the complementary second driving transistor V2. The first driving transistor V1 is switched on for as long as the driving signal BC has a voltage which is higher than the threshold voltage Utr of the first driving transistor V1. After application of the finishing driving pulse or finishing maintenance pulse and when the voltage of the driving signal BC is lower than the threshold voltage Utr of the first driving transistor V1 the first driving transistor V1 is switched off again.

A negative voltage of the driving signal BC consequently turns on the complementary second driving transistor V2 and simultaneously keeps the driving transistor V1 being switched off. The second driving transistor V2 is switched on for as long as the voltage of the driving signal BC stays lower than its threshold voltage Utr. After application of the finishing driving pulse or finishing maintenance pulse and the driving signal value being higher than the threshold voltage Utr of the second driving transistor V2 the second driving transistor V2 is switched off again.

In the embodiment of FIG. 3C the shown driving transistor stage 5-1 comprises also two complementary MOSFET transistors V1, V2. In the shown implementation the two complementary MOSFETs have a common drain terminal D. In the implementation of FIG. 3C the first driving transistor V1 is formed by a Pchannel-MOSFET transistor and the second driving transistor V2 is formed by an N-channel-MOSFET transistor. A negative voltage of the driving signal BC accordingly switches on the first driving transistor V1 and the first driving transistor V1 is switched on for as long as the driving signal BC has a voltage which is lower than its threshold voltage Utr. As long as the first driving transistor V1 is switched on the complementary second driving transistor V2 stays switched off. After reception of the finishing driving pulse or finishing maintenance pulse and when the driving signal voltage BC is higher than the threshold voltage Utr of the first driver transistor V1 the first driving transistor V1 is switched off again.

In the implementation of FIG. 3C when the driving signal CB has a positive voltage the second driving transistor V2 is turned on. The switched on second driving transistor V2 is conducting for as long as the driving signal CB has a voltage which is higher than the threshold voltage Utr of the driving transistor. At the same time the driving signal BC stays positive and the first driving transistor V1 stays turned off. After reception of a finishing driving pulse or finishing maintenance pulse and when the driving signal CB has a voltage being lower than the threshold voltage Utr of the second driving transistor V2 the second driving transistor V2 is switched off again.

The driving signals BC and CB as shown in the embodiments of FIGS. 3A, 3B, 3C are adapted to a threshold voltage Utr such that the driving transistors threshold resistance is low to provide a voltage sway which is low enough so that a safe voltage SV is ensured to be high enough. The driving transistor stage 5-$i$ is prevented to set on the trigger transformer core demagnetization after reception of the finishing driving pulse or finishing maintenance pulse as illustrated in the seventh signal diagram of FIG. 10.

Independent from the type of the driver transistor stage circuit 5-$i$ used by the trigger signal generating circuit 5 and the way of its connection to the secondary windings of the trigger transformer T1 it is ensured that the driver transisfor V1 is the only one to turn on in case a driving pulse or maintenance pulse having one of the two possible polarities is received. The first driver transistor V1 and the second driver transistor V2 are never simultaneously switched on.

The driver transistors V1, V2 shown in the embodiments of FIGS. 3A, 3B, 3C as well as the driver transistors V3, V4 shown in the embodiment of FIG. 2 can be formed by any switching element or group of switching elements. In a possible embodiment the driving transistors V1, V2, V3, V4 are formed by complementary or not complementary MOSFETs as shown in the embodiments of FIG. 2, 3A, 3B, 3C.

Each driving transistor stage 5-1, 5-2 can comprise an integrated DC-power supply 7-1, 7-2 as shown in the embodiment of FIG. 2 as well as in the implementations of FIGS. 3A, 3B, 3C. The drive output voltage E switches between a positive value FDC+ and a negative voltage value FDC− in response to the switching of the driver transistors V1 and V2 of the driver transistor stage 5-$i$. For example in the implementation of FIG. 3A the first driver transistor V1 is switched on and connects the FDC+ voltage to the driver output. If the other driver transistor V2 is switched on it connects the FDC− voltage to the drive output. The capacities CGs of PT1 maintain the driver output voltage E at a certain level after the driver transistors V1 and V2 have been turned off as illustrated by the eighth curve in FIG. 10.

The driver transistor stage 5-1 comprises a resistor ROFF as illustrated in FIG. 3A. The resistance ROFF of the driver stage output ensures that the drive output voltage is zero in the beginning and after the operation when there are no more driving pulses and maintenance pulses received.

In a possible embodiment as shown in FIGS. 3B, 3C a stop detector 8 can be provided. The stop detector 8 is formed by logic circuit which detects as encoded information that the power supply is turned off or whether driving pulses and maintenance pulses are not more received. Further, as shown in the embodiment of FIG. 3C a bistable circuit 9 can be provided for a switching between the stable voltage states FDC+ and FDC−.

The driver transistor stages 5-$i$ having driver transistors V1, V2 and the power supply circuit 7-$i$ as well as the recharging resistance Roff that can be replaced by a stop detector 8 form components of the floating trigger signal generating circuit 5 connected to the secondary windings of the trigger transformer T1. The driver transistor stage 5 can drive any separate voltage controlled power switch device PT and any group of parallel connected power switch devices PT or a N-MOSFET and a P-MOSFET with a common source S and a galvanic connection of the gates G.

The number of driving transistor stages 5-$i$ within the trigger signal generating circuit 5 can vary. In the embodiment of FIG. 2 the trigger signal generating circuit 5 comprises two driving transistor stages 5-1, 5-2. In the embodiments of FIGS. 24, 25 the trigger signal generating circuit 5 comprises four driving transistor stages 5-1, 5-2, 5-3, 5-4. In the embodiment of FIG. 26 the trigger signal generating circuit 5 comprises six or more driver transistor stages 5-1, 5-2, 5-3, 5-4, 5-5, 5-6.

The same drive response times tdpd are necessary for both driving transistor stages 5-1, 5-2 regardless of the switch polarity. Accordingly, as demonstrated in connection with the implementation shown in FIG. 3A the most suitable choice to meet this condition is the use of two equal N-type or two equal P-type driving transistors V1, V2.

Accordingly, the driving circuit 1 according to the present invention has a trigger signal generating circuit 5 comprising at least one driver transistor stage 5-$i$ each having not complementary or complementary driving transistors V1, V2 being formed in a possible embodiment by MOSFETs. The trigger signal generating circuit 5 is configured to generate trigger signals for the at least one voltage controlled power switch device PT. A first driving transistor V1 is configured to be switched on by the first driver signal generated by the driver signal generating circuit 4 such that an on-voltage trigger signal is supplied to a control electrode of the power switch device PT. Further, the second driving transistor V2 is configured to be switched on by the second driver signal generated by the driver signal generating circuit 4 such that an off-voltage trigger signal is supplied to the control electrode of the respective power switch device PT.

As can be seen in the embodiment of FIG. 2 each driver transistor stage 5-1, 5-2 of the trigger signal generating circuit 5 outputs a trigger signal E, F to a corresponding power switch device PT1, PT2. The trigger signal E flows through a coil L1 to the control electrode of the first power switch device PT1. In the embodiment shown in FIG. 2 the power switch device PT1 is formed by an N-MOSFET having a gate G as a control electrode. Also the second power switch PT2 is formed by an N-MOSFET having a G gate connected via a coil L2 to an output of the trigger signal generating circuit 5. In the embodiment shown in FIG. 2 the second trigger signal F generated by the second driver transistor stage 5-2 of the trigger signal generating circuit 5 flows through the coil L2 to the gate G of the second power switch device PT2.

The coils L1, L2 form energy buffer components 6-1, 6-2 which are coupled between the trigger signal generating circuit 5 and the control electrodes G of the power switch devices PT1, PT2. Each energy buffer component 6-1 or 6-2 is adapted to store signal energy of an on-voltage trigger signal received from a driver transistor stage 5-$i$ until a threshold voltage UTH of the respective power switch device PT1, PT2 is reached. Further, each energy buffer component 6-1, 6-2 is adapted to release the stored signal energy to the control electrode G of the respective power switch device PT1, PT2 when the threshold voltage UTH of the respective power switch device has been reached. In the shown embodiment of FIG. 2 each driver transistor stage 5-1, 5-2 has an output terminal which is connected via an inductivity L1, L2 to a gate electrode G of an N-MOSFET PT1, PT2 wherein the inductivity L1, L2 is configured or adapted as an energy buffer component 6-1, 6-2 having a specific predetermined inductivity to store signal energy of an on-voltage trigger signal E, F until the threshold voltage UTh of the respective power switch device PT1, PT2 is reached by the shaped trigger signal I, J and to release this stored signal energy to the control electrode G of the respective power switch device PT1, PT2 when the threshold voltage Uth of the power switch device PT1, PT2 has been reached by the shaped trigger signal I, J. The released energy stored in the energy buffer components formed in the shown implementation by inductivities L1, L2 provides an voltage oversway which accelerates the switching of the power switch devices PT1, PT2. Trigger signals E, F output by the driver transistor stages 5-1, 5-2 are synchronous to each other and comprise the same frequency. The complementary rectangular trigger signals E, F provided by the trigger signal generating circuit 5 are supplied via the corresponding energy buffer components 6-1, 6-2 formed by the inductivities L1, L2 to control or gate electrodes of the half bridge connected power switch devices PT1, PT2 formed e.g. by N-MOSFETs. The rectangular trigger signals E, F are shaped into two corresponding ramping drive signals I, J applied to the control electrodes of the half bridge connected power switch devices PT1, PT2 which are switched consecutively when a threshold voltage UTH1, UTH2 of the respective power switch device PT1, PT2 is reached by the respective ramping drive signals I, J.

Figure 11:
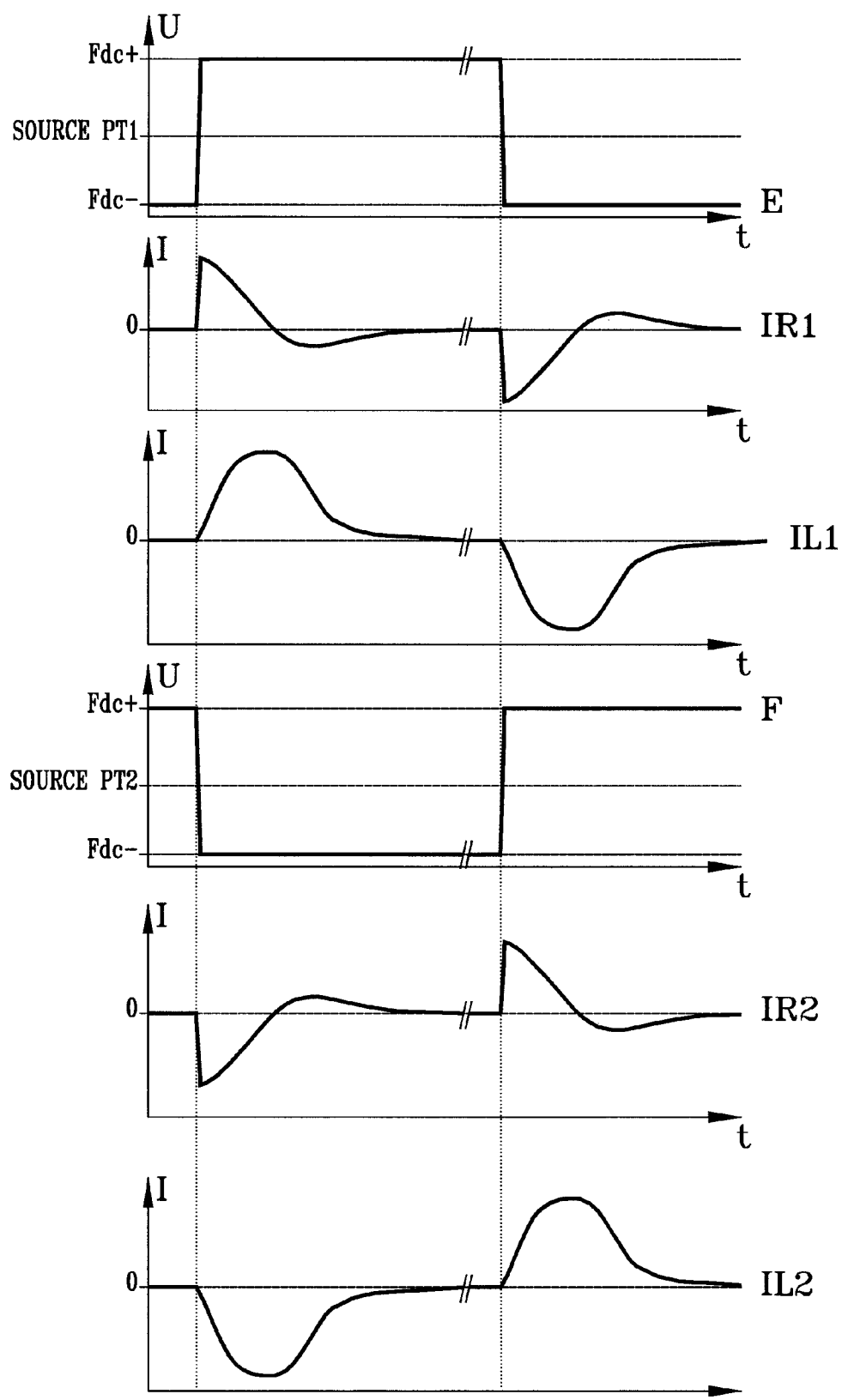

The complementary rectangular driving signals E, F provided by the driving transistor stages 5-1, 5-2 are shown for example in the first and fourth signal diagram of FIG. 11. The first signal diagram of FIG. 11 shows the trigger signal E having amplitude values corresponding to the positive drive voltage Fdc+ and to the negative drive voltage Fdc− with regard to the power FET source potential (source PT1).

The second signal diagram of FIG. 11 shows a current IR1 flowing over a damping resistor R1 being connected in parallel to the inductivity L1 forming the first energy buffer component 6-1. As can be seen in FIG. 2 to each inductivity L1, L2 a resistor R1, R2 is connected in parallel. Damping resistors R1, R2 are provided to damp oscillation after the signal sway of the respective trigger signal. The current IR1 flowing through the first damping resistor R1 is shown in the second signal diagram of FIG. 11.

The third signal diagram of FIG. 11 shows a current IL1 flowing through the first inductivity L1 forming the first energy buffer component 6-1. The amplitudes of the trigger signal F correspond to the positive drive voltage FDC+ and to the negative drive voltage FDC− with regard to the power FET source potential (source PT2).

The fifth signal diagram of FIG. 11 shows a current IR2 flowing through the second damping resistor R2 connected in parallel to the second inductivity L2 forming the second energy buffer component 6-2.

The sixth signal diagram of FIG. 11 shows a current IL2 flowing over the second inductivity L2 forming the second energy component 6-2.

The first trigger signal E whose signal diagram is shown in the first diagram of FIG. 11 is supplied to the power switch PT1 over the first inductivity L1.

Figure 4:
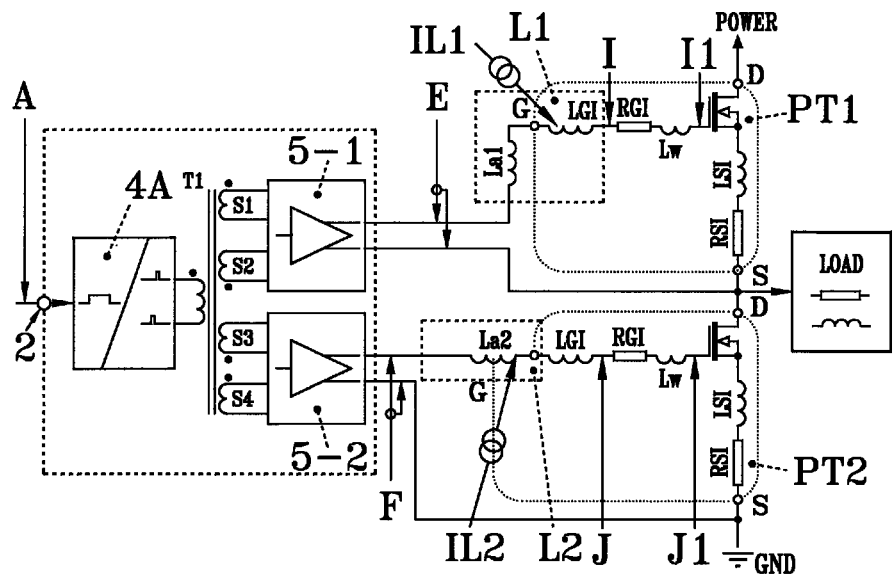
FIGS. 4-9 show further possible embodiments of a driving circuit according to the present invention.

As shown in FIG. 4 the inductivity L of the energy buffer component 6 can comprise different inductivity components. In a possible embodiment the inductivity L comprises a signal line inductivity Lal of a signal line connecting the trigger signal generating circuit 5 with the control electrode G of the power switch PT. This connection inductivity is shown as inductivity LA1, LA2 in FIG. 4. Further, the inductivity L forming the energy buffer component 6-i can comprise an internal connection inductivity of the driven power switch device PT. This internal connection inductivity is shown in FIG. 4 as drive electrode's parasitic inductivity LGI. Furthermore, the inductivity L can comprise an inductivity of an external coil such as the coils L1, L2 shown in the embodiment of FIG. 2. This external coil L1, L2 is connected between the trigger signal generating circuit 5 and the control electrode G of the power switch device PT. Further, the inductivity L can comprise an internal connection inductivity of the driving transistors V1, V2 of the respective driving transistor stage 5-1, 5-2.

In the implementation of FIG. 4 the inductivity L forming the energy buffer component 6 comprises a signal line inductivity LA1 and an internal connection inductivity LGI of the power switch device PT1 as an energy buffer component 6. In this implementation no external coil as a discrete component is provided.

Accordingly, the inductivity L of the energy buffer component 6 can consist of different portions wherein the total inductivity L is adapted to store sufficient signal energy of the on-voltage trigger signal until a threshold voltage Uth of the power switch device PT is reached and is adapted to release the stored signal energy to the control electrode G of the power switch device PT when and after the threshold voltage Uth of the power switch device PT has been reached. The energy buffer component 6-i comprises an composite inductivity L which is adapted to supply a maximum current I at the time when the threshold voltage UTH of the power switch device PT is reached by the respective shaped trigger or switch control signal I, J.

In the embodiment of FIG. 2 a first current IL1 flows via the first coil L1 and a second current IL2 flows through the second coil L2. The first current IL1 flowing through the first coil L1 is shown in the third signal diagram of FIG. 11 and the current IL2 flowing through the second coil L2 is shown in the sixth signal diagram of FIG. 11. The currents IR1, IR2 flowing through the corresponding damping resistors R1, R2 are shown in the second signal diagram and in the fifth signal diagram of FIG. 11.

The sufficiently low drive resistance of the drive transistor stages 5-i for example being in a range between 30 mΩ up to 100 mΩ cause a rapid increase of the currents IL1, IL2 resulting in low conducting losses and zero current switching.

Figure 8:
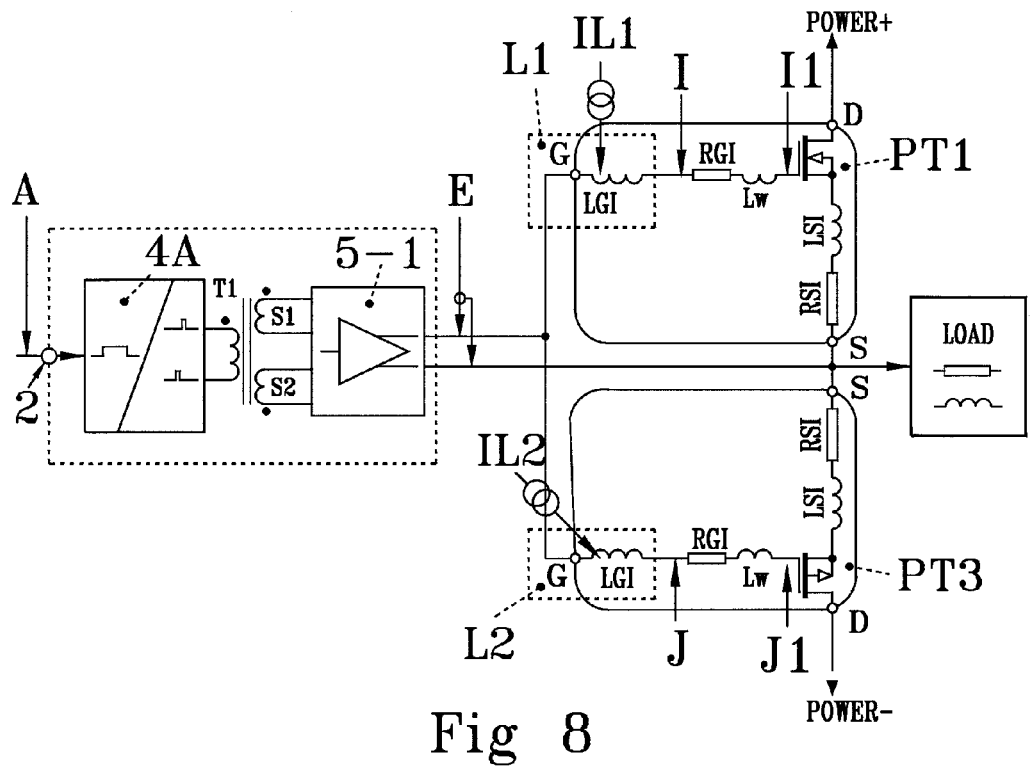
Figure 9:
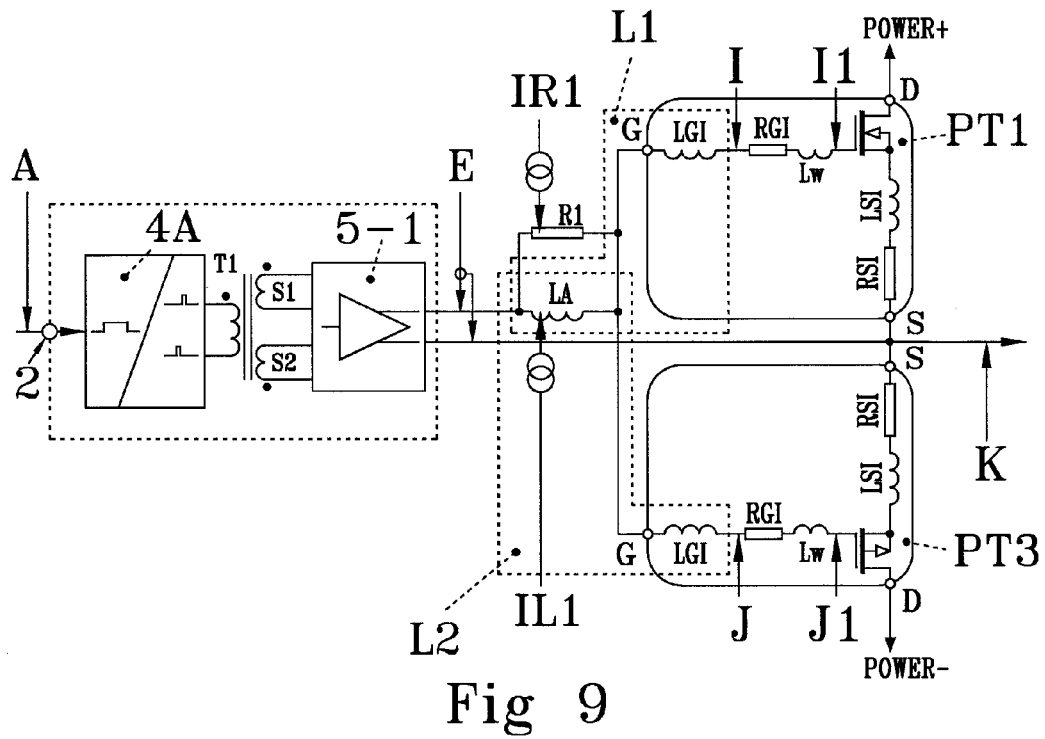

In the embodiments shown in FIGS. 8, 9 the power switch devices PT1, PT2 comprise a common source S and a galvanic gate connection for a common trigger signal E having a signal form as shown in the first signal diagram of FIG. 11. The trigger signal E drives the power switch device PT1 over the inductivity L1 and the other complementary power switch device PT3 over the inductivity L2 as illustrated by the embodiment shown in FIG. 8. As shown in FIG. 8 the inductivity L1 consists of the internal power MOSFET inductivity LGI of the first power MOSFET PT1 and the inductivity L2 consists of the internal power MOSFET inductivity LGI of the other power MOSFET PT3. In a possible implementation the inductivities L1 and L2 can be increased by providing an additional coil having an inductivity LA as shown in the embodiment of FIG. 9.

In the embodiments of FIGS. 8, 9 the power switch devices PT1, PT3 are formed by complementary power switch devices. The control electrodes of these complementary power switch devices PT1, PT3 are connected to each other and receive the common trigger signal E. Furthermore, the two complementary power switch devices PT1, PT3 are connected to each other at a common source terminal S. The drain terminals D of the complementary power switch devices PT1, PT3 are connected to power supply terminals to receive a positive power supply (power+) and a negative power supply voltage (power−). As can be seen in FIG. 8 the common source terminals S of the two complementary power transistors PT1, PT3 are connected to a load driven by the complementary power switch devices PT1, PT3.

Figure 12:
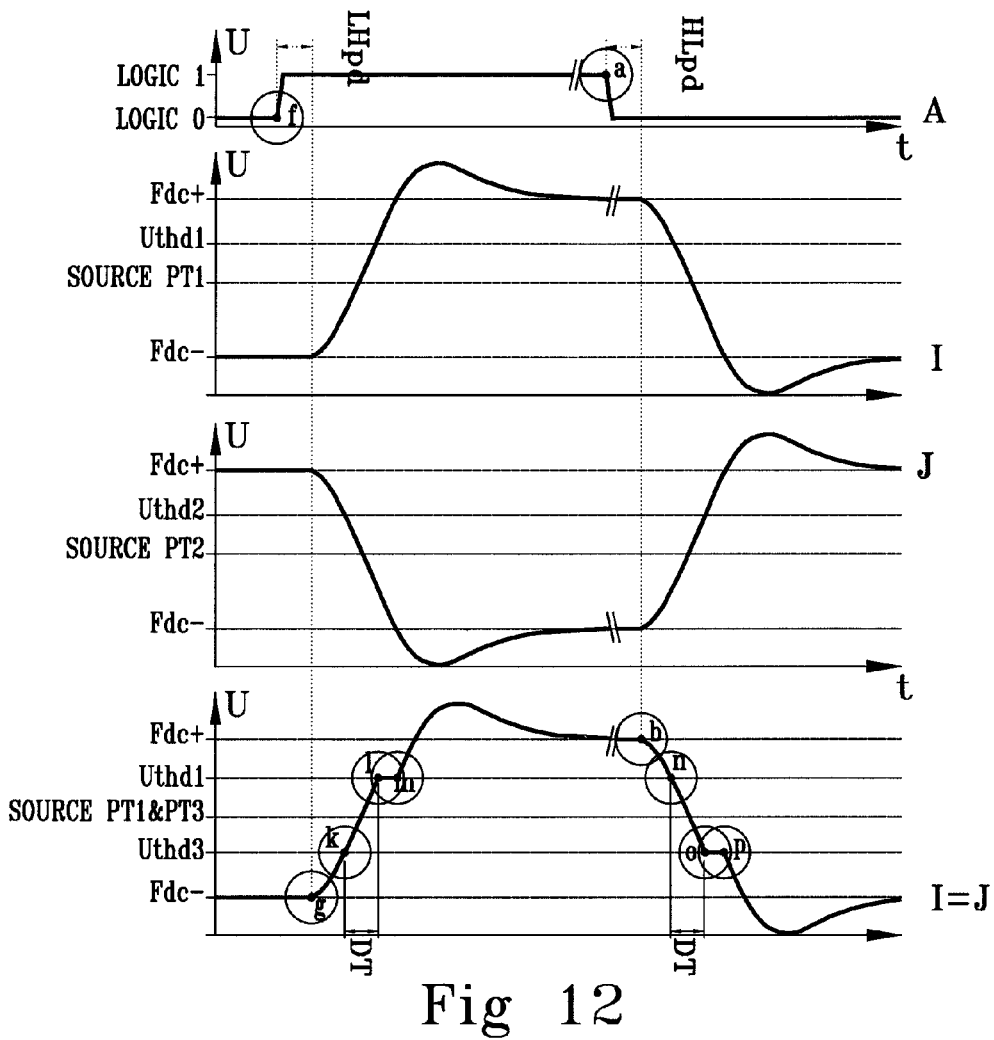

In the moment when the trigger signal E output by the trigger signal generating circuit 5 switches an inner capacity charge of the power MOSFET PT1 is increased by the electrical current IL1 until the voltage of the shaped trigger signal I has reached the positive supply voltage value FDC+ as illustrated in FIG. 12. The signal I forms a ramping drive signal shaped from the respective trigger signal E. Because of the energy saved in the inductivity L1 forming an energy buffer component 6 a voltage over-sway occurs which accelerates the switching of the power MOSFET PT1. The duration of the voltage oversway or voltage overshot is preferably adapted to the internal gate inductivity of the power MOSFET PT so that the duration of the voltage overshot is short enough to avoid an overvoltage between the gate and the channel, in particular at the internal gate-source capacity. By switching the trigger signal E from the voltage FDC− to the voltage FDC+ as shown in the first signal diagram of FIG. 11 an input capacity Ciss charge of the first power MOSFET PT1 is reduced by the current IL1 until the voltage of the shaped trigger signal I has reached the value FDC+. Because of the energy saved in the inductivity L1 forming an energy buffer component 6 a minor voltage under-sway occurs as shown in FIG. 12. The inner driving electrode resistance RGI, the inner source resistance RSI of the power MOSFET PT1 and the inner resistance of the driving stage 5 damp oscillation of the over- or under-sway of the shaped ramping drive signal I shown in FIG. 12 and prevent an oscillation of the voltage signal I. The inner inductance LGI increases the speed of the gate capacity charging and discharging. For tuning or adjusting the damping an additional external damping resistor R1 can be provided as shown in the embodiment of FIG. 9. The current IR1 flowing through the external damping resistor R1 is shown in the second signal diagram of FIG. 11. In the first phase of the switching trigger signal E a current IR1 flowing through the damping resistor R1 accelerates the charging (or discharging) of the inner capacity of the driven power switch device PT1.

FIG. 12 shows a signal diagram of the ramping trigger signal I in comparison to the input pulse width modulated PWM signal A applied to the input 2 of the driving circuit 1.

The other power switch PT2 in the embodiment of FIG. 2 or the complementary power switch PT3 in the embodiments of FIGS. 8 and 9 receive a complementary shaped trigger signal J whose signal diagram is shown as the third diagram of FIG. 12.

In the moment the trigger signal F switches the inner capacity (Ciss) charge of the second power switch device PT2 is decreased by the current IL2 until the voltage of the driving signal J reaches the negative voltage FDC− as shown in FIG. 12. Because of the energy saved in the coil L2 forming an energy buffer component 6 a minor voltage over-sway occurs which accelerates the switching of the second power switch device PT2 without affecting the switching itself. By switching the trigger signal F from the negative voltage FDC− to the positive voltage FDC+ the input capacity Ciss of the second power switch device PT2 is charged by the current IL2 until the voltage of the shaped driving signal J reaches the value FDC+. Because of the energy saved in the second coil L2 a minor voltage over-sway occurs which accelerates the switching of the second power switch PT2 without affecting the switching itself. The inner resistance of the driving electrode RGI, the inner source resistance RSI of the second power switch device PT2 and the inner resistance of the driving transistors V within the driver transistor stage 5 damps the over- or under-sway and prevents further oscillations of the shaped driving signal J. To ensure an optimal damping an additional damping resistance R2 can be provided in parallel to the external coil L2 as shown for example in the embodiment of FIG. 5 or in the embodiments of FIG. 13, 15. The signal diagram of the current IR2 flowing through the damping resistance R2 is shown by the fifth curve in FIG. 11. The sway could also be limited by capping diodes D6, D7 connected between the coupling transformer T3a and the power supply circuit 7. The limited voltage is adjusted by the autotransformer T3a coupling ratio. In the first switching phase of the driving signal F the current IR2 accelerates the charging (or discharging) of the inner capacity Ciss of the second power switch device PT2 and influences the switching losses of the driving transistors within the driving stage.

FIG. 12 shows the signal diagram of the shaped driving signal J applied to the control electrode of the second switching device PT2 in comparison to the input pulse width modulated signal A applied to the input 2 of the driving circuit 1 according to the present invention.

In the embodiments of FIGS. 8 and 9 a common trigger signal E is applied to the control electrodes of complementary power switch devices PT1, PT3. When the trigger signal E switches from the negative voltage FDC− to the positive voltage FDC+ the inner capacity CISS of the n-type power FET forming the first power switch device PT1 is charged by the current IL1 until the voltage I of the shaped driving signal has reached the value of FDC+ and the inner capacity of the p-type power FET forming the second power switch device PT3 is charged by the current IL2 for until the voltage J reaches the value of FDC+. Because of the energy saved in the coil L1 a minor voltage over-sway occurs which accelerates the on-switching of the first power switch device PT1 and the off-switching of the second power switch device PT3 without disturbing the switching itself. By switching the trigger signal E from the positive voltage FDC+ to the negative voltage FDC− the inner capacity CISS of the first power switch device PT1 is discharged by the current IL1 until the voltage I of the shaped driving signal has reached the value FDC− and the input capacity Ciss of the second complementary power switch device PT3 is discharged by the current IL2 until the voltage J of the other shaped driving signal reaches the value FDC−. Because of the energy saved in the coil L1 a minor voltage under-sway occurs which accelerates the off-switching of the first power switch device PT1 and at the same time the on-switching of the complementary power switch device PT3 without affecting the switching itself. The inner resistance RGI of the driving control electrode and the source resistance RSI of the complementary power switch devices PT1 and PT3 as well as the inner resistance of the power MOSFETs within the driving stage 5 adjust the over- or under-sway and prevent a further sway or oscillations of the shaped driving signals I, J applied to the control electrodes of the power switch devices PT1, PT3. To provide an optimal damping characteristic if needed an extra damping resistor R1 can be provided within the circuit as shown in the embodiment of FIG. 9. The signal diagram of the current IR1 flowing through the damping resistance R1 is shown in the second curve of FIG. 11. During the switching phase of the first trigger signal E the current IR1 flowing through the resistor R1 accelerates charging (or discharging) of the input capacity CISS of the first power switch device PT1 and the second complementary power switch device PT3 in the beginning of the switching cycle. The voltage I over time applied to the control electrode of the first voltage controlled power switch device PT1 compared to the input pulse width modulated PWM signal A applied to the input 2 of the driving circuit 1 according to the present invention is shown in the first and fourth signal diagram of FIG. 12.

Figure 5:
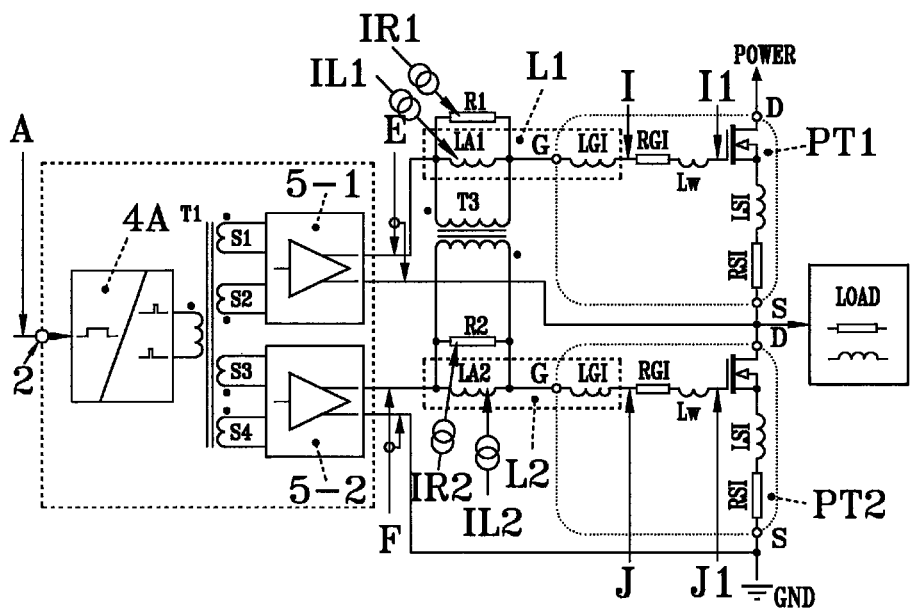
Figure 6:
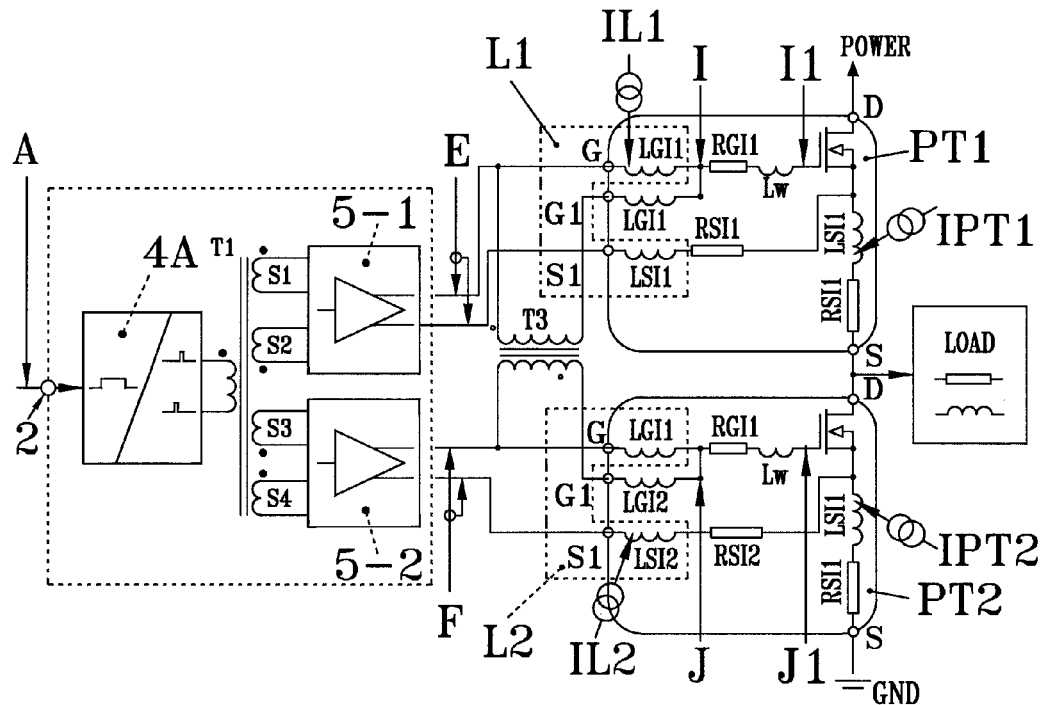
Figure 7:
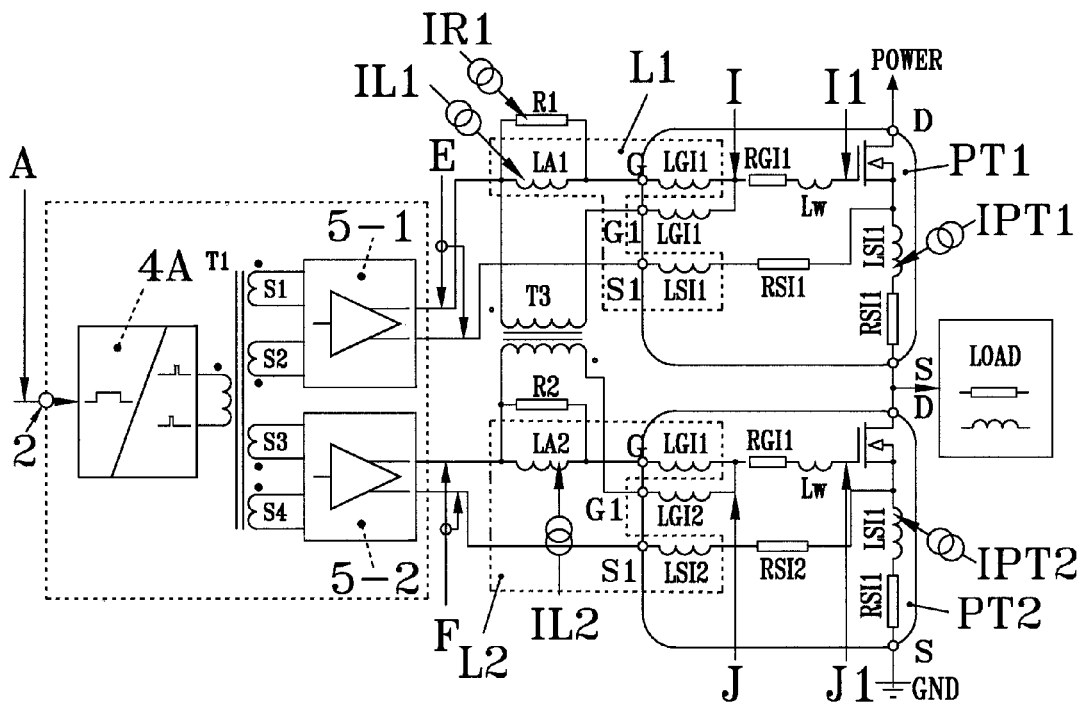

The driving circuit 1 according to the present invention can comprise in some embodiments a coupling transformer T3 as shown for example in the implementations of FIGS. 5, 6, 7. The coupling transformer T3 comprises a negative coupling ratio of one. The coupling transformer T3 with its coupling ratio of one ensures a transient effect symmetry of the added external coils L1, L2; LA1, LA2 forming the external energy buffer components 6. A first winding of the coupling transformer T3 is connected in parallel to a first energy buffer component 6-1 being connected to the control electrode of a first power switch device PT1 of the half bridge connected power switch devices PT1, PT2. The second winding of the coupling transformer T3 is connected in parallel to a second energy buffer component 6-2 being connected to the control electrode of a second power switch device PT2 of the pair of half bridge connected power switch devices PT1, PT2 shown for example in FIG. 5, 6, 7. The coupling transformer T3 further promotes and ensures voltage mirror symmetry of the trigger signals E, F and of the resulting driving signals I, J as shown for example in FIG. 12. The coupling transformer T3 further ensures that a Miller Step-effect causing a step in the signal diagram is transferred to the other control electrode or gate G of a power switch device PT1 or PT2. The leakage inductance L of the coupling transformer T3 is low and can be in a range of a view nH.

The driving circuit 1 according to the present invention can comprise in some embodiments an autotransformer T3a with a coupling ratio less than 1 connected in parallel to an inductivity L1, via a capping diode D6 to a positive power source Fdc+ of a power supply circuit 7 as shown in FIG. 35.

As shown in FIG. 35 after the switch off of the driving transistor V1 between time markers m' and n' the current IL1 flowing through the inductivity L1 starts to flow via the autotransformer T3a and the capping diode D6 back to the positive power source Fdc+ of the power supply unit 7 and returns from the negative power source Fdc− of the power supply circuit 7 over the body diode BD of the transistor V2 back to the inductivity L1. After the switch off of the driving transistor V2 between time markers q' and r' the current IL1 flowing through the inductivity L1 starts to flow via the autotransformer T3a and the capping diode D7 back to the negative power source Fdc− of the power supply unit 7 and returns from the positive power source Fdc− of the power supply unit 7 over the body diode BD of the transistor V1 back to the inductivity L1.

Figure 36:
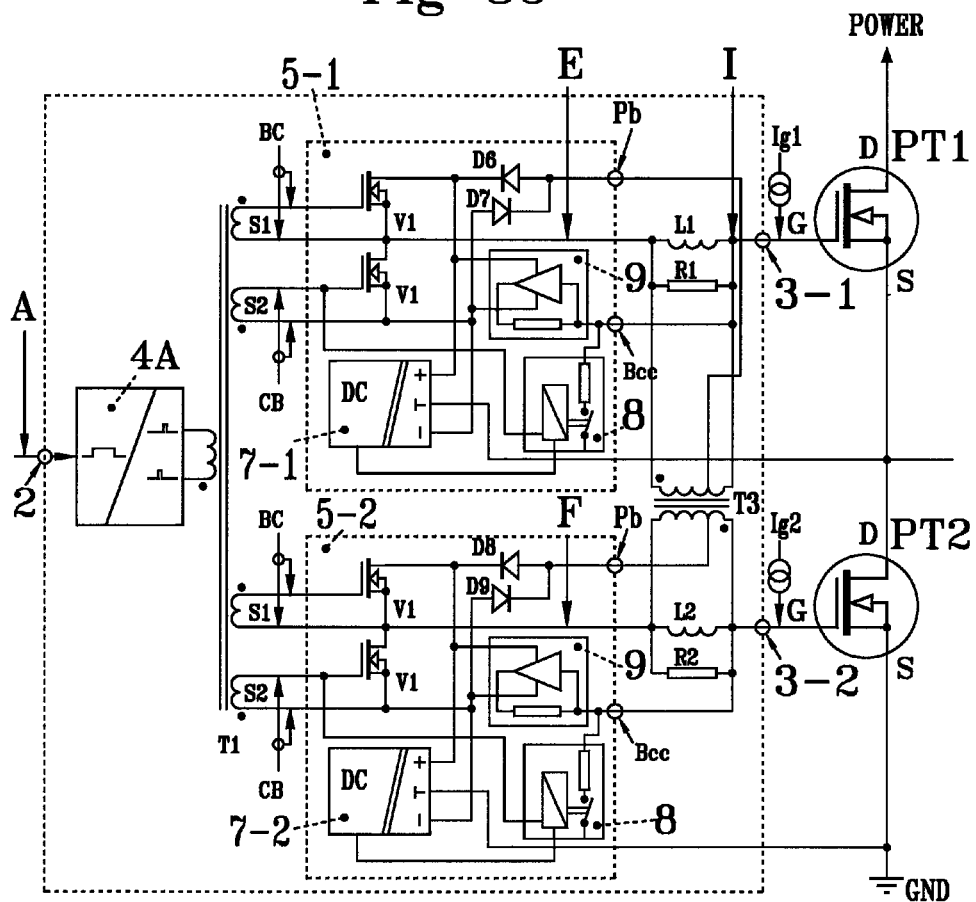
FIG. 36 shows a block diagram of a driving circuit for two power FETs including a return of excess energy.

In a possible embodiment as shown in FIG. 36 the power supply circuit 7 is represented by power supply circuits 7-1 and 7-2 consisting of one negative Fdc− and positive power source Fdc+.

The capping diode D6 is on FIG. 36 represented by capping diode D8 and has the same function as capping diode D6. The capping diode D7 is on FIG. 36 represented by capping diode D9 and has the same function as capping diode D7.

The driving circuit 1 according to the present invention can in some embodiments comprise a coupling transformer T3 with an additional tap to form an autotransformer T3a with a coupling ratio less than 1 and being connected via the capping diode D6 to the positive power source Fdc+ of the power supply circuit 7-1 and via the capping diode D7 to the negative power source Fdc− of the power supply unit 7-1 and being connected via the capping diode D8 to the positive power source Fdc+ of the power supply circuit 7-2 and via the capping diode D9 to the negative power source Fdc− of the power supply unit 7-2 as shown in FIGS. 2, 36.

As shown in FIG. 36 after the switch off of the driving transistor V1 between time markers m' and n' the current IL1 flowing through the inductivity L1 starts to flow via the primary winding Wp of the autotransformer T3a, additional primary winding Wp tap and the capping diode D6 back to the positive power source Fdc+ of the power supply unit 7-1 and returns from the negative power source Fdc− of the power supply circuit 7-1 over the body diode BD of the transistor V2 back to the inductivity L1. After the switch off of the driving transistor V2 between time markers q' and r' the current IL1 flowing through the inductivity L1 starts to flow via the primary winding Wp of the autotransformer T3a, additional primary winding Wp tap and the capping diode D7 back to the negative power source Fdc− of the power supply unit 7-1 and returns from the positive power source Fdc− of the power supply unit 7-1 over the body diode BD of the transistor V1 back to the inductivity L1.

As shown in FIG. 36 after the switch off of the driving transistor V3 between time markers m' and n' the current IL2 flowing through the inductivity L2 starts to flow via the primary winding Wp of the autotransformer T3a, additional secondary winding Ws tap and the capping diode D8 back to the positive power source Fdc+ of the power supply unit 7-2 and returns from the negative power source Fdc− of the power supply circuit 7-2 over the body diode BD of the transistor V4 back to the inductivity L2. After the switch off of the driving transistor V4 between time markers q' and r' the current IL2 flowing through the inductivity L2 starts to flow via the secondary winding Ws of the autotransformer T3a, additional secondary winding Ws tap and the capping diode D7 back to the negative power source Fdc− of the power supply unit 7-2 and returns from the positive power source Fdc− of the power supply unit 7-2 over the body diode BD of the transistor V3 back to the inductivity L2.

In this way a part of energy for turning on or off the power switch device PT remaining on the energy buffer component 6 after the switch had been executed is returned to the power supply circuit 7.

Further, energy used to control the power switch device PT is saved. Moreover the clamping protects the power switch device PT against destruction by an excessive voltage oversway and makes the voltage overshot possible to increase the switching speed. Further by saving energy used to control the power switch device PT heating is diminished allowing even higher switching frequencies.

Figure 37:
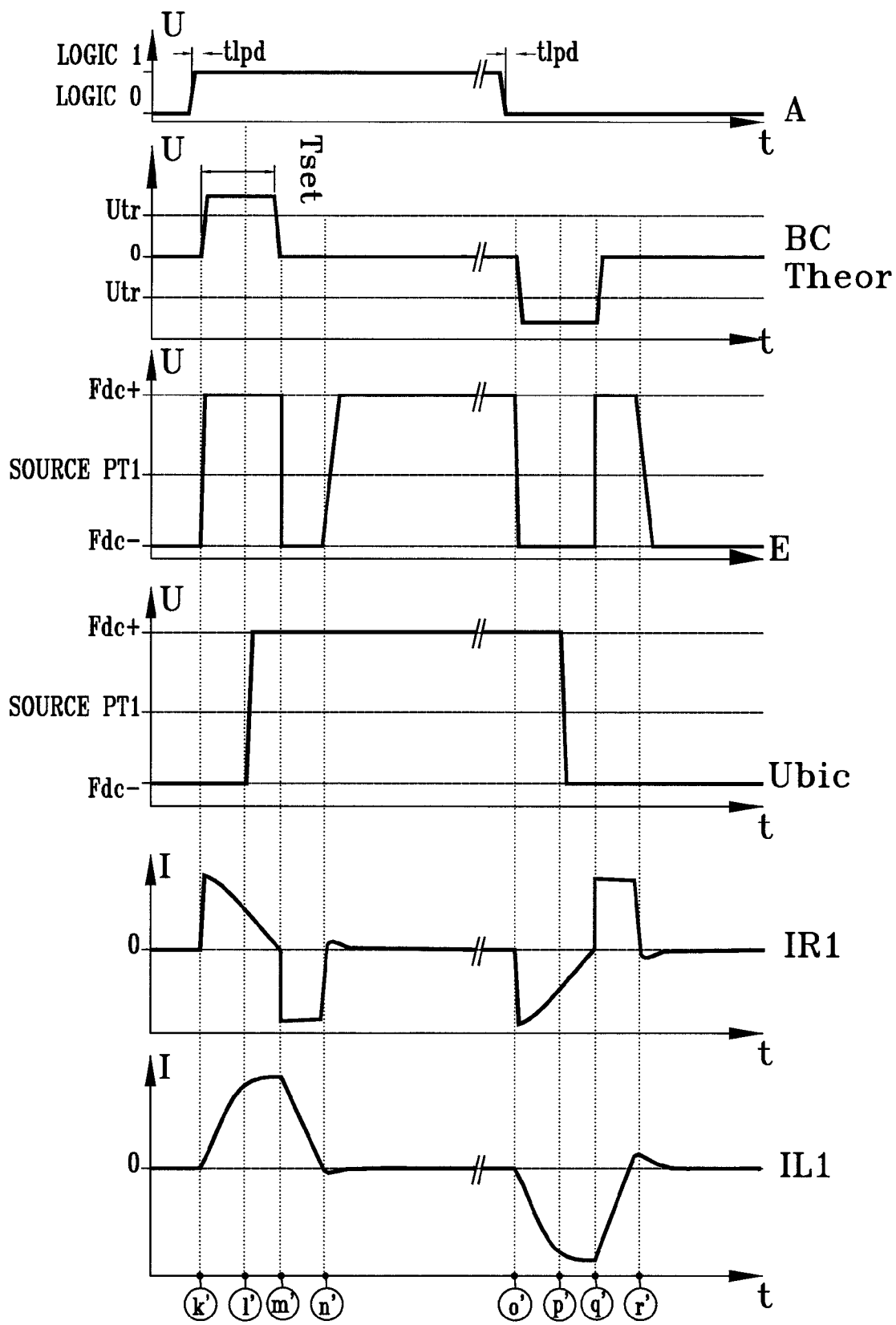
FIG. 37, 38 shows signal diagrams for illustrating an operation of a driving circuit shown in FIG. 35 and FIG. 36.

FIG. 37 shows signal diagrams for illustrating functionality of the driving circuit 1 according to the embodiment shown in FIG. 35.

The first signal diagram shown in FIG. 35 represents the input logical signal A applied to the input terminal 2. The second signal diagram of the FIG. 37 illustrates the triggering signal E shown in FIG. 35.

The third signal diagram of the FIG. 37 illustrates the triggering signal E shown in FIG. 35.

The fourth signal diagram in FIG. 37 shows the output voltage Ubic out of a bistable circuit 9 demonstrated in FIG. 35.

The fifth signal diagram of the FIG. 37 illustrates the current flow IR1 through damping resistor R1 shown in FIG. 35.

The sixth signal diagram of the FIG. 37 shows the current flow IL1 through the inductivity L1 shown in FIG. 35.

Time markings k' to r' are marked upon the x-axis of the sixth diagram.

Figure 38:
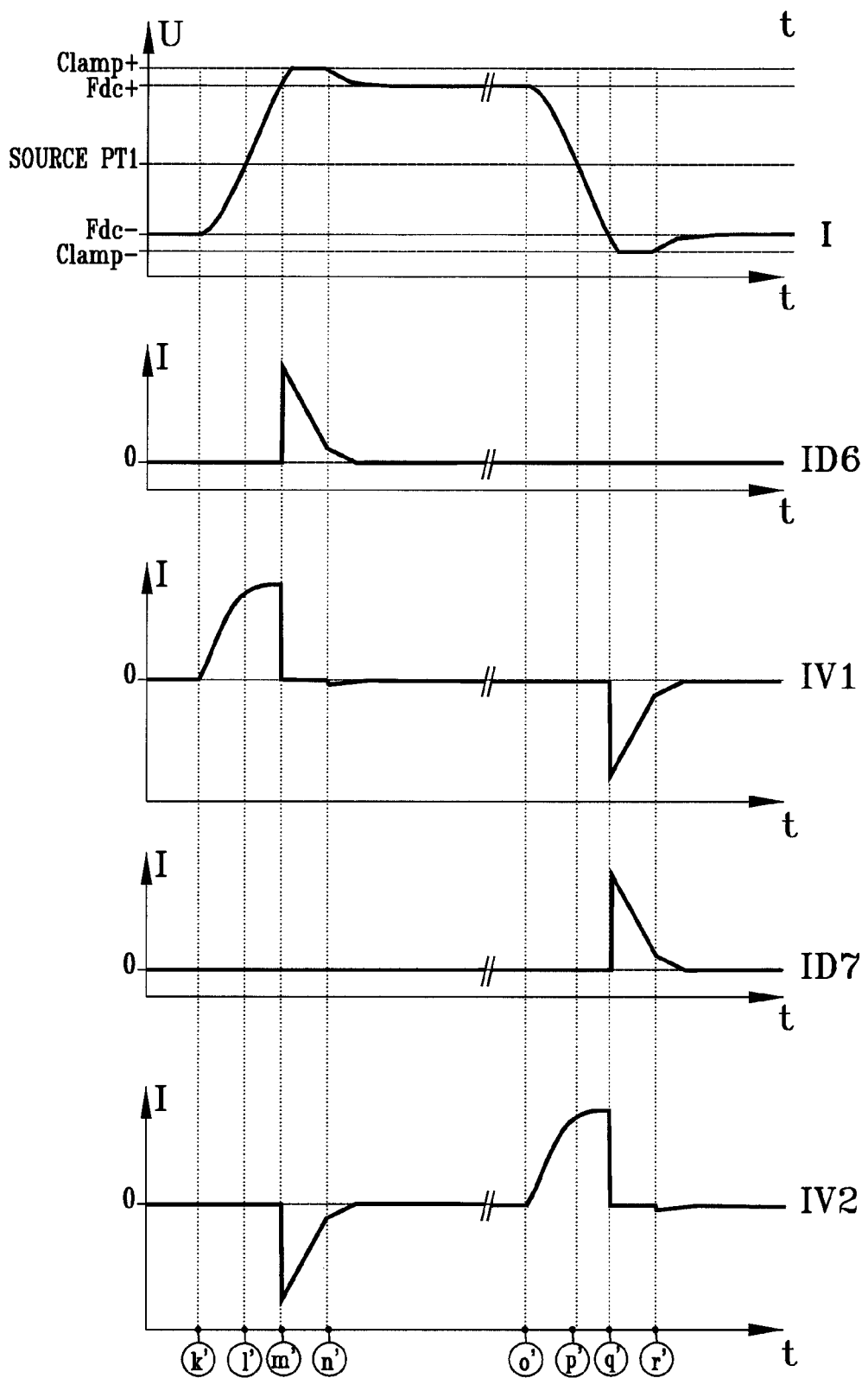
Figure 39:
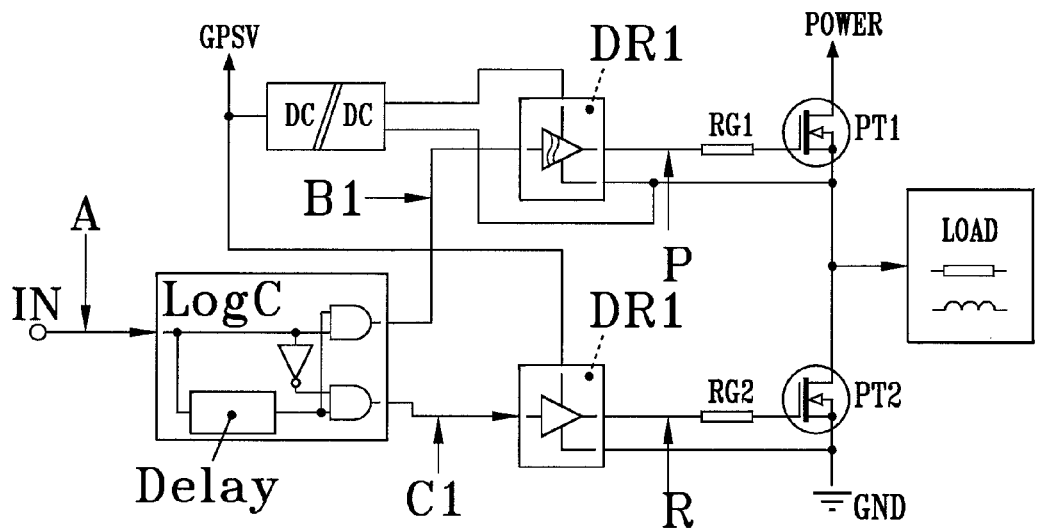
FIG. 39 shows a block diagram of a conventional driving circuit.
Figure 40:
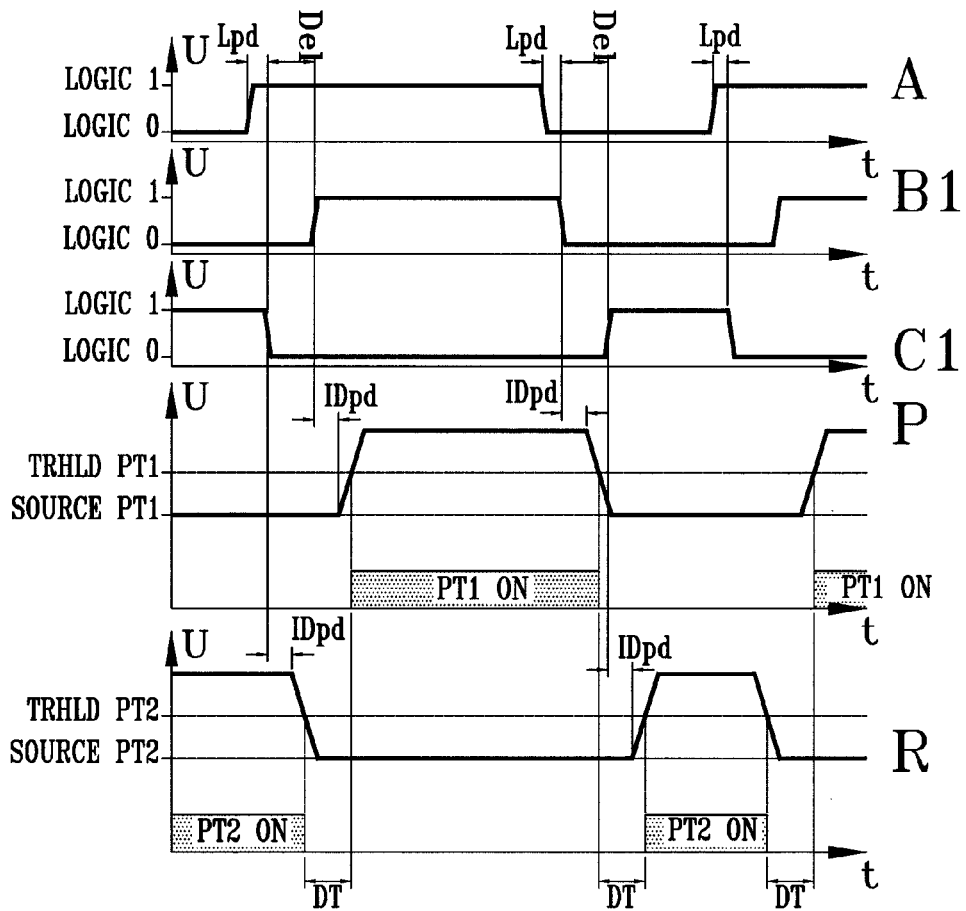
FIG. 40 shows a signal diagram for illustrating the operation of the conventional driving circuit shown in FIG. 39.
Figure 41:
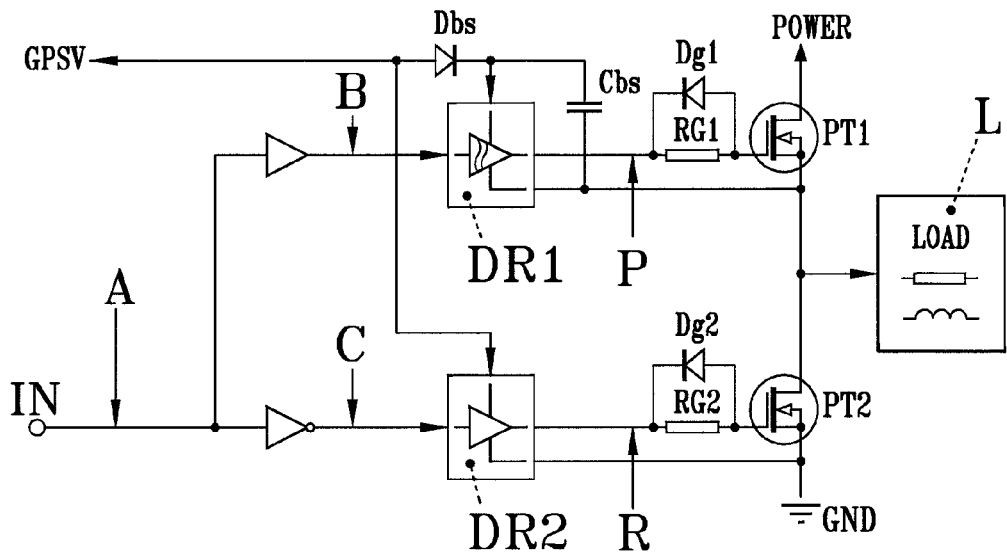
FIG. 41 shows a block diagram for illustrating a further possible conventional driving circuit.
Figure 42:
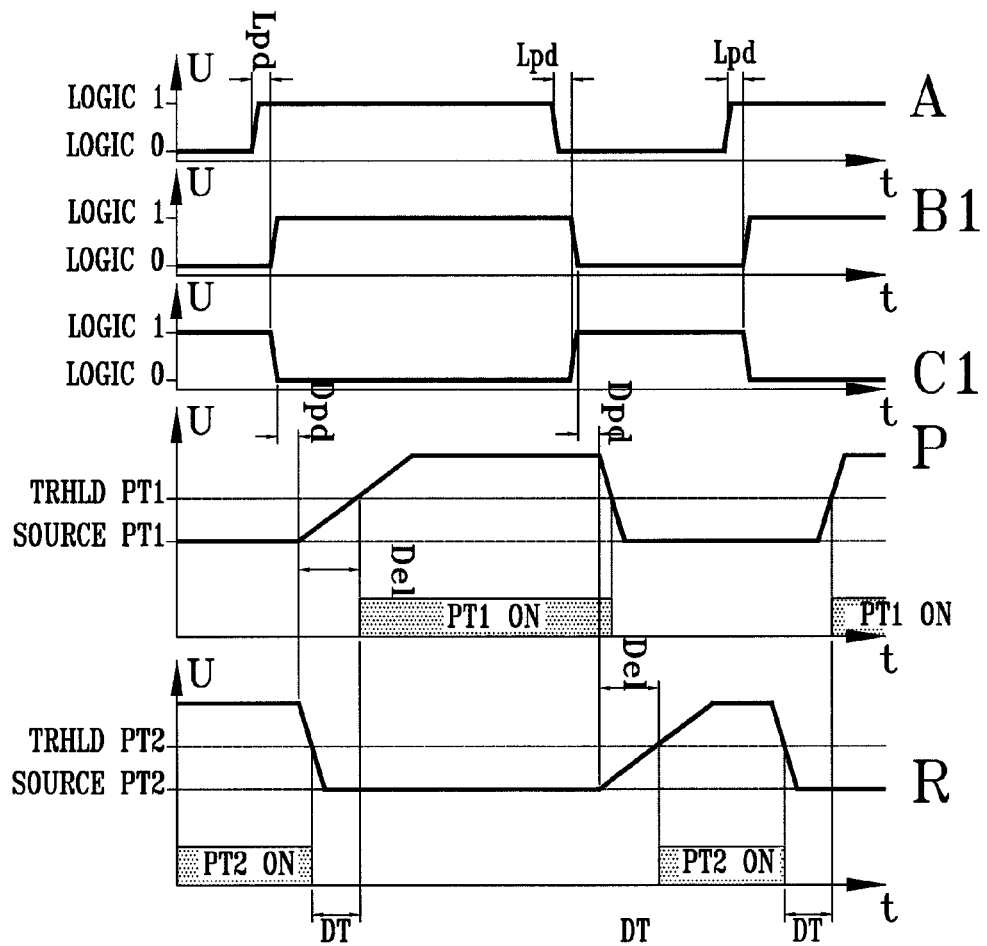
FIG. 42 shows signal diagrams for illustrating the operation of the conventional driving circuit shown in FIG. 41.

FIG. 38 presents the continuation of the signals presented on FIG. 37.

The first curve of the FIG. 38 illustrates the first trigger signal I applied to the power switch device PT1 wherein the clamping voltages Clamp+ and Clamp− provided by the clamping diodes are marked up.

The second curve of the FIG. 38 shows the current flow ID6 through the clamping diode D6 shown in FIG. 35.

The third curve of FIG. 38 presents the current flow IV1 through the first driving transistor V1 shown in FIG. 35. The fourth curve of FIG. 38 shows the current flow ID7 through the clamping diode D7 shown in FIG. 35.

The fifth curve of FIG. 38 demonstrates the current flow IV2 through the first driving transistor V2 shown in FIG. 35.

Time markings k' to r' are marked up upon the x-axis of the fifth curve.

In a possible embodiment for more co-time working the power switch devices PT are switched synchronously. The coupling transformer T3 can have more primary windings and a corresponding number of secondary windings as illustrated in the embodiment shown in FIG. 25. In the embodiment of FIG. 25 two pairs of power switch devices PT1A, PT1B and PT2A, PT2B are provided and the coupling transformer T3 also comprises two primary and two secondary windings.

FIG. 26 shows a further possible embodiment having more than one pair of power switch devices PT1, PT2. In this embodiment more than one coupling transformer T3 are provided. In the embodiment as shown in FIG. 26 for each pair of power switch devices PT a corresponding pair of coupling transformers T3 is provided. All secondary windings of coupling T3 are connected in parallel.

Figure 13:
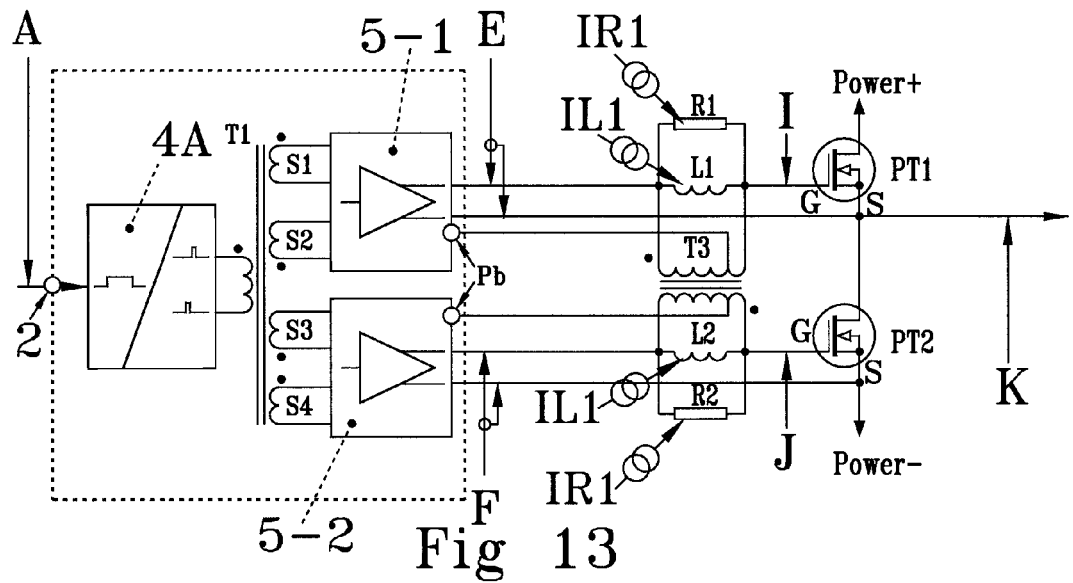
FIG. 13 shows a diagram of a possible embodiment of a driving circuit according to the present invention.
Figure 14:
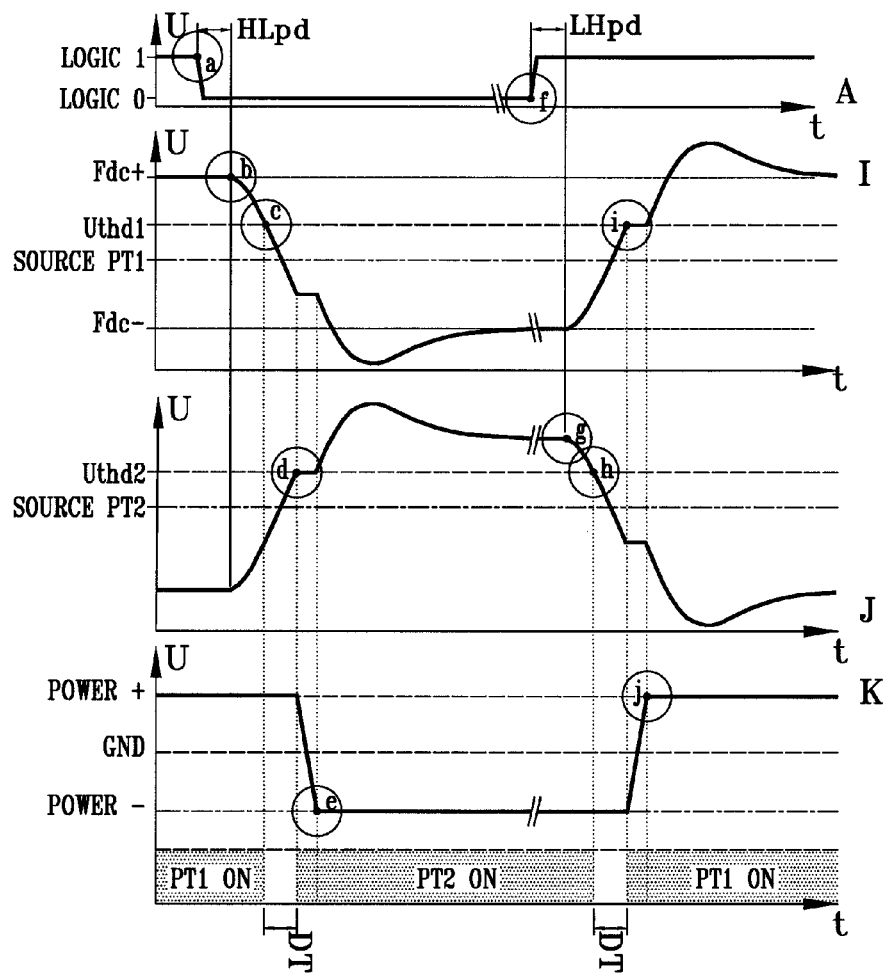
FIG. 14 shows signal diagrams for illustrating the operation of the driving circuit shown in FIG. 13.

The switching between half bridge connected power switch devices PT1, PT2 without a connected load is shown for example in FIG. 13 and illustrated by the signal diagrams of FIG. 14. The first signal diagram of FIG. 14 shows the input pulse width modulated PWM signal A applied to the driving circuit 1 according to the present invention. The switching begins at time point (a) with the input pulse width modulated signal A changing its value from logical high to logical low. After a response time HLpd the trigger signals E, F output by the trigger signal generating circuit 5 start to switch at point (b). The trigger signal E switches from a positive voltage FDC+ to a negative voltage FDC− and the complementary trigger signal F switches simultaneously from a negative voltage FDC− to a positive voltage FDC+. The resulting voltage I applied to the control electrode of the first power switch device PT1 is decreasing in response to the switched off trigger signal E as shown in the second signal diagram of FIG. 14. At the same time the voltage J applied to the control electrode of the second power switch device PT2 is increasing in response to the switched on trigger signal F as shown in the third signal diagram of FIG. 14.

When the voltage I at the control electrode at the first power switch device PT1 is lowered below the threshold voltage Uthd1 of the first power switch device PT1 at point (c) then switching of the first power switch device PT1 is executed wherein Uthd1 is the switching threshold voltage of the first power switch device PT1. At this very moment the negative voltage J applied to the control electrode of the other power switch device PT2 is still increasing and reaches the threshold voltage Uthd2 of the second power switch device PT2 at a later time at point (d) where the second power switch device PT2 is switched on, wherein the voltage Uthd2 is the threshold switching voltage of the second power switch device PT2. After the second power switch device PT2 has been switched on at point (d) the output voltage K starts to switch from the positive power supply potential (power+) to the negative power supply potential (power−) as shown in the fourth signal diagram of FIG. 14. Because of the Miller capacity of the power switch devices PT1 and PT2 the voltages I and J at the control electrodes of the power switch devices PT1, PT2 maintain briefly a constant voltage value for as long as the output voltage K has reached the negative power supply potential (power−) at point (e) as shown in the second, third and fourth signal diagram of FIG. 14. This state is kept unchanged until the input pulse width modulated PWM signal A changes its logical value again.

A further switching begins in the shown signal diagrams of FIG. 14 at point (f) when the applied input pulse width modulated PWM signal A changes its logical value from logical low to logical high. After a response time $LH_{pd}$ has been expired the trigger signals E and F switch at point (g). The trigger signal E switches from a negative voltage value FDC− to a positive voltage value FDC+ and simultaneously the other trigger signal F switches from a positive voltage value FDC+ to a negative voltage value FDC−. In response to the trigger signals E, F the voltages I, J applied to the control electrodes of the power switch devices PT1, PT2 are changing. As can be seen in FIG. 14 the applied voltage I of the first power switch device PT1 is increasing and the voltage J applied to the control electrode of the second power switch device PT2 is decreasing. When the second voltage J applied to the control electrode of the second power switch device PT2 is lowered under the threshold voltage Uthd2 of the second power switch device PT2 at point (h) the power switch device PT2 is switched off where the voltage Uthd2 represents the switching voltage of the second power switch device PT2. In this very moment the other voltage I applied to the control electrode of the first power switch device PT1 is still increasing and reaches the threshold voltage Uthd1 of the first power switch device PT1 at a later point (i) where the first power switch device PT1 is switched on. After the first power switch device PT1 has been switched on at point (i) the output voltage K starts to switch from the negative power supply potential (power−) to the positive power supply potential (power+) as shown in the fourth signal diagram of FIG. 14. Because of the Miller capacity of the power switch devices PT1, PT2 the voltages I and J at the control electrodes of the power switch devices PT1, PT2 are kept at a constant voltage value until the output voltage K reaches the positive power supply potential (power +) at point (j).

It can be seen from FIG. 14 that there is a short dead time DT between the time when the first power switch device PT1 is switched off at point (c) and the time when the second power switch device PT2 is switched on at point (d). Further there is a dead time DT between the time when the second power switch device PT2 is switched off at point (h) the first power switch device PT1 is switched on at point (i).

The complementary rectangular trigger signals E, F provided by the trigger signal generating circuit 5 are supplied via the corresponding energy buffer components 6-1, 6-2 such as coils L1, L2 shown in FIG. 13 to the control electrodes G of the half bridge connected power switch devices PT1, PT2. The rectangular trigger signals E, F are shaped into two corresponding ramping drive signals I, J applied to the control electrodes of the half bridge connected power switch devices PT1, PT2 as shown in FIG. 14. The half bridge connected power switch devices PT1, PT2 are switched consecutively by the ramping drive signals I, J when a threshold voltage Uth of the respective power switch device PT1, PT2 is reached by the applied respective ramping drive signal I, J. The dead time DT between switching the first power switch device PT1 and switching the second power switch device PT2 of the half bridge connected power switch devices in response to the ramping drive signal I, J can be in an exemplary embodiment less than 10 ns. In a possible embodiment the dead time DT can be in a range of 2-5 ns. The dead time DT is generated automatically without the need of a complex dead time adjustment circuit.

In the embodiment of FIG. 13 the power switch devices PT1, PT2 are not complementary and are driven by drive signals I, J generated in response to two separate trigger signals E, F. In the embodiment as shown for example in FIG. 9 the two power switch devices PT1, PT3 are complementary power switch devices driven by driving signals I, J which are derived from one common trigger signal E. Switching among the p- and n-type power switch devices PT1 and PT3 connected in a half bridge as shown in the embodiment in FIG. 9 and not being connected to a load is illustrated in the signal diagrams of FIG. 12. In the shown signal diagrams the switching starts at point (f) when the applied input pulse width modulated PWM signal A changes its logical value from logical low to logical high. After expiration of a response time LHpd the trigger signal E switches at point (g) from a negative voltage FDC− to a positive voltage FDC+. In response to the switched on trigger signal E the voltages I and J applied to the control electrodes of the complementary power switch devices PT1, PT3 start to rise and reach the threshold voltage Uthd3 of the power switch device PT3 at point (k) so that the switching of the power switch device PT3 is executed wherein the voltage Uthd3 represents the switching voltage of the power switch device PT3 and is negative with regard to the source voltages of the power switch devices PT1 and PT3. The voltages I and J continue to rise and reach the threshold voltage UThd1 of the first power switch device PT1 at point (l) so that also the first power switch device PT1 is switched on. The output voltage K starts to switch from the negative power supply potential (power−) to the positive power supply potential (power+). Because of the Miller capacity of the first power switch device PT1 and of the second complementary power switch device PT3 the voltages I and J maintain a steady voltage value until the output voltage K reaches the positive power supply potential (power+) at point (m) as shown in FIG. 12. This state is kept until the input pulse width modulated PWM signal A changes again its logical value. The switching begins as shown in FIG. 12 at point (a) when the input pulse width modulated PWM signal A changes its value from logical high to logical low. After the response time HLpd has been expired the trigger signal E switches at point (b) from a positive voltage value FDC+ to a negative voltage value FDC−. The voltages I, J at the control electrodes of the power switch devices PT1, PT3 start to decrease and reach the threshold voltage UThd1 of the first power switch device PT1 at point (n) where the first power switch device PT1 is switched off. The voltages I, J continue to fall steadily and reach the threshold voltage Uthd3 of the other power switch device PT3 at point (o) where the power switch device PT3 is switched on. As a consequence, the output voltage K starts to switch from the positive power supply potential (power+) to the negative power supply potential (power−). Because of the Miller capacity Cds of the power switch devices PT1 and PT3 the voltages I, J at the control electrodes of the power switch devices PT1, PT3 the voltage value is maintained until the output voltage K reaches the negative power supply potential (power−) at point (p).

Accordingly, in the embodiment of FIG. 9 as illustrated by the signal diagram of FIG. 12 the dead time DT is the time period between the time where the power switch device PT3 has been switched off at point (K) and the time when the first power switch device PT1 has been switched on at point (l). Further, the dead time DT is the time period between the time when the power switch device PT1 has been switched off at point (n) and the time where the other power switch device PT3 has been switched on at point (o) as shown in FIG. 12.

In a possible exemplary embodiment the dead time DT can be less than 10 ns. In a possible implementation the dead time DT can be in a range between 2 and 5 ns. With the driving circuit 1 according to the present invention the dead times DT between the switching times of the two power switch devices PT1, PT2 and the complementary power switch devices PT1, PT3 are significantly lower than in conventional circuits. Furthermore, the driving circuit 1 according to the present invention does not employ a complex circuitry for adjusting the dead times DT between the switching driving signals such as the driving signals I, J.

Figure 15:
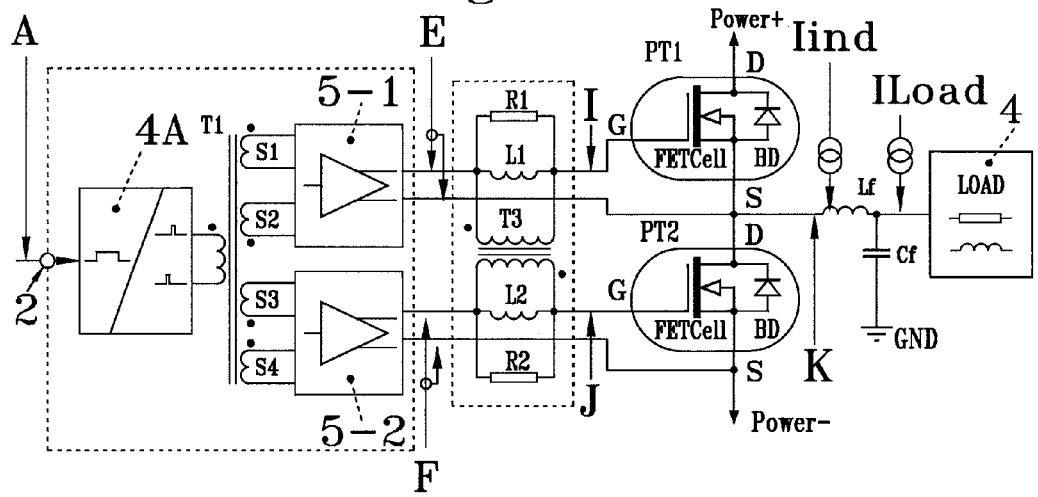
FIG. 15 shows a circuit diagram of a further possible embodiment of the driving circuit according to the present invention.
Figure 16:
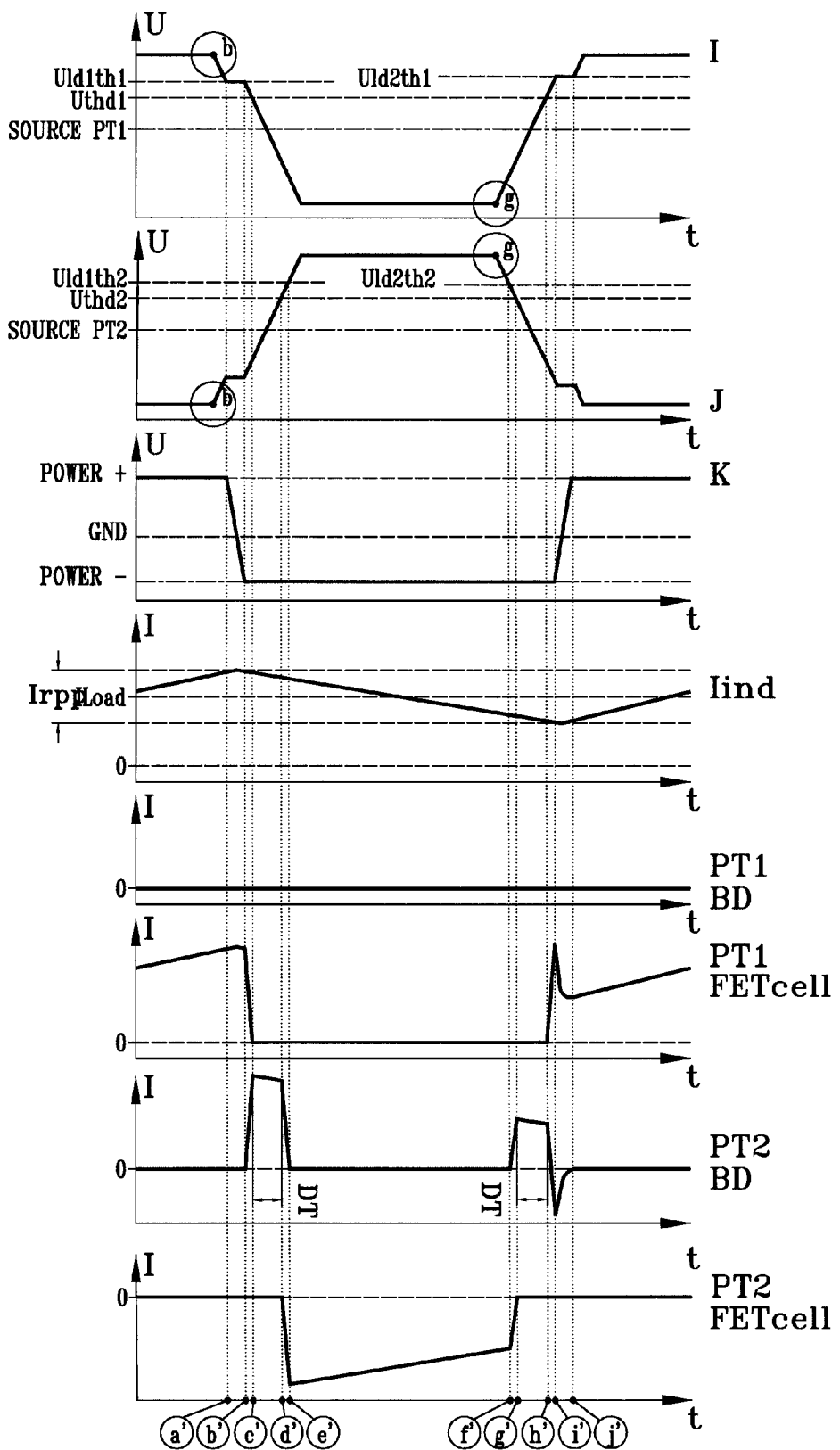
FIG. 16 shows signal diagrams for illustrating the operation of the driving circuit shown in FIG. 15.

FIG. 15 shows a possible embodiment of a driving circuit 1 according to the present invention where the power switch devices PT1, PT2 are connected via an LC filter to a load. Switching of the power switch devices PT1, PT2 of the exemplary embodiment of FIG. 15 is illustrated by the signal diagrams as shown in FIG. 16.

The switching begins when the trigger signals E and F switch at point (b). The trigger signal E switches from the positive voltage value FDC+ to the negative voltage FDC− and simultaneously the trigger signal F switches from the negative voltage FDC− to the positive voltage FDC+. When the voltage I at the control electrode of the first power switch PT1 reaches the threshold voltage Uldth1 switching off of the power switch device PT1 begins wherein Uldth1 is the switching voltage of power switch PT1 for the load: Iind=Iload+(Irpp)/2 wherein Iind is the current flowing through the coil LF of the LC filter connected between the driving circuit 1 and the load as shown in FIG. 15. Because of the energy saved in the inductivity LF of the LC filter the output voltage K simultaneously starts to switch from the positive power supply potential (power+) to the negative power supply potential (power−). Due to the Miller capacity of the first and second power switch devices PT1, PT2 a constant voltage value of the voltages I and J are maintained until the output voltage K has reached the negative power supply potential (power−) at time marking (b') as shown in FIG. 16. This represents a soft switch. A further voltage reduction of the voltage I causes a reduction of the current proportion Iind over the ideal power MOSFET (FETcell) of Power Transistor PT1 as shown in FIG. 15 and is fully transferred to the parasitic diode BD of the power MOSFET PT2 when the voltage I has reached the threshold voltage UThd1 at time marking (c') as shown in FIG. 16. In this very moment the negative voltage J is still rising and increasing. The voltage J reaches the threshold voltage Uthd2 at time marking (d') and the current Iind begins to transfer itself from the parasitic diode BD to the ideal MOSFET (FETcell) of Power Transistor PT2 which takes over the whole load when the voltage J reaches the threshold voltage Uldlth2 at time marking (e') wherein the voltage Uldlth2 is the switching voltage of the second power MOSFET PT2 for the load Iind=Iload+(Irpp)/2. The reached state remains until the input pulse width modulated PWM signal A changes its value again and consequently the trigger signals E and F are switched again at point (g) as shown in FIG. 16. The trigger signal E switches from the voltage value FDC− to the voltage value FDC+ and the trigger signal F switches simultaneously from the voltage value FDC+ to the voltage value FDC−. When the voltage J at the control electrode of the power switch device PT2 as shown in FIG. 15 is lowered under the voltage value Uld2th2 of the second power switch device PT2 at time marking (f') the current Iind is transferred from the ideal FET part (FETcell) to the parasitic diode BD because the output voltage K is detained on the negative power potential (power−) wherein Uld2th2 is the switching voltage of the power MOSFET PT2 for the load Iind=Iload−(Irpp)/2. The parasitic diode BD takes over the whole load when the voltage J at the control electrode of the second power switch device PT2 reaches Uthd2 at time marking (g') for a very short time being shorter than forward recovery. In this very moment the negative voltage I is still rising towards positive, i.e. increasing. When reaching the voltage value Uthd1 at time marking (h') the power MOSFET PT1 ideal FET (FETcell) has to be switched on and starts to take over the current Iind until the voltage I has reached the voltage value Uld2th1 at time marking (i') wherein is the switching voltage of the first power MOSFET PT1 for the load Iind=Iload–(Irpp)/2 being increased for the power MOSFET PT2 parasitic diode BD reverse recovery current. This reverse recovery current is very low due to the very short dead time, resulting in almost no charge carriers inside the junction of the body diode BD of the PT2 for compensation. This represents a hard switch. This is followed by the output voltage K switching from the negative power potential (power−) to the positive power potential (power+). Because of the Miller capacity of the power MOSFETs PT1 and PT2 the voltages I and J of the voltage values are maintained until the output voltage K reaches the positive power supply potential (power+) at time marking (j'). The described load switching from the first power switch device PT1 to the second power switch device PT2 is a so-called soft switch and the load switching from the second power switch device PT2 to the first power switch device PT1 is a so-called hard switch. The dead time DT for the switching is marked up in the seventh signal diagram of FIG. 16.

Figure 17:
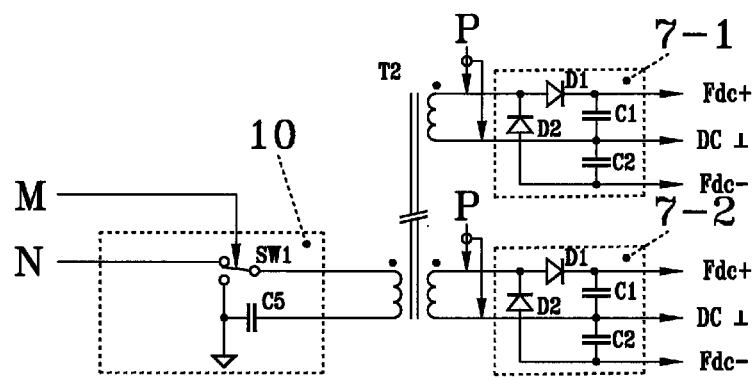
FIG. 17 shows a circuit diagram for illustrating a power supply for a possible embodiment of a driving circuit according to the present invention.

FIG. 17 shows a possible embodiment of a power supply 7 for driving transistor stages 5-i of a trigger generating circuit 5. The trigger signal generating circuit 5 comprises a DC power supply circuit 7 providing a stable on-voltage FDC+ and a stable off-voltage FDC− which can be supplied as the trigger signals E, F via energy buffer components 6 such as the coils L1, L2 to the control electrodes of the power switch devices PT in response to the driver signals generated by the driver signal generating circuit 4. As can be seen in FIG. 17 the DC power supply circuits 7-1, 7-2 of the power supply circuit 7 comprise two half wave rectifiers D1, D2 with smoothing capacitors C1, C2 connected to a secondary winding of a power supply transformer T2 having a primary winding connected to a power supply switching circuit 10 which is controlled by a temperature dependent driving signal M. The two half wave rectifiers D1, D2 with smoothing capacitors C1, C2 assure a low impedance and the charge needed for the operation of the floating driving transistor stages 5-i. The capacitor C1 and the diode D1 rectify a positive amplitude and the negative amplitude is rectified by capacitor C2 and diode D2. The primary winding of the transformer T2 is supplied by the power supply switch circuit 10 as shown in FIG. 17. The amplitude of the voltage P is defined by the ratio of the transformer T2 and by the amplitude of the auxiliary voltage N provided by a DC/DC power supply 12 shown in FIG. 20. The PWM ratio of the temperature dependent driving signal M allows a positive amplitude regulation with regard to the negative amplitude of the voltage P and consequently with regard to the ratio of the voltages FDC+ and FDC−. The capacitor C5 ensures positive and negative amplitude surface area equality of the voltage P and prevents a one-way magnetization of the power supply transformer T2.

Figure 18:
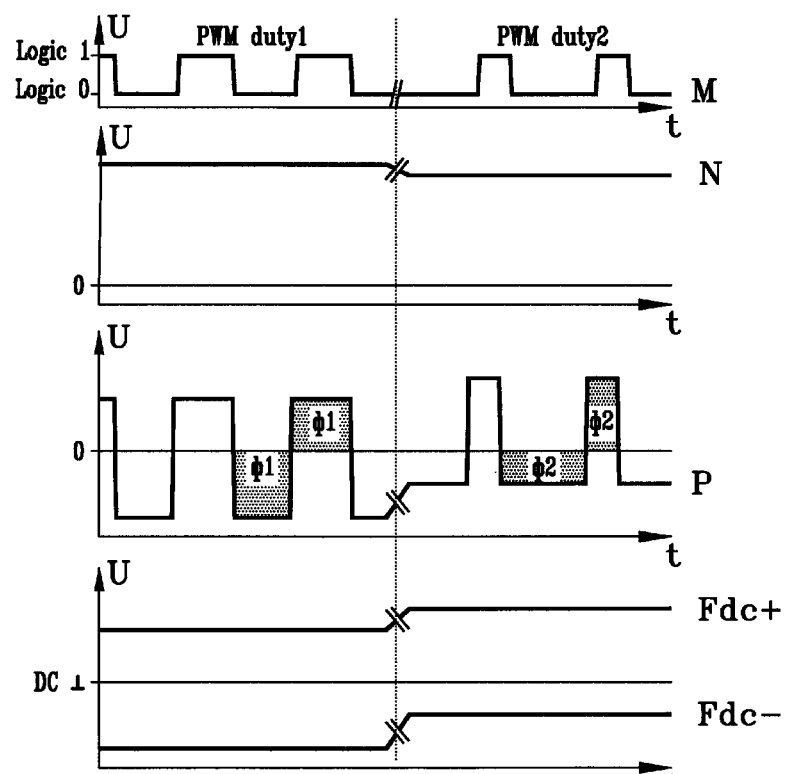
FIG. 18 shows signal diagrams for illustrating the operation of the power supply as shown in FIG. 17.
Figure 19:
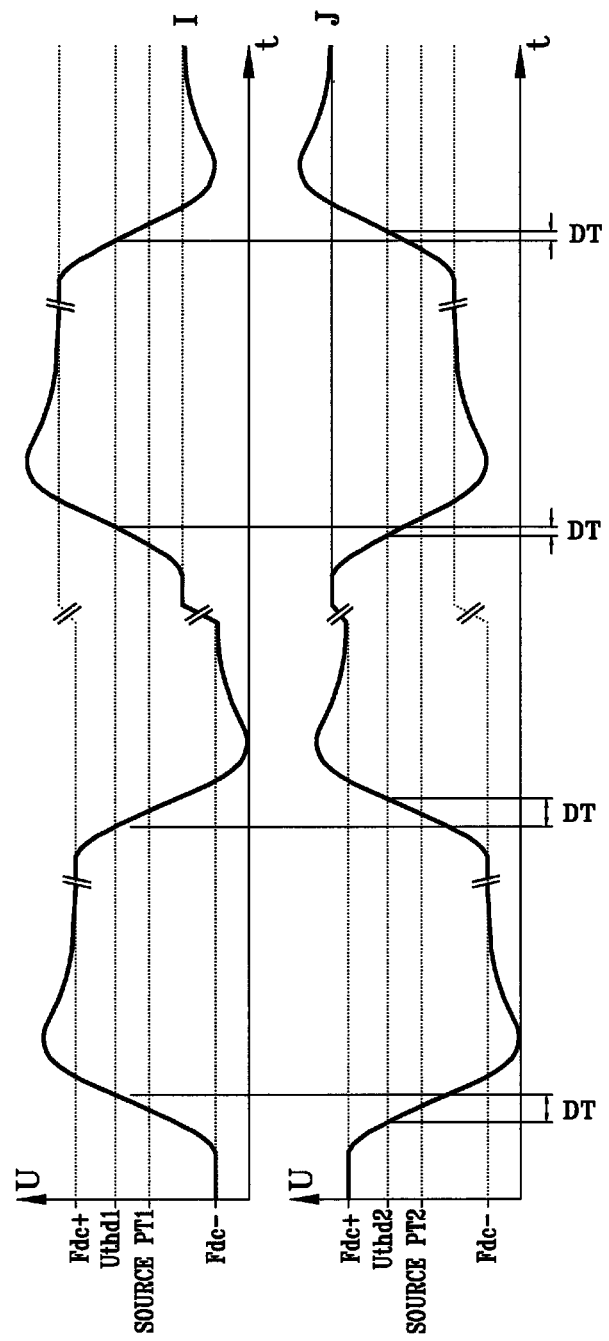
FIG. 19 shows signal diagrams for illustrating the operation of a possible embodiment of the driving circuit according to the present invention.

The signal diagrams of FIG. 18 illustrate two output voltage states FDC− and FDC+ according to the PWM ratio value (PWM duty 1, PWM duty 2) of the temperature dependent driving signal M in case a simultaneous auxiliary voltage N change. The change of the voltage FDC+ and FDC− amplitude affects the duration of the dead time DT shown in FIG. 19. The driving signals I, J of the power switch devices PT1 and PT2 switch from the positive voltage FDC+ to the negative voltage FDC− as illustrated in FIG. 19.

Figure 20:
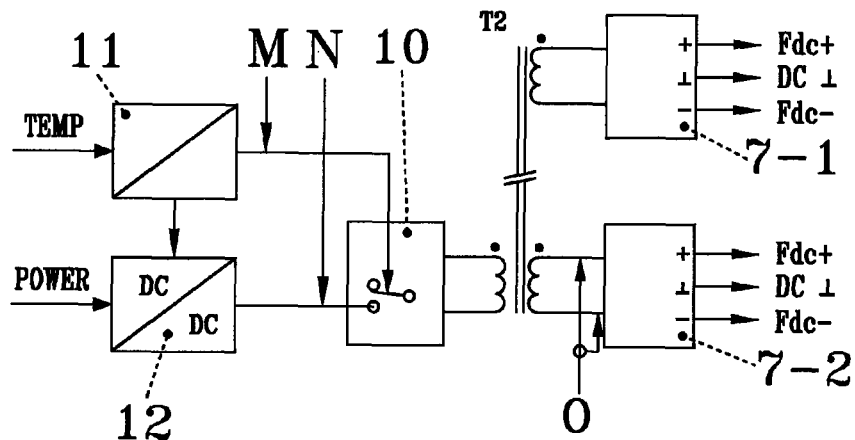
FIG. 20 shows a diagram for illustrating a possible implementation of a temperature control unit as employed in a possible embodiment of a driving circuit according to the present invention.
Figure 21:
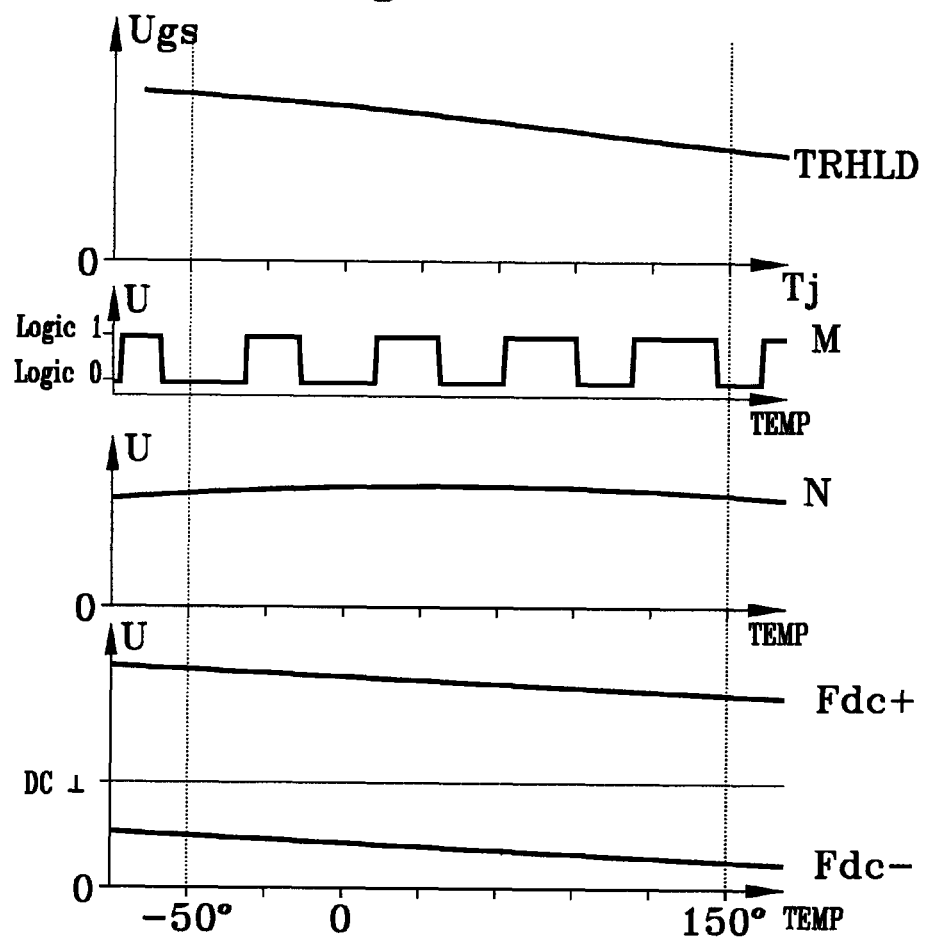
FIG. 21 shows diagrams for illustrating the operation of the temperature control unit as shown in FIG. 20.
Figure 22:
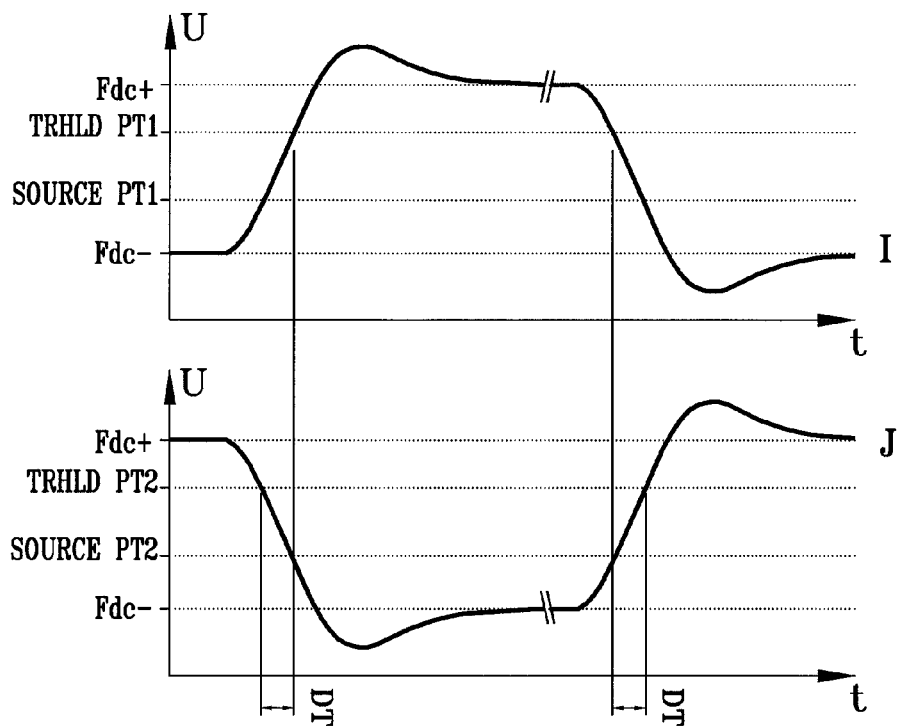
FIGS. 22, 23 show signal diagrams for illustrating the operation of a possible embodiment of a driving circuit according to the present invention.
Figure 23:
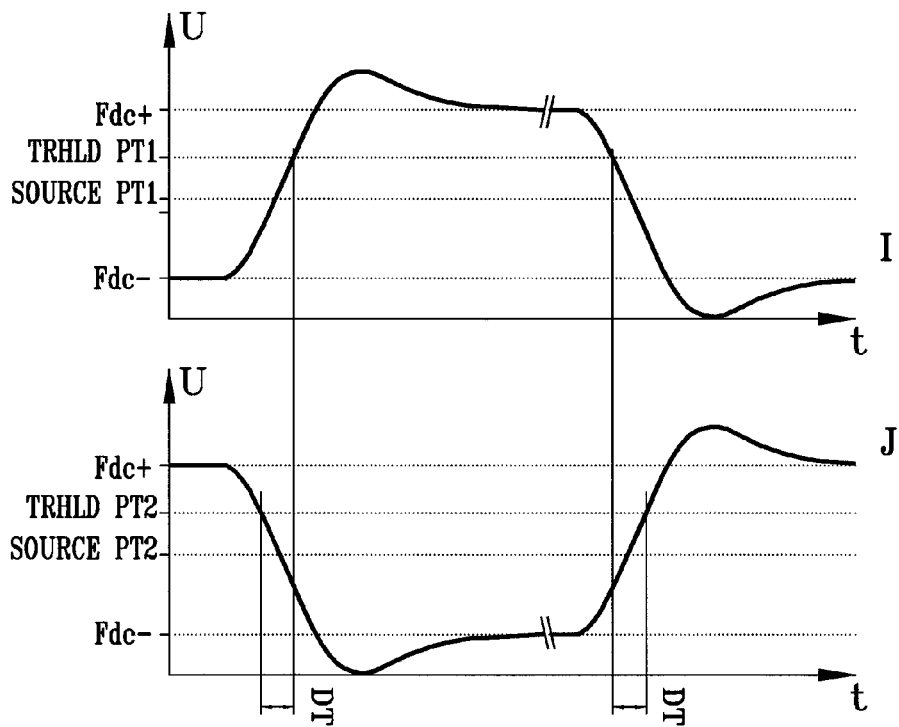

The positive and negative trigger signal circuit supply voltages FDC+, FDC− can be asymmetrical in relation to a loading reference potential (DC, GND) formed by SOURCE PT1, SOURCE PT2 having an impact on the dead time DT. In this way it is possible to compensate for example temperature dependent switching properties of the power switch devices PT. The temperature dependent driving signal M applied to the circuit shown in FIG. 17 is generated by a temperature control unit 11 as shown in FIG. 20 depending on a temperature T of the half bridge connected power switches PT1, PT2. FIG. 20 shows an embodiment where the power supply circuit 7 is provided with an automatic dead time (DT) control circuit. On a switching voltage TRHLD depending on the temperature TJ of the power switch device PT the temperature control unit generates a driving signal M PWM ratio and an amplitude of the auxiliary voltage N in such a way that the amplitude of the voltages FDC+ and FDC− ensures a desired dead time DT. A typical temperature compensation or correction is illustrated in FIG. 21. FIG. 22 illustrates driving signals I, J for power switch devices PT1, PT2 for a predetermined temperature T, e.g. −50° C. FIG. 23 shows a similar diagram of a temperature of T=150° C. As can be seen from FIG. 22, 23 the dead time DT remains constant even for a temperature change of 200 K.

In the embodiment shown in FIG. 24 the driving circuit 1 according to the present invention comprises two pairs of half bridge connected power MOSFETS PT1, PT2 driven with one input pulse width modulated signal A in a bridge circuit.

The driving circuit 1 according to the present invention performs switching with significantly lower switching losses than conventional circuits. A galvanic separation is provided by a transformer T1. Furthermore, a mirror symmetry of the trigger signals E, F automatically adjusts or sets on the on-switching moment with respect to the current load and the working voltages of the power switch devices PT1, PT2. In an embodiment where the driving circuit 1 comprises half bridge connected power switch devices PT1, PT2 the symmetry of the triggering signals E, F allows for an almost zero dead time DT in the range of less than 10 ns. The driving circuit 1 according to the present invention does not require a complex circuitry to adjust the dead time DT between the switching of the power switch devices PT1, PT2 Further by the energy buffer components 6-1, 6-2 such as external coils. the switching of the power switch devices PT1, PT2 is accelerated. The energy buffer component 6 comprises an inductivity L which is adapted to supply a maximum current Imax at the time when the threshold voltage UTh of the respective power switch device PT is reached.

FIG. 26 shows an embodiment comprising serial connected power switch devices PT1a to PT1n and PT2a to PT2n.

Figure 27:
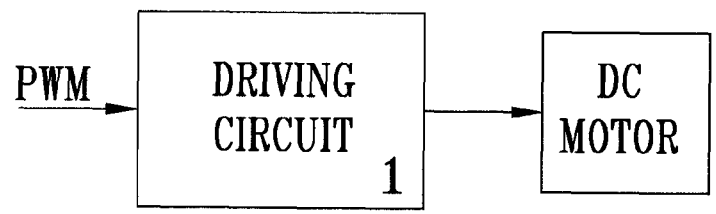
FIGS. 27-30 show possible applications for a driving circuit according to the present invention.

The driving circuit 1 according to the present invention can be used in a wide range of applications. In a possible embodiment the driving circuit 1 can be used for driving a DC motor as illustrated in FIG. 27. The load is formed in this application by the windings of the motor.

Figure 28:
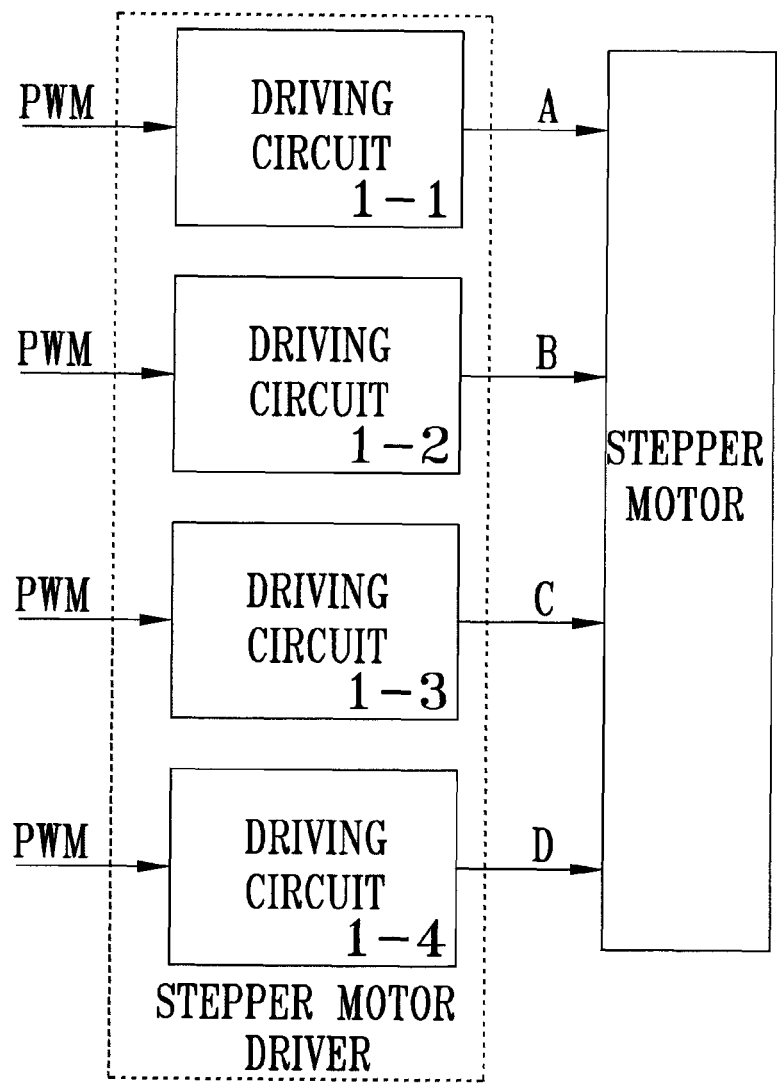

Furthermore, the driving circuit 1 according to the present invention can be used within a stepper motor driver as shown in FIG. 28. In the shown implementation the stepper motor drive comprises four driving circuits 1-1, 1-2, 1-3, 1-4 according to the present invention connected to a stepper motor as shown in FIG. 28.

Figure 29:
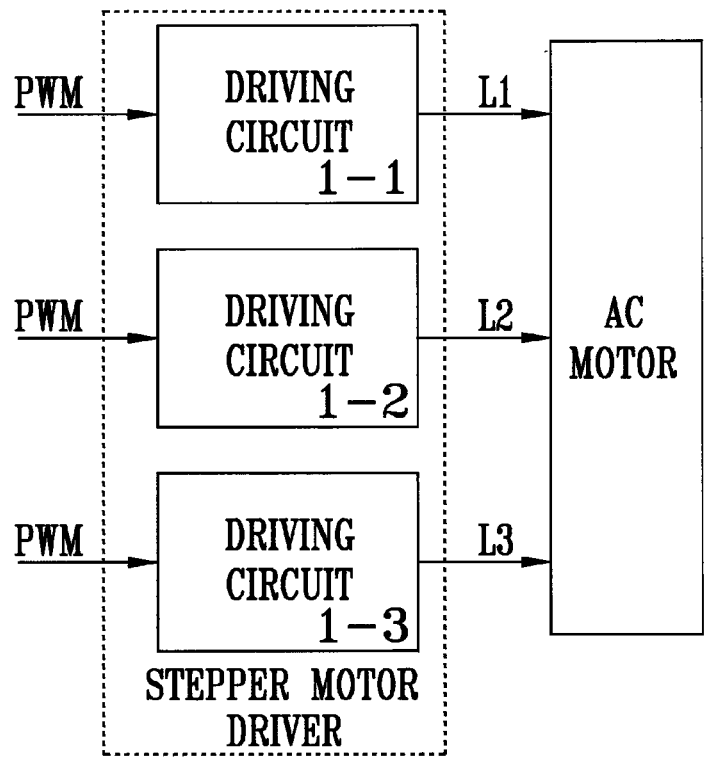

Further, a driving circuit 1 according to the present invention can be used for an AC motor driver as shown in FIG. 29. In the shown embodiment the AC motor driver comprises three driving circuits 1-1, 1-2, 1-3 driving an AC motor by controlling signal phases L1, L2, L3 as shown in FIG. 29.

Figure 30:
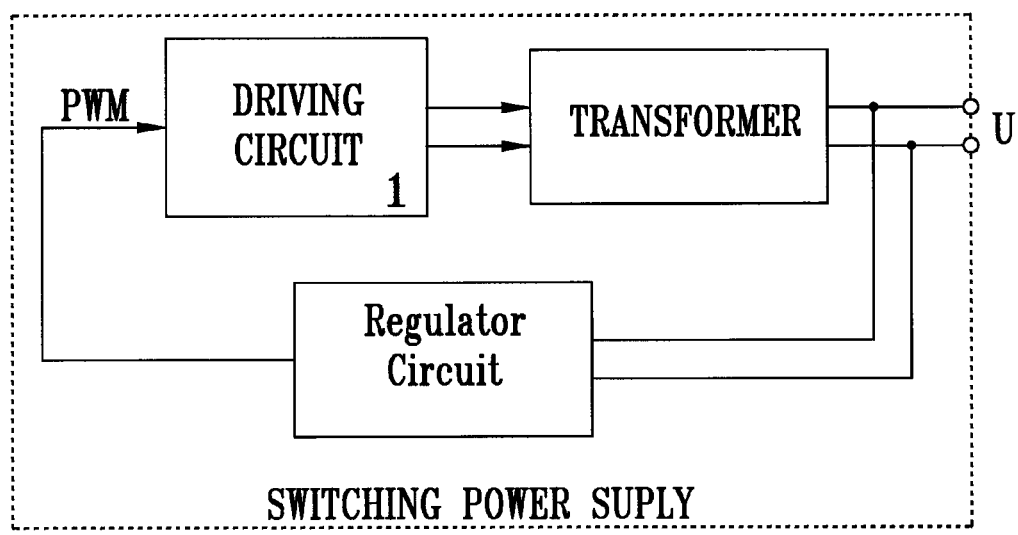

Moreover, the driving circuit 1 according to the present invention can be used in a switching power supply as shown in the implementation of FIG. 30. The switching power supply comprises a regulator circuit applying a pulse width modulated PWM signal to the driving circuit 1 being connected to a transformer whose output voltage is fed back to the regulator circuit. The switching power supply shown in FIG. 30 has a higher efficiency than conventional switching power supplies.

Further possible applications for a driving circuit 1 according to the present invention can be for example class D amplifier or an amplifier for amplification of an audio or video signal.

Further, the driving circuit 1 can be used in dimmers for light emitting diodes LEDs or for electrical heating systems.

Furthermore, the driving circuit 1 according to the present invention can be used in converters in particular in DC/DC converters. The driving circuit 1 can be used for signals with a high switching frequency, for example 1 MMz.

In a possible implementation of the driving circuit 1 according to the present invention the power switch devices PT1, PT2 can be formed by MOSFETs. In a possible implementation the power MOSFETs can be formed by silicon carbide MOSFETs (SIC MOSFETs). In a still further embodiment the power switch devices can be formed by JFETs. In possible embodiments of the driving circuit according to the present invention the switching frequency employed by the driving circuit 1 is more than 400 kHz.

Figure 31:
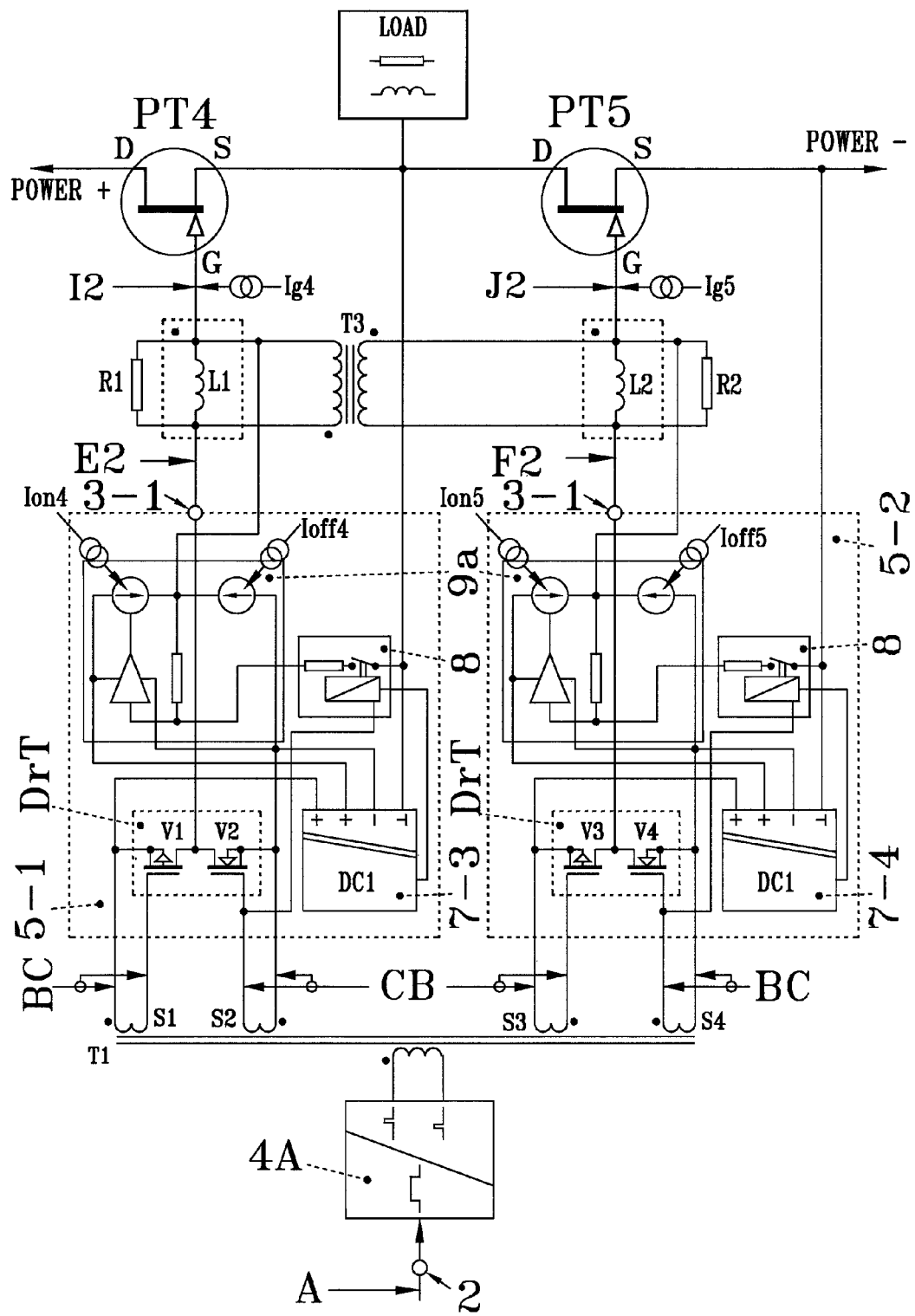
FIG. 31, 32 show a further possible embodiment of a driving circuit according to the present invention.

FIG. 31 shows a block diagram of a possible embodiment of the driving circuit 1 according to the present invention wherein the power switch devices PT are formed by normally off JFET transistors. FIG. 31 shows power switch devices PT1, PT2 formed by normally off JFET transistors. Unlike a MOSFET transistor a normally off JFET transistor has a gate G voltage limiting diode positioned between its gate and a source terminal limiting the gate voltage to a value of e.g. between 2.5 V and 3.5 V. The gate source voltage capacity does not ensure a constant gate voltage for turning the normally off JFET on or off after the driving transistors (V1 to V4) as shown on FIG. 31 have stopped conducting. Therefore, a bistable circuit 9A is provided in the embodiment as shown in FIG. 31 for driving normally off JFET transistors PT1, PT2. The bistable circuit 9A comprises in the shown implementation of FIG. 31 a comparator and two current generators.

In a possible implementation of the power supply circuit 7 as shown in the embodiments of FIG. 31, 32 the power supply circuit 7 is represented by power supply circuits 7-3 and 7-4 each having one negative Fdc− and positive power sources Fdc+ and Fdc1+. The driving transistors shown V1, V3 shown in the embodiment of FIG. 31, 32 are powered with the voltage Fdc+ which is higher than the voltage Fdc1+. Therefore, the voltages E2 and F2 are higher during the time when driving transistors V1 and V3 are conducting than when only current generators Ion1 and Ion5 are on.

The power switch devices PT1, PT2 on state maintenance current Idc_on which is ensured by the current generators Ion1, Ion2 as shown in FIG. 31. In a possible embodiment the value of the on state maintenance current Idc_on of the power switches PT1, PT2 can be between 100 mA and 500 mA. The comparator of the bistable circuit 9A turns the current generator Ion1 on for the time of a positive voltage I2 between time markings u and u' shown in FIGS. 33 and 34 and turns the current generator Ion2 on for the time of a negative voltage I2 between time markings v' and v shown in FIG. 34. The two current generators Ion1, Ion2 shown in FIG. 31 are connected to the power supply circuit 7 voltage Fdc+. The Fdc+ voltage value is defined with respect to the current generator Ion1 or Ion2 to be able to supply on state maintenance current Idc_on being high enough in all possible working conditions of the power switch devices PT1, PT2 with minimum possible losses.

Figure 33:
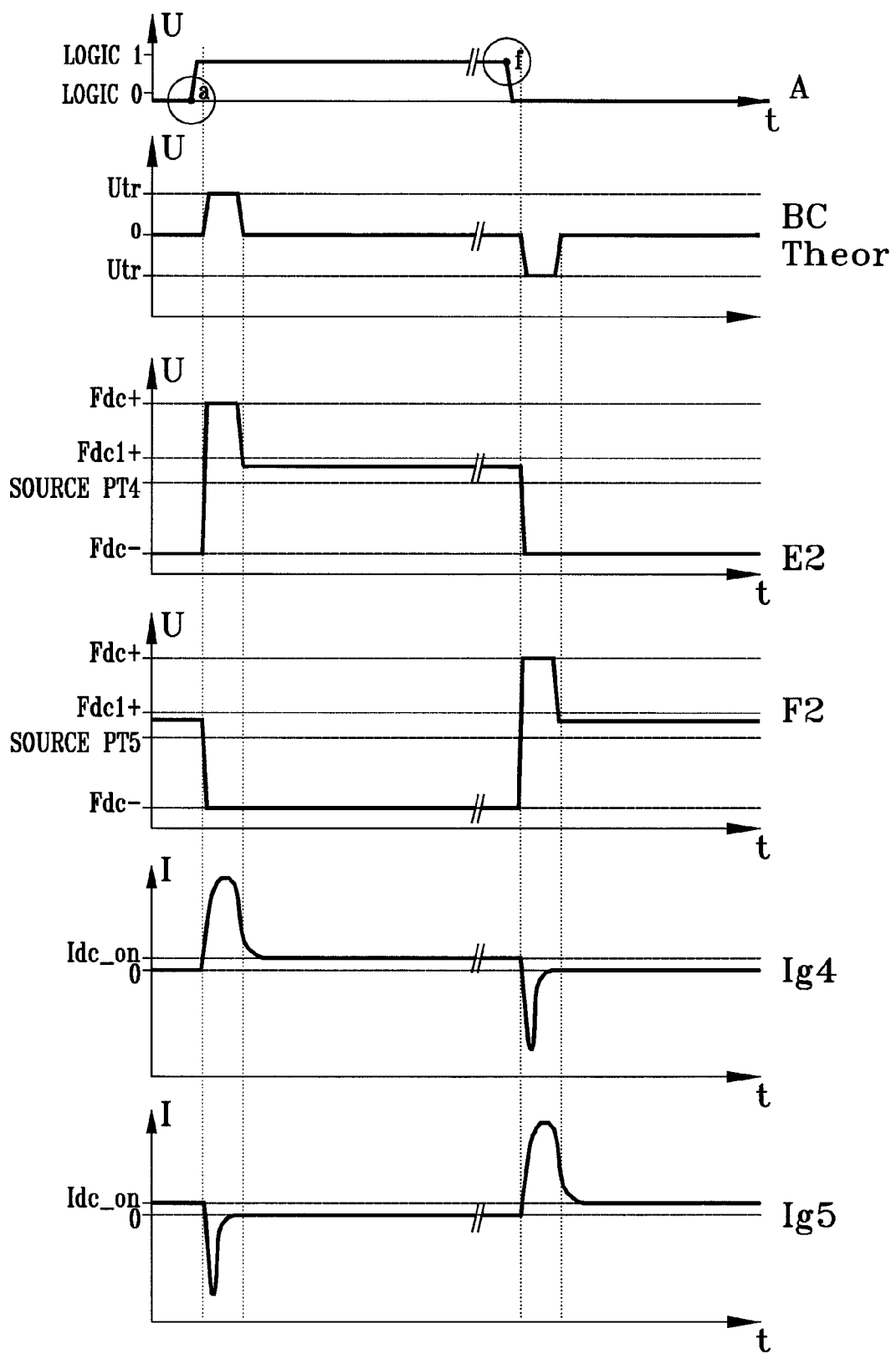
FIG. 33, 34 show signal diagrams for illustrating the functionality of the embodiment of FIGS. 31, 32.
Figure 34:
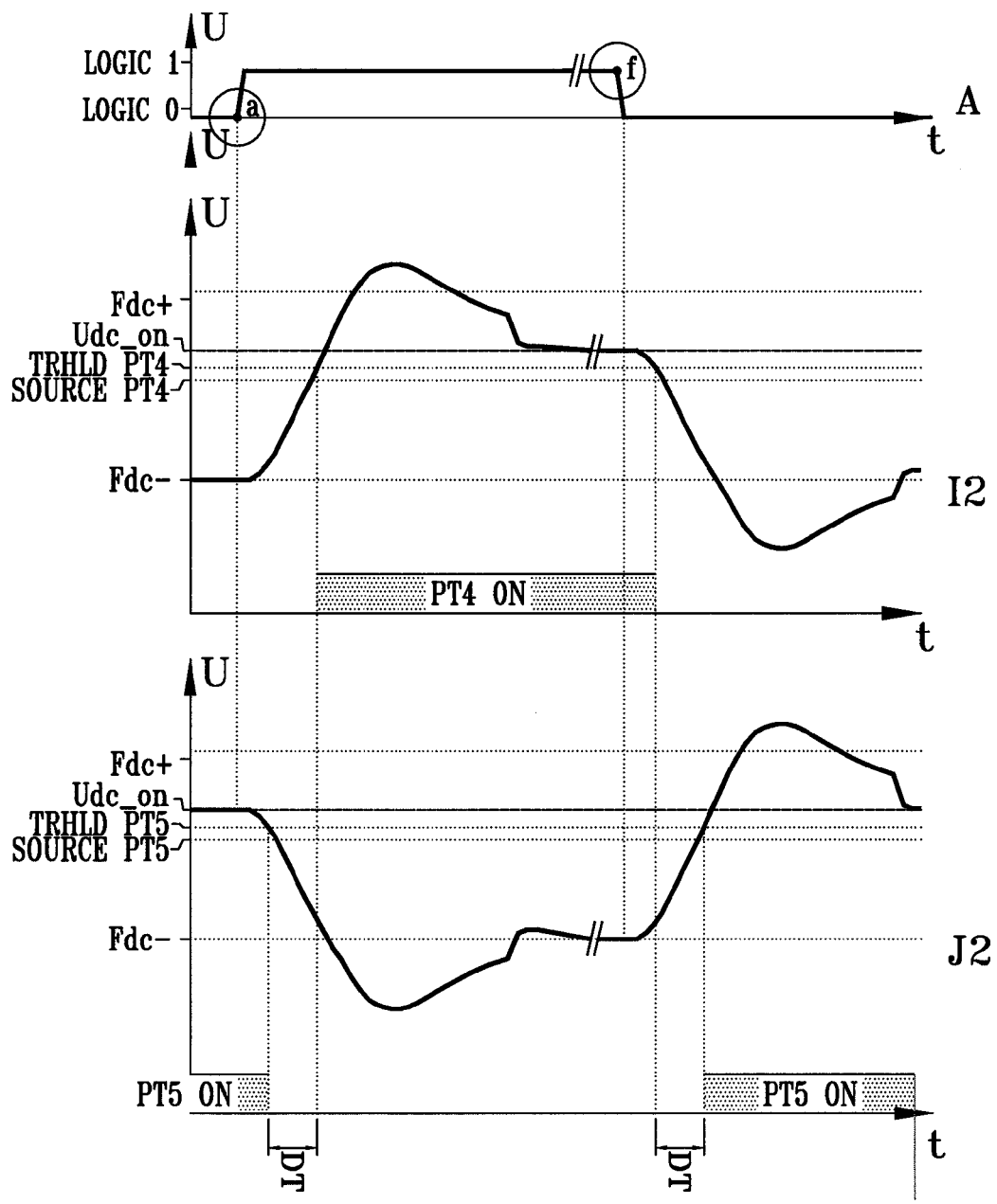

The current generators Ioff1, Ioff2 shown in FIG. 31 provide a current necessary to ensure an off state maintenance current for the power switch devices PT1, PT2. In a possible embodiment the current generators Ioff1, Ioff2 can continuously generate a current with an amplitude ranging from 1 mA to 3 mA. The current generators Ioff1, Ioff2 represent low losses and can therefore be run continuously as demonstrated on FIG. 31. The current generators Ioff1, Ioff2 can also be controlled by the comparator of the bistable circuit 9A. The comparator of the bistable circuit 9A turns the current generator Ioff1 on for the time between time markings u' and u as shown in FIGS. 33 and 34. The comparator of the bistable circuit 9A turns the current generator Ioff2 on for the time between time markings v and v' as shown in FIG. 33.

In a possible implementation a stop detector 8 is provided as shown in FIG. 31. In the embodiment shown in FIG. 31 the stop detector 8 is connected to the comparator input and not to the signal lines E2, F2 as also shown in FIG. 31.

In a possible embodiment as shown in FIG. 31 an additional capping diode D10, a serial diode D11 and an additional secondary side winding Ws1 on coupling transformer T3b allow the circuit to return a part of the excess energy stored in the energy buffer component 6-1 back to the positive power source Fdc+ of the power supply circuit 7-3.

In FIG. 31 capping diode D12 has the same function as capping diode D10 and serial diode D13 has the same function as serial diode D11.

As shown in FIG. 31 after the switch off of the first driving transistor V1 at the time marking x the current IL1 flows from inductivity L1 through the primary windings Wp1, Wp2 of the coupling transformer T3b via capping diode D10 back to the positive power source Fdc+ of the power supply unit 7-3 and returns back from ground power source ⊥ of the power supply circuit 7-3 back to the inductivity L1. The serial diode D11 prevents an energy transfer from the energy buffer component 6-1 to the negative power source Fdc− of the power supply circuit 7-3. In the embodiment of FIG. 31 the serial diode D11 allows the PT2 turn off voltage oversway.

The switched on first driving transistor V1 allows the energy to be transferred from the positive source Fdc+ of the power supply circuit 7-3 through the energy buffer component 6-1 to the gate source capacitance of the power switch device PT1. The energy being stored in the energy buffer component 6-1 before the voltage I2 having reached the threshold voltage value accelerates the switching speed of the power switch device PT1 after the threshold voltage of that power switch device PT1 has been reached. In contrast to other power switch devices the internal gate source diode of a JFET limits the gate source voltage to approximately 3 V. The gate source diode of the power switch device PT1 additionally increases the energy in the energy buffer component 6-1 after the threshold voltage Uthd1 has been reached.

In a possible embodiment as shown in FIG. 31 an additional capping diode D12, a serial diode D13 and an additional secondary side winding Ws1 on coupling transformer T3b allow the circuit to return a part of the excess energy stored in the energy buffer component 6-1 back to the positive power source Fdc+ of the power supply circuit 7-3.

As shown in FIG. 31 after the switch off of the first driving transistor V2 at the time marking x' the current IL2 flows from the inductivity L2 through the secondary windings Ws1, Ws2 of the coupling transformer T3b via the capping diode D12 back to the positive power source Fdc+ of the power supply unit 7-4 and returns back from ground power source ⊥ of the power supply circuit 7-4 back to inductivity L2. The serial diode D13 prevents the energy transfer from the energy buffer component 6-2 to the negative power source Fdc− of the power supply circuit 7-4. In the embodiment of FIG. 31 the serial diode D13 allows the PT1 turn off voltage oversway.

The switched on first driving transistor V3 allows the energy to be transferred from the positive source Fdc+ of the power supply circuit 7-4 through the energy buffer component 6-2 to the gate source capacitance of the power switch device PT2. The energy being stored in the energy buffer component 6-2 before the voltage J2 has reached the threshold voltage value accelerates the switching speed of the power switch device PT2 after the threshold voltage of that power switch device has been reached. In contrast to other power switch devices the internal gate source diode of a JFET limits the gate source voltage to approximately 3 V. The gate source diode of power switch device PT2 additionally increases the energy in the energy buffer component 6-2 after the threshold voltage Uthd2 has been reached.

The coupling transformer T3b formed by windings Wp1, Ws1 having a coupling ratio of −1 in embodiment of FIG. 31 has additional windings Wadd. In the embodiment of FIG. 31 the additional windings Wadd are formed by windings Wp2 and Ws2. In the embodiment of FIG. 31 a primary side winding coupling ratio $$\frac{W_{p1}}{W_{p2}}$$

and a secondary side winding coupling ratio $$\frac{W_{s1}}{W_{s2}}$$

of the coupling transformer T3b are equal to winding coupling ratio Wcr. In a possible embodiment the winding coupling ratio Wcr is negative and the absolute value of this winding coupling ratio Wcr can be equal or greater than $((Fdc+)+(|Fdc-|))/((Fdc+))$. The primary side and secondary side winding ratio of the coupling transformer T3b define the oversway value at the turn off of the power switches PT1, PT2.

In a possible embodiment where only one of power switch devices PT1 or PT2 is driven, the coupling transformer T3b has no windings Ws1 and Ws2, and consists of windings Wp1 and Wp2 with a negative winding ratio whereas the absolute value of winding coupling ratio Wcr can be equal or greater than $((Fdc+)+(|Fdc-|))/((Fdc+))$.

Figure 32:
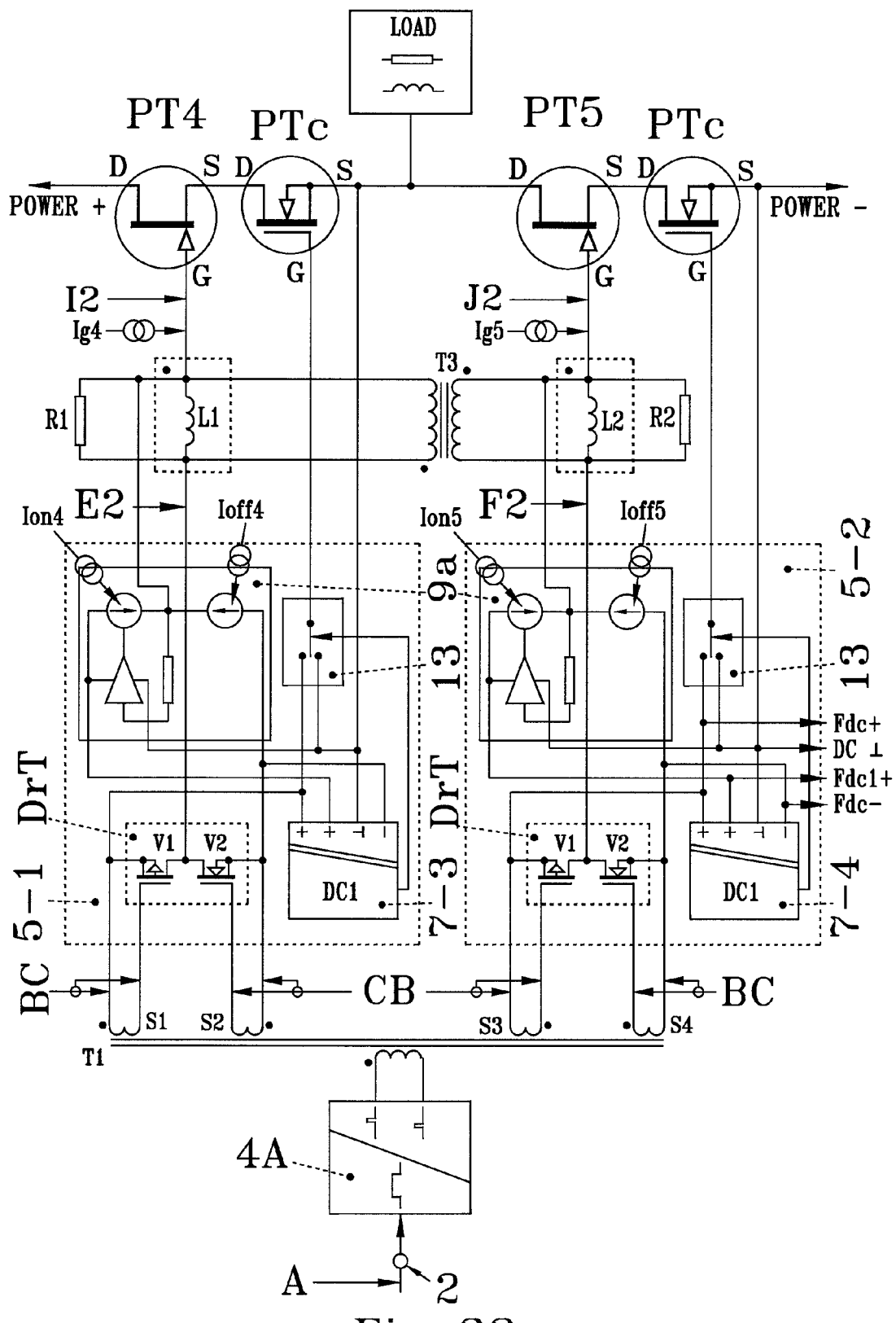

FIG. 32 shows a further possible embodiment of a driving circuit 1 according to the present invention. A normally on JFET conducts in case of a voltage of 0 V between their gate and source. Therefore, a low voltage MOSFET PTc as shown on FIG. 32 is connected in a cascade and can be added to the normally on JFETs forming the power switch devices PT1, PT2. Such circuitry ensures an off state of the power switch devices PT1, PT2 in case of a turned off power supply circuits 7-3, 7-4 to provide a negative voltage at the gate of the power switch devices PT1, PT2. A switch 13 shown in the embodiment of FIG. 32 turns the low voltage MOSFET (PTc) on during the power supply circuits 7-3, 7-4 is present in nominal value and the output voltages of the power supply circuits 7-3, 7-4 are stable. The normal operation of the triggering transistor stages 5-1, 5-2 shown in FIG. 32 is possible. The current generators Ioff1, Ioff2 establish a negative gate voltage at the power switches PT1, PT2 as soon as the voltage Fdc− appears. The lower threshold voltage of a normally on JFET device ensures on state of the normally on JFET at lower gate to source voltage values than for a normally off JFET. In a possible embodiment the value of the on state maintenance current Idc_on of the normally off JFET power switches could be between 5 mA and 100 mA. The operation of the bistable circuit 9A in the embodiment of FIG. 32 is similar to the operation of the bistable circuit 9A shown in the embodiment of FIG. 31.

In a possible embodiment a part of the excess energy stored in the energy buffer component 6-1, 6-2 in FIG. 32 can be returned back to the positive power source Fdc+ of the power supply circuit 7-3, 7-4 as shown in FIG. 31.

In this way a part of the energy for turning on or off the power switch device PT remaining on the energy buffer component 6 after the switching has been executed is returned to the power supply circuit 7.

Further, energy used to control the power switch device PT is saved. Moreover the clamping protects the power switch device PT against destruction by an excessive voltage oversway and makes the voltage over shot possible to increase the switching speed. Further by saving energy used to control the power switch device PT heating is diminished allowing even higher switching frequencies.

FIG. 33, 34 demonstrate the current and voltage signal diagrams during switch on and switch off of the power FET PT1, PT2 in FIG. 31, 32. The first signal diagram shown in FIG. 33 demonstrates the input logical signal A applied to the input terminal 2 of the driving circuit 1. The second curve of FIG. 33 illustrates the theoretical time course of a secondary voltage BC of the trigger transformer T1 shown in FIG. 31 with marked set-up time Tset. The third signal illustrated in FIG. 33 shows the triggering signal E2 with marked positive (Fdc+) and negative (Fdc−) power supply circuit 7-3 voltage values. The fourth signal diagram in FIG. 33 illustrates the triggering signal F2 with marked positive (Fdc+) and negative (Fdc−) power supply circuit 7-4 voltage values. The fifth curve of FIG. 33 shows a current Ig1 flowing into the gate G of the power switch device PT1 wherein the on state maintenance current Idc on is marked-up. The sixth curve of FIG. 33 demonstrates the current I through the driving transistor V1. The seventh curve in FIG. 33 shows the current I through capping diode D10 and the switching procedure time markers.

FIG. 34 presents a logical continuation of the signal diagrams shown on FIG. 33. The first curve of FIG. 34 demonstrates the current I through the driving transistor V2.

The second curve of FIG. 34 shows a current Ig2 flowing into the gate G of the power switch device PT2 wherein the on state maintenance current Idc on is marked-up.

The third curve of FIG. 34 demonstrates the current I through the driving transistor V3. The fourth curve in FIG. 34 shows the current I through capping diode D12.

The fifth curve of FIG. 34 demonstrates the current I through the driving transistor V4.

The sixth signal line of the FIG. 34 illustrates a shaped trigger signal I2 applied to the gate G of the power switch device PT1 where the time markers u, u', on time (PT1 ON) of the power switch PT1 and dead time (DT) are marked-up.

The seventh signal line of the FIG. 34 illustrates a shaped trigger signal J2 applied to the gate G of the power switch device PT2 where the time markers, on time (PT2 ON) of the power switch PT2 and dead time (DT) are marked-up.

The driving circuit 1 according to the present invention can comprise in a possible embodiment at least one pair of half bridge connected power switch devices PT1, PT2 as shown for example in FIG. 2. The half bridge connected power switch devices can be either not complementary or complementary. FIG. 9 shows an embodiment with complementary power switch devices PT1, PT3. The driving circuit 1 according to the present invention can be used for driving even more pairs of power switch devices PT1, PT2 as shown in the embodiments of FIGS. 24, 25, 26. In a possible embodiment the driving circuit 1 according to the present invention can be used for driving a single power switch device PT formed for example by a power MOSFET.

Within the driving circuit 1 according to the present invention for each power switch device PT driven by the driving circuit 1 an energy buffer component 6 such as a coil L is provided. Accordingly, the present invention provides a driving circuit 1 for at least one voltage controlled power switch device PT having an energy buffer component 6 being connected to the control electrode of the power switch device PT wherein the energy buffer component 6 is adapted to store signal energy of an on-voltage trigger signal until a threshold voltage UTH of the power switch device PT is reached and is further adapted to release the stored signal energy to the control electrode of the power switch device PT when the threshold voltage of said power switch device PT has been reached. This energy buffer component 6 comprises in a preferred embodiment an inductivity L which is adapted to supply a maximum current Imax at the time when the threshold voltage UTH of the power switch device PT is reached. In a possible embodiment a damping resistor R can be connected in parallel to the inductivity L and is adapted to adjust overshot of a signal sway of the trigger signal.

The invention further provides a signal amplifier for amplification of a pulse width modulated PWM signal comprising at least one driving circuit 1 according to the present invention having a driver signal generating circuit 4, a trigger signal generating circuit 5 and an energy buffer component 6 as shown in FIG. 1A.

The invention further provides a driving circuit for at least one pair of half bridge connected power switches PT1, PT2 as shown for example in the embodiment of FIG. 2. This driving circuit 1 comprises a trigger signal generating circuit 5 configured to generate complementary rectangular trigger signals E, F wherein the signal shape of one of the generated trigger signals E, F corresponds to the signal shape of the applied pulse width modulated PWM signal A applied to the input 2 of the driving circuit 1. This driving circuit 1 further comprises a shaping circuit configured to shape the rectangular trigger signals E, F into corresponding ramping drive signals I, J being applied to the control electrodes of the half bridge connected power switches PT1, PT2 such that the power switches PT1, PT2 are switched consecutively with a minimum dead time DT when the switching threshold voltage UTH of the respective power switch device PT1, PT2 is reached by the corresponding ramping drive signals I, J.

In a possible embodiment of the driving circuit 1 according to the present invention the driver signal generating circuit 4 and the trigger signal generating circuit 5 can be integrated in one circuit unit.

In a possible embodiment a separate energy buffer component unit comprising at least one energy buffer component 6 is provided and can be connected between the output of the trigger signal generating circuit 5 and the control electrodes of the driven power switch devices PT. In a possible embodiment the energy storage capacity of the energy buffer component 6 such as the external coil L1, L2 can be adapted. In a possible embodiment the total inductivity L comprising the signal line inductivity, an internal connection inductivity, an inductivity of the external coil as well as the internal connection inductivity of the driving transistor can be set in a range between 5 and 100 nH. In a possible embodiment the resistance of the damping resistor being connected in parallel to the inductivity of the external coil L can be also adapted to avoid an oscillation of the signal. In the driving circuit 1 according to the present invention the dead time DT between switching of two half bridge connected power switch devices consecutively is achieved by making use of physical effects and not by providing a specific complex logic circuit for adjusting the dead times DT. Accordingly, the complexity of the driving circuit 1 providing a minimum dead time DT is still low and the driving circuit 1 is very robust against environmental influences. In a possible embodiment the driving circuit 1 further comprises a circuit for temperature drift compensation. The driving circuit 1 according to the present invention can be used for driving any kind of voltage controlled power switch devices in particular power MOSFETs, JFETs and IGBTs. The power MOSFET can be e.g. implemented by a Si-, SiC- or GaN power MOSEFET. These power switch devices can be used to power any kind of loads such as windings of a motor directly or via a filter such as an LC filter. The power width modulated PWM or power density modulation PDM signal A applied to the driving circuit 1 according to the present invention can be generated by any kind of signal source.

The invention claimed is:

1. A driving circuit for at least one voltage controlled power switch device, comprising:
   a driver signal generating circuit configured to receive a pulsed signal and to generate a logical pulse signal as:
   a first driving signal in response to a rising edge of said pulsed signal
   a second driving signal in response to a falling edge of said pulsed signal;
   at least one trigger signal generating circuit, each trigger signal generating circuit configured to generate a trigger signal for said at least one voltage controlled power switch device, said at least one trigger signal generating circuit comprising:
      a first driving transistor configured to be switched on by the first driving signal such that an on-voltage of the trigger signal is supplied to a control electrode of said at least one voltage controlled power switch device, and
      a second driving transistor configured to be switched on by the second driving signal such that an off-voltage of the trigger signal is supplied to the control electrode of said at least one voltage controlled power switch device; and at least one energy buffer component coupled between the at least one trigger signal generating circuit and the control electrode of said at least one voltage controlled power switch device,
   wherein each of said at least one energy buffer component is adapted to:
   store signal energy of the trigger signal until a threshold voltage of said at least one voltage controlled power switch device is reached, and
   to release the stored signal energy to said control electrode of said at least one voltage controlled power switch device when said threshold voltage of said power switch device has been reached,
   wherein the signal energy stored in said at least one energy buffer component provides a voltage oversway on the control electrode of said at least one voltage controlled power switch device which accelerates switching transitions between on and off states of said at least one voltage controlled power switch device, wherein the driver signal generating circuit is adapted to add maintenance pulses to said first driving signal in case that said pulsed signal is stable in an active state and to add maintenance pulses to said second driving signal in case that said pulsed signal is stable in an non-active state, and wherein first driving signal and second driving signal are not active at the same time.

2. The driving circuit according to claim 1, wherein said energy buffer component comprises an inductivity which is adapted to supply a maximum current to the control electrode of said at least one voltage controlled power switch device at a time when a gate source voltage of said at least one voltage controlled power switch device reaches the threshold voltage, and wherein said maximum current to the control electrode of said at least one voltage controlled power switch device is high enough to perform said voltage oversway on the control electrode of said power switch device after the time the gate source voltage of said at least one voltage controlled power switch device exceeds the threshold voltage.

3. The driving circuit according to claim 2, wherein said inductivity comprises at least one of:
   a signal line inductivity of a signal line connecting the trigger signal generating circuit with the control electrode of said power switch device,
   an internal connection inductivity of the power switch device,
   an inductivity of an external coil connected between the trigger signal generating circuit and the control electrode of said power switch device and
   an internal connection inductivity of the driving transistors.

4. The driving circuit according to claim 2, wherein the at least one trigger signal generating circuit is connected to a corresponding at least one DC power supply circuit providing at least one positive power source defining an amplitude of the on-voltage of the said trigger signal and at least one negative power source which defines an amplitude of the off-voltage of the said trigger signal with respect to a source voltage level of said at least one voltage controlled power switch device.

5. The driving circuit according to claim 2, wherein a damping resistor is connected in parallel to the inductivity and is adapted to damp a signal sway of the trigger signal.

6. The driving circuit according to claim 1, wherein an autotransformer with a positive coupling ratio less than 1 is connected in parallel to said energy buffer component,
   wherein the autotransformer is adapted to return at least part of a driving energy for driving the control electrode of said voltage controlled power switch devices back to at least one DC power supply circuit via capping diodes, and
   wherein a coupling ratio of said autotransformer defines a maximum voltage oversway value.

7. The driving circuit according to claim 4, wherein the DC power supply circuit comprises two half wave rectifiers with smoothing capacitors connected to a secondary coil of a power supply transformer said power supply transformer comprising a primary winding connected to a power supply switching circuit controlled by a temperature dependent driving signal being generated by a temperature control unit depending on a temperature of said power switch device,
   wherein one of said two half wave rectifiers generates positive output voltage and one of said two half wave rectifiers generates negative output voltage such that a temperature change causes a change in an amplitude of said positive output voltage and an amplitude of said negative output voltage, such that an automatic dead time control could be provided.

8. The driving circuit according to claim 1, further comprising a bistable circuit, wherein said bistable circuit is adapted to hold the on-voltage of the control electrode of said at least one voltage controlled power switch device after the first driver signal has switched off said first driving transistor, and to hold the off-voltage of the control electrode of said at least one voltage controlled power switch device after the second driver signal has switched off said second driving transistor and
   wherein said bistable circuit is connected to said energy buffer component.

9. The driving circuit according to claim 1, wherein said trigger signal generating circuit comprises a shut-down circuit adapted to switch off the power switch device.

10. The driving circuit according to claim 1, wherein said driving circuit is connected to at least one half bridge connection comprising a first and a second power switch device,
    wherein each first power switch device of said half bridge connections is configured by several power switch devices each being triggered by said trigger signal generating circuit to provide first equal rectangular trigger signals,
    wherein each second power switch device of said half bridge connections is configured by several power switch devices each being triggered by said trigger signal generating circuit to provide second equal rectangular trigger signals which are complementary to said first rectangular trigger signals,
    wherein the rectangular trigger signals are shaped via corresponding energy buffer components into corresponding ramping drive signals applied to the control electrodes of the half bridge connected power switch devices which are switched consecutively when a threshold voltage of the respective power switch device is reached by the respective ramping drive signal causing a time when both power switch devices are off,
    wherein the time of both power switch devices being turned off represents a dead time which can be less than 10 ns.

11. The driving circuit according to claim 1, further comprising:
    a trigger transformer providing a galvanic isolation between the driver signal generating circuit and said at least one trigger signal generating circuit
    wherein said trigger transformer is adapted to receive said first driving signal and said second driving signal on a primary side of said trigger transformer; and
    wherein said trigger transformer has secondary windings with contrary winding orientation connected to at least one of said trigger signal generating circuits to provide rectangular trigger signals.

12. The driving circuit according to claim 1,
    wherein a coupling transformer is provided with a negative coupling ratio of one between its primary and secondary windings,
    wherein a primary winding or plurality of primary windings of said coupling transformer are connected in parallel to a first energy buffer components being connected to the control electrode of a first power switch device and,
    wherein a secondary winding or a plurality of secondary windings of said coupling transformer are connected in parallel to a second energy buffer components being connected to the control electrode of a second power switch device.

13. The driving circuit according to claim 12, wherein said coupling transformer has at least one tap on at least one of its primary or secondary windings to form an autotransformer function,
wherein said tap forms a positive coupling ratio less than 1, and being connected in parallel to a plurality of energy buffer components,
wherein said coupling transformer with said tap is adapted to return at least part of a driving energy for driving the control electrode of said power switch devices back to a plurality of DC-power supply circuits via said capping diodes, wherein a positive coupling ratio less than 1 defines a maximum voltage oversway value.

14. The driving circuit according to claim 12, wherein said coupling transformer has at least one additional primary winding and at least one additional secondary winding to form the coupling transformer with a negative winding coupling ratio smaller than ½,
wherein the additional primary windings are adapted to return at least a part of a driving energy of the first power switch device back to the positive power source of a DC power supply circuit via a first capping diode,
wherein a first serial diode prevents a driving energy of the first power switch device to return to the negative power source of a DC power supply circuit; and
wherein the additional secondary windings are adapted to return at least a part of a driving energy of the second power switch device back to a positive power source of a DC power supply circuit via a second capping diode,
wherein a second serial diode prevents the driving energy of the second power switch device to return to a negative power source of the DC power supply circuit; and
wherein a winding coupling ratio of said coupling transformer defines a maximum voltage oversway value.

15. A signal amplifier for amplification of a pulse width modulated signal comprising a driving circuit according to claim 1.

16. A method for driving at least one voltage controlled power switch device comprising the steps of:
generating a first driving signal in response to a rising edge of a pulsed signal and a second driving signal in response to a falling edge of said pulsed signal,
generating a trigger signal for a control electrode of said power switch device,
wherein an on-voltage trigger signal is generated in response to the first driving signal,
wherein an off-voltage trigger signal is generated in response to the second driving signal; and
storing signal energy of said trigger signal until a threshold voltage of said power switch device is reached and releasing the stored signal energy to the control electrode of said power switch device when and after the threshold voltage has been reached,
wherein the released energy provides a voltage oversway which accelerates switching of said power switch device,
wherein maintenance pulses are added to said first driving signal in case that said pulsed signal is stable in an active state and to add maintenance pulses to said second driving signal in case that said pulsed signal is stable in an non-active state, and
wherein said first driving signal and second driving signal are not active at the same time.

17. A driving circuit for at least one voltage controlled power switch device comprising:
a driver signal generating circuit configured to receive a pulsed signal and to generate
a first driving signal in response to a rising edge of said pulsed signal
a second driving signal in response to a falling edge of said pulsed signal;
a trigger signal generating circuit configured to generate a trigger signal for said voltage controlled power switch device, and comprising a first driving transistor configured to be switched on by the first driving signal such that an on-voltage of the trigger signal is supplied to a control electrode of said power switch device, and comprising a second driving transistor configured to be switched on by the second driving signal such that an off-voltage of the trigger signal is supplied to the control electrode of said power switch device; and
at least one energy buffer component coupled between the trigger signal generating circuit and the control electrode of said power switch device,
said energy buffer component being adapted to store signal energy of the on-voltage trigger signal until a threshold voltage of said power switch device is reached and adapted to release the stored signal energy to said control electrode of said power switch device when said threshold voltage of said power switch device has been reached, wherein the released energy stored in said energy buffer component provides a voltage oversway on the control electrode of said power switch device which accelerates the switching of said power switch device;
wherein the trigger signal generating circuit is connected to a corresponding DC power supply circuit providing at least one positive power source which defines an amplitude of the on-voltage of the said trigger signal and at least one negative power source which defines an amplitude of the off-voltage of the said trigger signal; and
wherein the DC power supply circuit comprises two half wave rectifiers with smoothing capacitors connected to a secondary coil of a power supply transformer having a primary winding connected to a power supply switching circuit controlled by a temperature dependent driving signal being generated by a temperature control unit depending on a temperature of said power switch device.

18. The driving circuit according to claim 17,
wherein an autotransformer with a positive coupling ratio less than 1 is connected in parallel to said energy buffer component,
wherein the autotransformer is adapted to return at least part of a driving energy for driving the control electrode of said voltage controlled power switch device back to at least one DC power supply circuit via capping diodes, and
wherein a positive coupling ratio of said autotransformer defines a maximum voltage oversway value.

19. The driving circuit according to claim 17,
wherein one of said two half wave rectifiers generates positive output voltage and one of said two half wave rectifiers generates negative output voltage such that a temperature change causes a change in an amplitude of said positive output voltage and an amplitude of said negative output voltage, such that an automatic dead time control could be provided.

20. The driving circuit according to claim 17, further comprising a bistable circuit, wherein said bistable circuit is adapted to hold an on-voltage of the control electrode of said at least one voltage controlled power switch device after the first driving signal has switched off said first driving transistor, and to hold the off-voltage of the control electrode of said at least one voltage controlled power switch device after the second driving signal has switched off said second driving transistor and wherein said bistable circuit is connected to said energy buffer component.

* * * * *